United States Patent
Kim et al.

(10) Patent No.: US 12,171,142 B2
(45) Date of Patent: Dec. 17, 2024

(54) LIGHT EMITTING DEVICE AND POLYCYCLIC COMPOUND FOR THE SAME

(71) Applicant: Samsung Display Co., Ltd., Yongin-si (KR)

(72) Inventors: Seulong Kim, Cheonan-si (KR); Eungyoung Park, Gwangju (KR); Jiyoung Song, Bucheon-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 620 days.

(21) Appl. No.: 17/393,958

(22) Filed: Aug. 4, 2021

(65) Prior Publication Data

US 2022/0165955 A1    May 26, 2022

(30) Foreign Application Priority Data

Nov. 25, 2020    (KR) .......................... 10-2020-0160015

(51) Int. Cl.
| | |
|---|---|
| C09K 11/06 | (2006.01) |
| C07F 5/02 | (2006.01) |
| H10K 85/60 | (2023.01) |
| H10K 50/11 | (2023.01) |
| H10K 59/35 | (2023.01) |
| H10K 101/10 | (2023.01) |

(52) U.S. Cl.
CPC ........... *H10K 85/631* (2023.02); *C07F 5/027* (2013.01); *C09K 11/06* (2013.01); *H10K 85/615* (2023.02); *H10K 85/633* (2023.02); C09K 2211/1007 (2013.01); C09K 2211/1011 (2013.01); H10K 50/11 (2023.02); H10K 59/35 (2023.02); H10K 2101/10 (2023.02)

(58) Field of Classification Search
None
See application file for complete search history.

(56) References Cited

U.S. PATENT DOCUMENTS

| | | | |
|---|---|---|---|
| 2020/0152902 A1 | 5/2020 | Lim et al. | |
| 2020/0207787 A1* | 7/2020 | Hatakeyama | ........... C07F 5/027 |

FOREIGN PATENT DOCUMENTS

| | | | | |
|---|---|---|---|---|
| CN | 110790782 A | * | 2/2020 | ............. C07F 5/027 |
| KR | 10-1955647 | | 3/2019 | |
| KR | 10-2020-0054426 | | 5/2020 | |

OTHER PUBLICATIONS

Dae Hyun Ahn et al., "Highly efficient blue thermally activated delayed fluorescence emitters based on symmetrical and rigid oxygen-bridged boron acceptors", nature photonics, 2019, 8 total pages.

* cited by examiner

*Primary Examiner* — Robert S Loewe
(74) *Attorney, Agent, or Firm* — KILE PARK REED & HOUTTEMAN PLLC

(57) ABSTRACT

A light emitting device includes a first electrode, a second electrode facing the first electrode, and at least one emission layer disposed between the first electrode and the second electrode. The at least one emission layer includes a polycyclic compound represented by Formula 1, thereby exhibiting long service life characteristics.

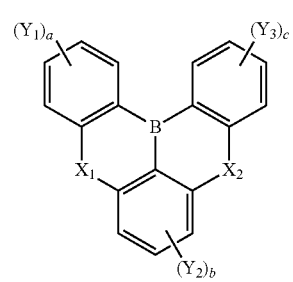

[Formula 1]

22 Claims, 7 Drawing Sheets

LIGHT EMITTING DEVICE AND POLYCYCLIC COMPOUND FOR THE SAME

CROSS-REFERENCE TO RELATED APPLICATION(S)

This application claims priority to and benefits of Korean Patent Application No. 10-2020-0160015 under 35 U.S.C. § 119, filed on Nov. 25, 2020 in the Korean Intellectual Property Office, the entire contents of which are incorporated herein by reference.

BACKGROUND

1. Technical Field

The disclosure relates to a light emitting device and a polycyclic compound for a light emitting device.

2. Description of the Related Art

Active development continues for an organic electroluminescence display as an image display. Unlike liquid crystal display apparatuses and the like, the organic electroluminescence display is a so-called self-luminescent display apparatus in which holes and electrons respectively injected from a first electrode and a second electrode recombine in an emission layer so that a luminescent material including an organic compound in the emission layer emits light to implement display.

In the application of a light emitting device to an image display apparatus, there is a demand for a light emitting device having low driving voltage, high luminous efficiency, and a long service life, and continuous development is required for materials for a light emitting device which stably achieves such characteristics.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

The disclosure provides a light emitting device having a long service life and high efficiency, and a polycyclic compound used therein.

An embodiment provides a light emitting device which may include a first electrode, a second electrode facing the first electrode, and at least one emission layer disposed between the first electrode and the second electrode, wherein the at least one emission layer includes a polycyclic compound represented by Formula 1 below:

[Formula 1]

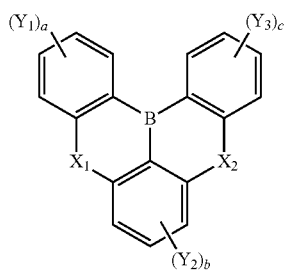

In Formula 1, a to c may each independently be 1 or 2, $X_1$ and $X_2$ may each independently be O or $N(R_a)$, $R_a$ may be a hydrogen atom, a deuterium atom, a halogen atom, a cyano group, a substituted or unsubstituted amine group, a substituted or unsubstituted boryl group, a substituted or unsubstituted oxy group, a substituted or unsubstituted thio group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, $Y_1$ to $Y_3$ may each independently be a hydrogen atom, a deuterium atom, a halogen atom, a cyano group, a substituted or unsubstituted amine group, a substituted or unsubstituted boryl group, a substituted or unsubstituted oxy group, a substituted or unsubstituted thio group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, and at least one of $Y_1$ to $Y_3$ may be a group represented by Formula $Z_1$ or Formula $Z_2$ below:

[Formula $Z_1$]

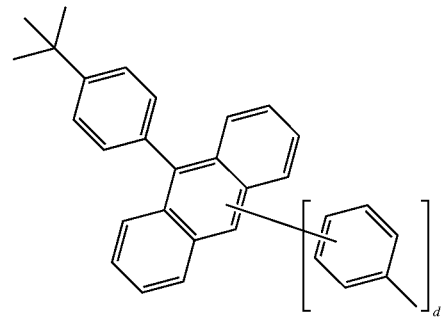

[Formula $Z_2$]

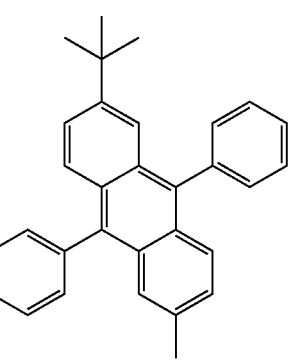

In Formula $Z_1$ above, d may be 0 or 1.

In an embodiment, Formula 1 above may be represented by any one among Formula 2 to Formula 4 below:

[Formula 2]

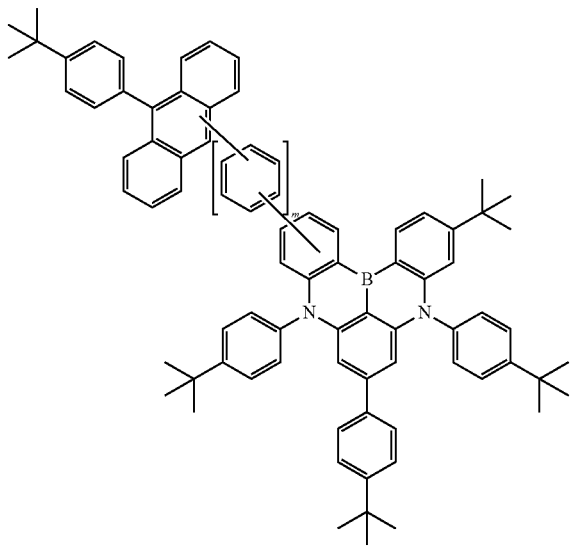

[Formula 3]

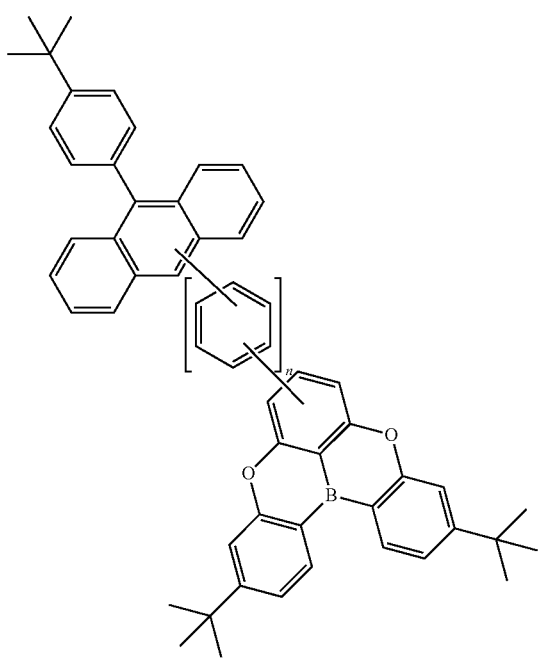

[Formula 4]

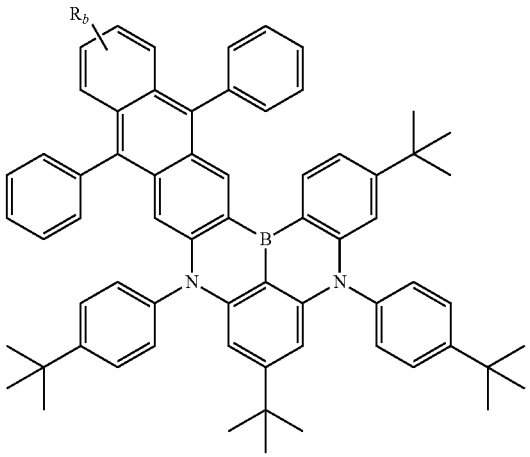

In Formula 2 above, m may be 0 or 1. In Formula 3, n may be 0 or 1. In Formula 4 above, $R_b$ may be a hydrogen atom, a deuterium atom, a halogen atom, a cyano group, a substituted or unsubstituted amine group, a substituted or unsubstituted boryl group, a substituted or unsubstituted oxy group, a substituted or unsubstituted thio group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms.

In an embodiment, the polycyclic compound represented by Formula 2 or Formula 3 above may emit blue light, and the polycyclic compound represented by Formula 4 may emit green light.

In an embodiment, Formula 1 above may be represented by any one among Formulae 2-1 to 2-3 below:

[Formula 2-1]

-continued

[Formula 2-2]

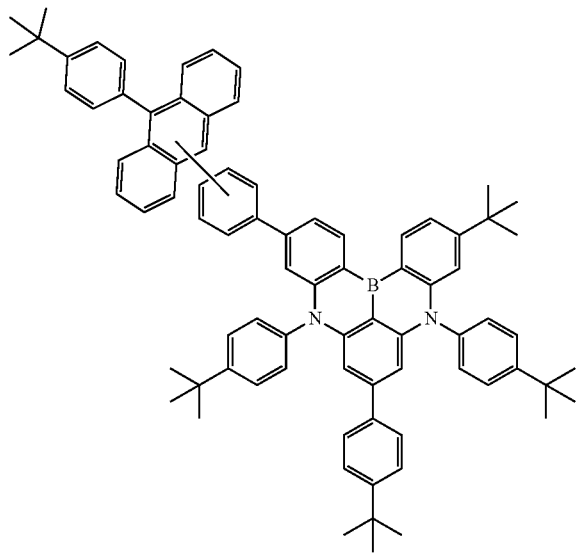

[Formula 2-3]

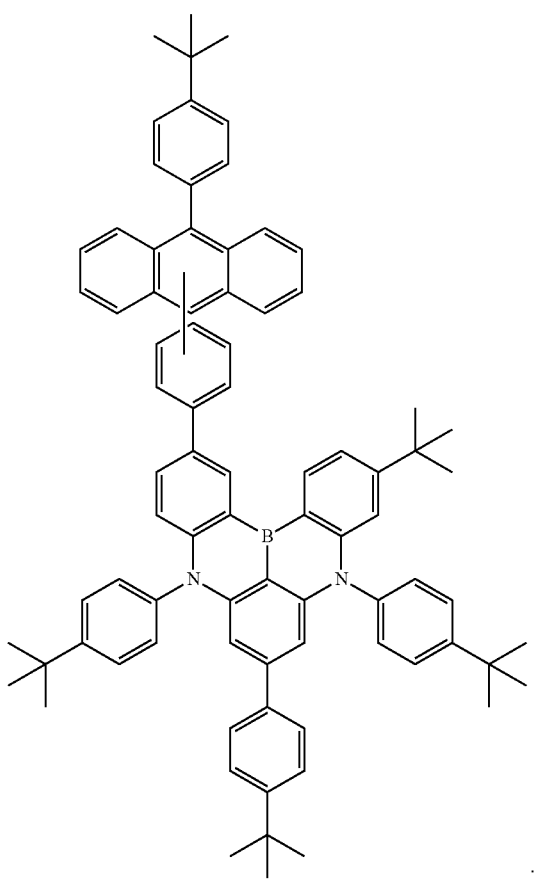

In an embodiment, Formula 1 above may be represented by Formula 3-1 or Formula 3-2 below:

[Formula 3-1]

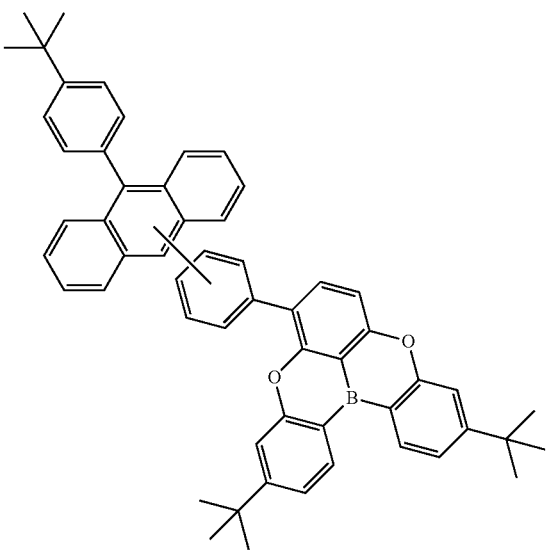

[Formula 3-2]

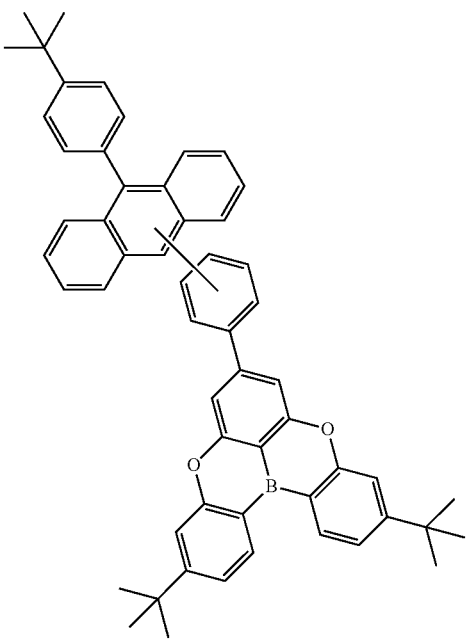

In an embodiment, the polycyclic compound may have a lowest triplet excitation energy of less than about 2.0 eV.

In an embodiment, the at least one emission layer may include a host and a dopant, and the dopant may include the polycyclic compound.

In an embodiment, a light emitting device may include a first electrode, a second electrode facing the first electrode, light emitting structures stacked between the first electrode and the second electrode, and a charge generation layer disposed between adjacent ones of the light emitting structures, wherein at least one among the light emitting structures may include a polycyclic compound represented by Formula 1 below:

[Formula 1]

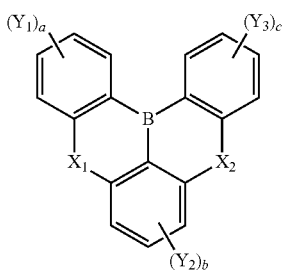

In Formula 1 above, a to c may each independently be 1 or 2, $X_1$ and $X_2$ may each independently be O or $N(R_a)$, $R_a$ may be a hydrogen atom, a deuterium atom, a halogen atom, a cyano group, a substituted or unsubstituted amine group, a substituted or unsubstituted boryl group, a substituted or unsubstituted oxy group, a substituted or unsubstituted thio group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, $Y_1$ to $Y_3$ may each independently be a hydrogen atom, a deuterium atom, a halogen atom, a cyano group, a substituted or unsubstituted amine group, a substituted or unsubstituted boryl group, a substituted or unsubstituted oxy group, a substituted or unsubstituted thio group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, and at least one among $Y_1$ to $Y_3$ may be a group represented by Formula $Z_1$ or Formula $Z_2$ below:

[Formula $Z_1$]

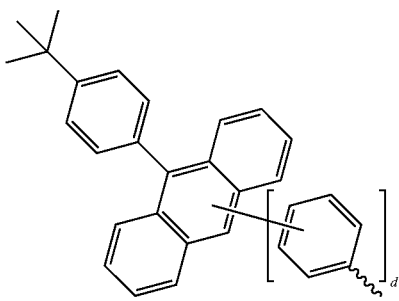

[Formula $Z_2$]

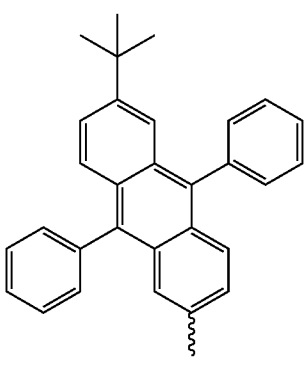

In Formula $Z_1$ above, d may be 0 or 1.

In an embodiment, the polycyclic compound may be represented by one of Formula 2 to Formula 4 below:

[Formula 2]

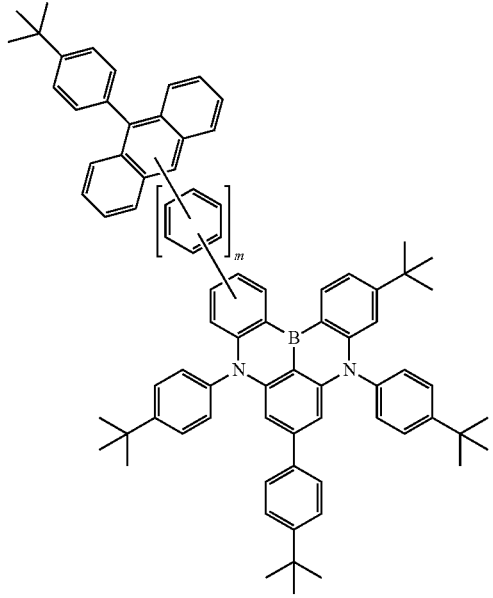

[Formula 3]

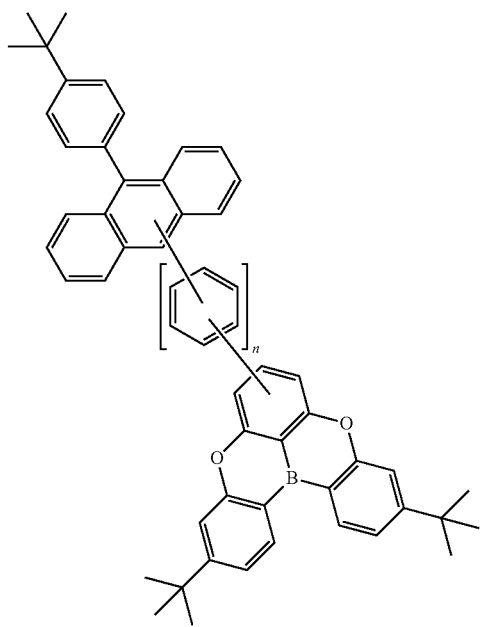

-continued

[Formula 4]

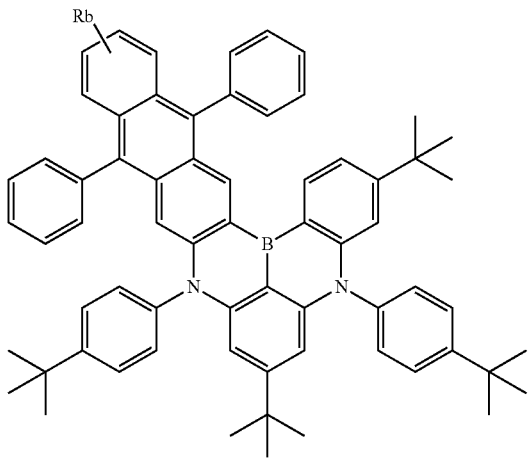

In Formula 2 above, m may be 0 or 1. In Formula 3, n may be 0 or 1. In Formula 4 above, $R_b$ may be a hydrogen atom, a deuterium atom, a halogen atom, a cyano group, a substituted or unsubstituted amine group, a substituted or unsubstituted boryl group, a substituted or unsubstituted oxy group, a substituted or unsubstituted thio group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms.

In an embodiment, the light emitting structures may include a first light emitting structure, a second light emitting structure disposed below the first light emitting structure, and a third light emitting structure disposed below the second light emitting structure. At least one of the first light emitting structure, the second light emitting structure, and the third light emitting structure may emit blue light, and at least one of the remainder of the first light emitting structure, the second light emitting structure, and the third light emitting structure may emit green light.

In an embodiment, the first light emitting structure may include a first polycyclic compound represented by Formula 2 or Formula 3 above, the second light emitting structure may include a second polycyclic compound represented by Formula 4 above, and the third light emitting structure may include the first polycyclic compound.

In an embodiment, the first polycyclic compound may emit blue light, and the second polycyclic compound may emit green light.

In an embodiment, the first light emitting structure may include a second polycyclic compound represented by Formula 4 above, the second light emitting structure may include a first polycyclic compound represented by Formula 2 or Formula 3 above, and the third light emitting structure may include the first polycyclic compound.

In an embodiment, the light emitting device may further include a fourth light emitting structure which is disposed below the third light emitting structure. The fourth light emitting structure may include a first polycyclic compound represented by Formula 2 or Formula 3 above.

In an embodiment, a polycyclic compound may be represented by Formula 1 below:

[Formula 1]

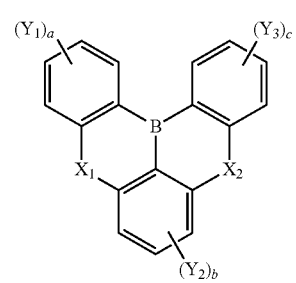

In Formula 1, a to c may each independently be 1 or 2, $X_1$ and $X_2$ may each independently be O or $N(R_a)$, $R_a$ may be a hydrogen atom, a deuterium atom, a halogen atom, a cyano group, a substituted or unsubstituted amine group, a substituted or unsubstituted boryl group, a substituted or unsubstituted oxy group, a substituted or unsubstituted thio group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, $Y_1$ to $Y_3$ may each independently be a hydrogen atom, a deuterium atom, a halogen atom, a cyano group, a substituted or unsubstituted amine group, a substituted or unsubstituted boryl group, a substituted or unsubstituted oxy group, a substituted or unsubstituted thio group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, and at least one among $Y_1$ to $Y_3$ may be a group represented by Formula $Z_1$ or Formula $Z_2$ below:

[Formula $Z_1$]

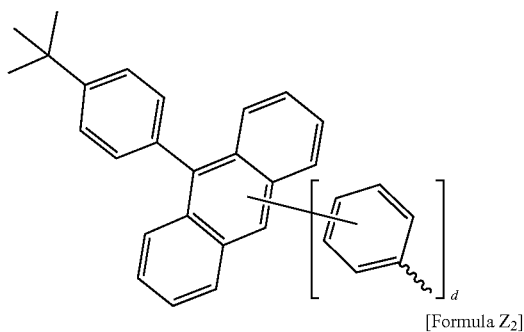

[Formula $Z_2$]

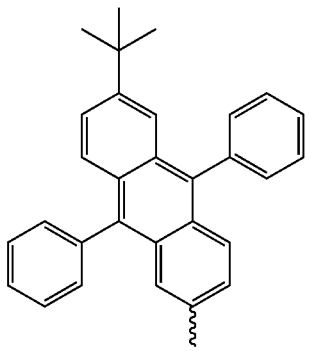

In Formula $Z_1$ above, d may be 0 or 1.

In an embodiment, the polycyclic compound may be represented by one among Formula 2 to Formula 4 below:

[Formula 2]

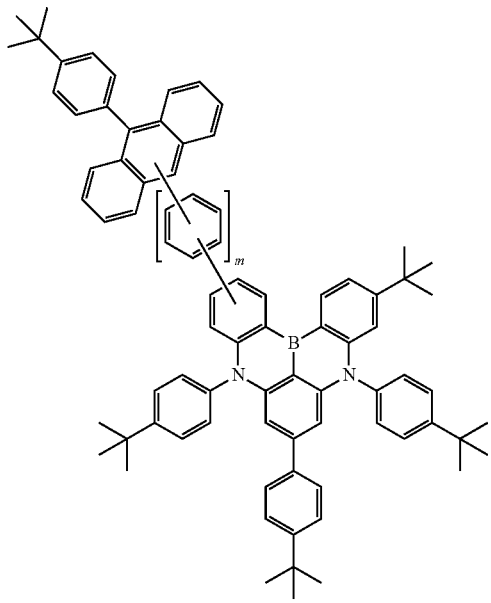

[Formula 3]

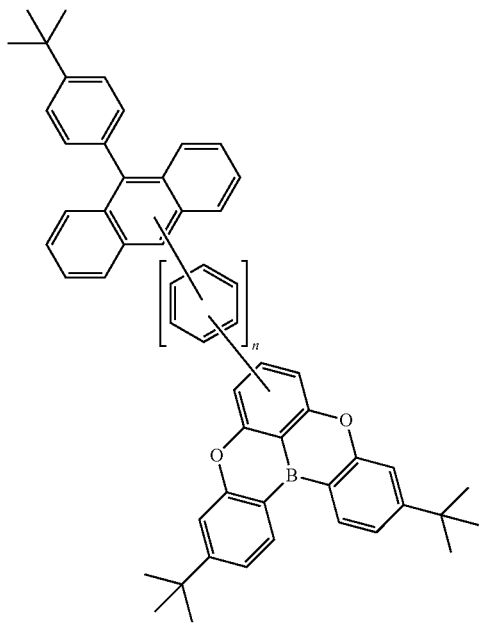

[Formula 4]

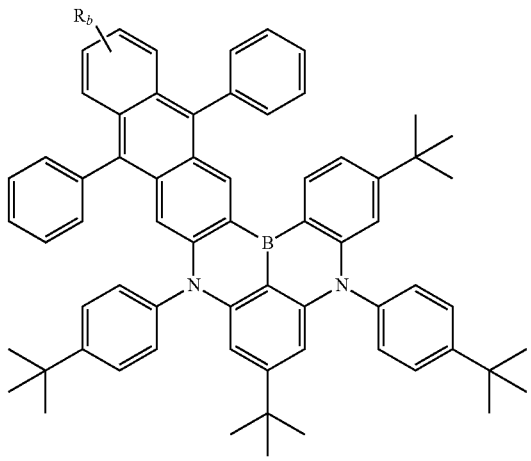

In Formula 2 above, m may be 0 or 1. In Formula 3, n may be 0 or 1. In Formula 4 above, $R_b$ may be a hydrogen atom, a deuterium atom, a halogen atom, a cyano group, a substituted or unsubstituted amine group, a substituted or unsubstituted boryl group, a substituted or unsubstituted oxy group, a substituted or unsubstituted thio group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms.

In an embodiment, the polycyclic compound represented by Formula 2 or Formula 3 above may emit blue light, and the polycyclic compound represented by Formula 4 above may emit green light.

In an embodiment, the polycyclic compound may be represented by any one among Formulas 2-1 to 2-3 below:

[Formula 2-1]

13
-continued

[Formula 2-2]

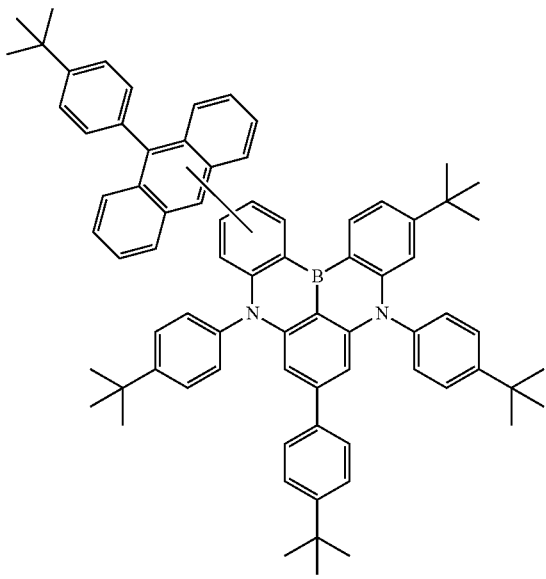

[Formula 2-3]

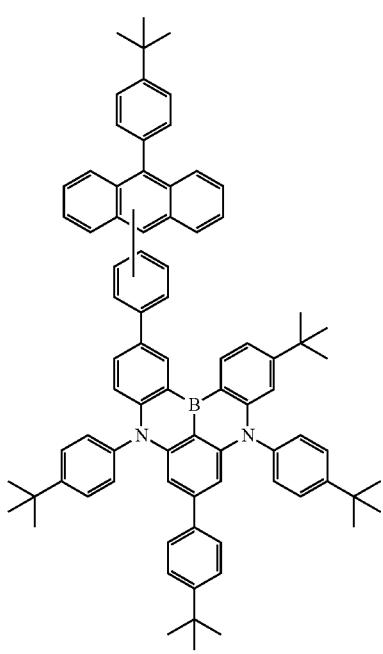

14

In an embodiment, the polycyclic compound may be represented by Formula 3-1 or Formula 3-2 below:

[Formula 3-1]

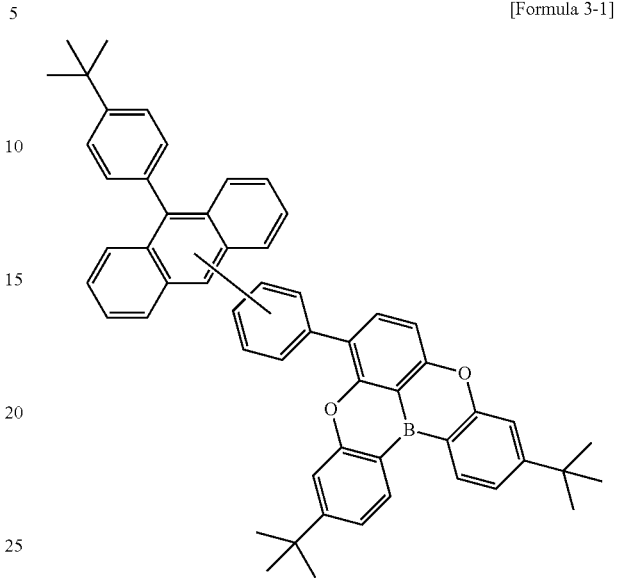

Formula [3-2]

In an embodiment, the polycyclic compound may have a lowest triplet excitation energy of less than about 2.0 eV.

BRIEF DESCRIPTION OF THE DRAWINGS

The accompanying drawings are included to provide a further understanding of the embodiments, and are incorporated in and constitute a part of this specification. The drawings illustrate embodiments of the disclosure, and principles thereof. The above and other aspects and features of the disclosure will become more apparent by describing in detail embodiments thereof with reference to the attached drawings, in which.

DETAILED DESCRIPTION OF THE EMBODIMENTS

Figure 1:
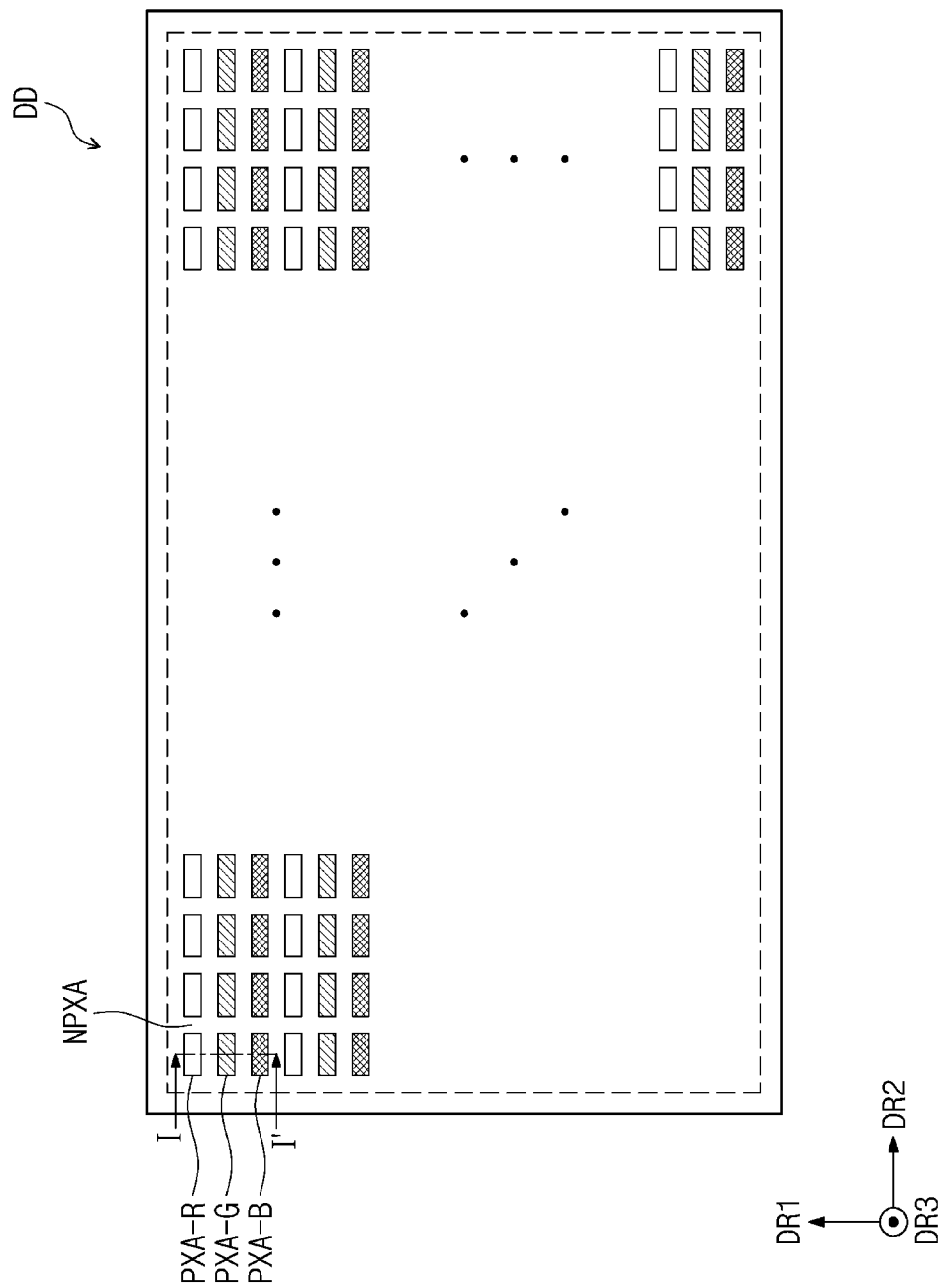
FIG. 1 is a plan view illustrating an embodiment of a display apparatus.

The disclosure will now be described more fully hereinafter with reference to the accompanying drawings, in which embodiments are shown. This disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

In the drawings, the sizes, thicknesses, ratios, and dimensions of the elements may be exaggerated for ease of description and for clarity. Like numbers refer to like elements throughout.

In the description, it will be understood that when an element (or region, layer, part, etc.) is referred to as being "on", "connected to", or "coupled to" another element, it can be directly on, connected to, or coupled to the other element, or one or more intervening elements may be present therebetween. In a similar sense, when an element (or region, layer, part, etc.) is described as "covering" another element, it can directly cover the other element, or one or more intervening elements may be present therebetween.

In the description, when an element is "directly on," "directly connected to," or "directly coupled to" another element, there are no intervening elements present. For example, "directly on" may mean that two layers or two elements are disposed without an additional element such as an adhesion element therebetween.

As used herein, the expressions used in the singular such as "a," "an," and "the," are intended to include the plural forms as well, unless the context clearly indicates otherwise.

As used herein, the term "and/or" includes any and all combinations of one or more of the associated listed items. For example, "A and/or B" may be understood to mean "A, B, or A and B." The terms "and" and "or" may be used in the conjunctive or disjunctive sense and may be understood to be equivalent to "and/or".

The term "at least one of" is intended to include the meaning of "at least one selected from" for the purpose of its meaning and interpretation. For example, "at least one of A and B" may be understood to mean "A, B, or A and B." When preceding a list of elements, the term, "at least one of," modifies the entire list of elements and does not modify the individual elements of the list.

It will be understood that, although the terms first, second, etc. may be used herein to describe various elements, these elements should not be limited by these terms. These terms are only used to distinguish one element from another element. Thus, a first element could be termed a second element without departing from the teachings of the disclosure. Similarly, a second element could be termed a first element, without departing from the scope of the disclosure.

The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

The terms "about" or "approximately" as used herein is inclusive of the stated value and means within an acceptable range of deviation for the recited value as determined by one of ordinary skill in the art, considering the measurement in question and the error associated with measurement of the recited quantity (i.e., the limitations of the measurement system). For example, "about" may mean within one or more standard deviations, or within ±20%, 10%, or 5% of the stated value.

It should be understood that the terms "comprises," "comprising," "includes," "including," "have," "having," "contains," "containing," and the like are intended to specify the presence of stated features, integers, steps, operations, elements, components, or combinations thereof in the disclosure, but do not preclude the presence or addition of one or more other features, integers, steps, operations, elements, components, or combinations thereof.

Unless otherwise defined or implied herein, all terms (including technical and scientific terms) used have the same meaning as commonly understood by those skilled in the art to which this disclosure pertains. It will be further understood that terms, such as those defined in commonly used dictionaries, should be interpreted as having a meaning that is consistent with their meaning in the context of the relevant art and should not be interpreted in an ideal or excessively formal sense unless clearly defined in the specification.

In the specification, the term "substituted or unsubstituted" may mean substituted or unsubstituted with at least one substituent selected from the group consisting of a deuterium atom, a halogen atom, a cyano group, a nitro group, an amino group, a silyl group, an oxy group, a thio group, a sulfinyl group, a sulfonyl group, a carbonyl group, a boron group, a phosphine oxide group, a phosphine sulfide group, an alkyl group, an alkenyl group, an alkynyl group, an alkoxy group, a hydrocarbon ring group, an aryl group, and a heterocyclic group. Each of the substituents may be substituted or unsubstituted. For example, a biphenyl group may be interpreted as an aryl group or a phenyl group substituted with a phenyl group.

In the specification, the phrase "bonded to an adjacent group to form a ring" may indicate a group that is bonded to an adjacent group to form a substituted or unsubstituted hydrocarbon ring, or a substituted or unsubstituted heterocycle. The hydrocarbon ring may include an aliphatic hydrocarbon ring and an aromatic hydrocarbon ring. The heterocycle may include an aliphatic heterocycle and an aromatic heterocycle. The hydrocarbon ring and the heterocycle may be monocyclic or polycyclic. Rings formed by being bonded to each other may be connected to another ring to form a spiro structure.

In the specification, the term "adjacent group" may mean a substituent substituted for an atom which is directly bonded to an atom substituted with a corresponding substituent, another substituent substituted for an atom which is substituted with a corresponding substituent, or a substituent sterically positioned at the nearest position to a corresponding substituent. For example, two methyl groups in 1,2-dimethylbenzene may be interpreted as "adjacent groups" to each other and two ethyl groups in 1,1-diethylcyclopentane may be interpreted as "adjacent groups" to each other. For example, two methyl groups in 4,5-dimethylphenanthrene may be interpreted as "adjacent groups" to each other.

In the specification, examples of the halogen atom may include a fluorine atom, a chlorine atom, a bromine atom, and an iodine atom.

In the specification, the alkyl group may be a linear, branched, or cyclic type. The number of carbon atoms in the alkyl group may be 1 to 50, 1 to 30, 1 to 20, 1 to 10, or 1 to 6. Examples of the alkyl group may include a methyl group, an ethyl group, an n-propyl group, an isopropyl group, an n-butyl group, an s-butyl group, a t-butyl group, an i-butyl group, a 2-ethylbutyl group, a 3,3-dimethylbutyl group, an n-pentyl group, an i-pentyl group, a neopentyl group, a t-pentyl group, a cyclopentyl group, a 1-methylpentyl group, a 3-methylpentyl group, a 2-ethylpentyl group, a 4-methyl-2-pentyl group, an n-hexyl group, a 1-methylhexyl group, a 2-ethylhexyl group, a 2-butylhexyl group, a cyclohexyl group, a 4-methylcyclohexyl group, a 4-t-butylcyclohexyl group, an n-heptyl group, a 1-methylheptyl group, a 2,2-dimethylheptyl group, a 2-ethylheptyl group, a 2-butylheptyl group, an n-octyl group, a t-octyl group, a 2-ethyloctyl group, a 2-butyloctyl group, a 2-hexyloctyl group, a 3,7-dimethyloctyl group, a cyclooctyl group, an n-nonyl group, an n-decyl group, an adamantyl group, a 2-ethyldecyl group, a 2-butyldecyl group, a 2-hexyldecyl group, a 2-octyldecyl group, an n-undecyl group, an n-dodecyl group, a 2-ethyldodecyl group, a 2-butyldodecyl group, a 2-hexyldocecyl group, a 2-octyldodecyl group, an n-tridecyl group, an n-tetradecyl group, an n-pentadecyl group, an n-hexadecyl group, a 2-ethylhexadecyl group, a 2-butylhexadecyl group, a 2-hexylhexadecyl group, a 2-octylhexadecyl group, an n-heptadecyl group, an n-octadecyl group, an n-nonadecyl group, an n-eicosyl group, a 2-ethyleicosyl group, a 2-butyleicosyl group, a 2-hexyleicosyl group, a 2-octyleicosyl group, an n-henicosyl group, an n-docosyl group, an n-tricosyl group, an n-tetracosyl group, an n-pentacosyl group, an n-hexacosyl group, an n-heptacosyl group, an n-octacosyl group, an n-nonacosyl group, an n-triacontyl group, etc., but embodiments are not limited thereto.

In the specification, the hydrocarbon ring group may be any functional group or substituent derived from an aliphatic hydrocarbon ring. For example, the hydrocarbon ring group may be a saturated hydrocarbon ring group having 5 to 20 ring-forming carbon atoms.

In the specification, the aryl group may be any functional group or substituent derived from an aromatic hydrocarbon ring. The aryl group may be a monocyclic aryl group or a polycyclic aryl group. The number of ring-forming carbon atoms in the aryl group may be 6 to 30, 6 to 20, or 6 to 15. Examples of the aryl group may include a phenyl group, a naphthyl group, a fluorenyl group, an anthracenyl group, a phenanthryl group, a biphenyl group, a terphenyl group, a quaterphenyl group, a quinquephenyl group, a sexiphenyl group, a triphenylenyl group, a pyrenyl group, a benzofluoranthenyl group, a chrysenyl group, etc., but embodiments are not limited thereto.

In the specification, the fluorenyl group may be substituted, and two substituents may be bonded to each other to form a spiro structure. Examples of substituted fluorenyl groups are shown below. However, embodiments are not limited thereto.

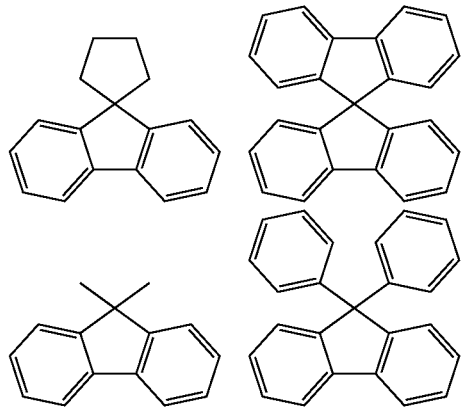

In the specification, the heterocyclic group may be any functional group or substituent derived from a ring including at least one of B, O, N, P, Si, and Se as a heteroatom. The heterocyclic group may include an aliphatic heterocyclic group and an aromatic heterocyclic group. The aromatic heterocyclic group may be a heteroaryl group. The aliphatic heterocycle and the aromatic heterocycle may be monocyclic or polycyclic.

In the specification, the heterocyclic group may include at least one of B, O, N, P, Si and S as a heteroatom. If the heterocyclic group includes two or more heteroatoms, the two or more heteroatoms may be the same as or different from each other. The heterocyclic group may be a monocyclic heterocyclic group or a polycyclic heterocyclic group and may include a heteroaryl group. The number of ring-forming carbon atoms in the heterocyclic group may be 2 to 30, 2 to 20, or 2 to 10.

In the specification, the aliphatic heterocyclic group may include at least one of B, O, N, P, Si, and S as a heteroatom. The number of ring-forming carbon atoms in the aliphatic heterocyclic group may be 2 to 30, 2 to 20, or 2 to 10. Examples of the aliphatic heterocyclic group may include an oxirane group, a thiirane group, a pyrrolidine group, a piperidine group, a tetrahydrofuran group, a tetrahydrothiophene group, a thiane group, a tetrahydropyran group, a 1,4-dioxane group, etc., but embodiments are not limited thereto.

In the specification, the heteroaryl group may include at least one of B, O, N, P, Si, and S as a heteroatom. When the heteroaryl group contains two or more heteroatoms, the two or more heteroatoms may be the same as or different from each other. The heteroaryl group may be a monocyclic heteroaryl group or a polycyclic heteroaryl group. The number of ring-forming carbon atoms in the heteroaryl group may be 2 to 30, 2 to 20, or 2 to 10. Examples of the heteroaryl group may include a thiophene group, a furan group, a pyrrole group, an imidazole group, a triazole group, a pyridine group, a bipyridine group, a pyrimidine group, a triazine group, a triazole group, an acridyl group, a pyridazine group, a pyrazinyl group, a quinoline group, a quinazoline group, a quinoxaline group, a phenoxazine group, a phthalazine group, a pyrido pyrimidine group, a pyrido pyrazine group, a pyrazino pyrazine group, an isoquinoline group, an indole group, a carbazole group, an N-arylcarbazole group, an N-heteroarylcarbazole group, an N-alkylcarbazole group, a benzoxazole group, a benzoimidazole group, a benzothiazole group, a benzocarbazole group, a benzothiophene group, a dibenzothiophene group, a thienothiophene group, a benzofuran group, a phenanthroline group, a thiazole group, an isoxazole group, an oxazole group, an oxadiazole group, a thiadiazole group, a phenothiazine group, a dibenzosilole group, a dibenzofuran group, etc., but embodiments are not limited thereto.

In the specification, the above description with respect to the aryl group may be applied to an arylene group except that the arylene group is a divalent group. The explanation on the aforementioned heteroaryl group may be applied to the heteroarylene group except that the heteroarylene group is a divalent group.

In the specification, the silyl group may include an alkylsilyl group and an arylsilyl group. Examples of the silyl group may include trimethylsilyl, triethylsilyl, t-butyldimethylsilyl, vinyldimethylsilyl, propyldimethylsilyl, triphenylsilyl, diphenylsilyl, phenylsilyl, etc. However, embodiments are not limited thereto.

In the specification, the number of carbon atoms in an amino group is not particularly limited, but may be 1 to 30. The amino group may include an alkyl amino group, an aryl amino group, or a heteroaryl amino group. Examples of the amino group may include a methylamino group, a dimethylamino group, a phenylamino group, a diphenylamino group, a naphthylamino group, a 9-methyl-anthracenylamino group, a triphenylamino group, etc., but are not limited thereto.

In the specification, the number of ring-forming carbon atoms in a carbonyl group may be 1 to 40, 1 to 30, or 1 to 20. For example, the carbonyl group may have the following structures, but embodiments are not limited thereto.

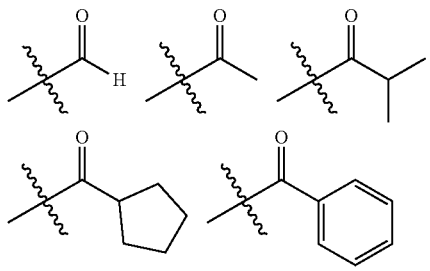

In the specification, the number of carbon atoms in a sulfinyl group and in a sulfonyl group is not particularly limited, but may be 1 to 30. The sulfinyl group may include an alkyl sulfinyl group and an aryl sulfinyl group. The sulfonyl group may include an alkyl sulfonyl group and an aryl sulfonyl group.

In the specification, a thio group may include an alkylthio group and an arylthio group. The thio group may include a sulfur atom that is bonded to the alkyl group or to the aryl group as defined above. Examples of the thio group may include a methylthio group, an ethylthio group, a propylthio group, a pentylthio group, a hexylthio group, an octylthio group, a dodecylthio group, a cyclopentylthio group, a cyclohexylthio group, a phenylthio group, a naphthylthio group, but embodiments are not limited thereto.

In the specification, the oxy group may include an oxygen atom that is bonded to the alkyl group or the aryl group as defined above. The oxy group may include an alkoxy group and an aryl oxy group. The alkoxy group may be a linear chain, a branched chain, or a ring chain. The number of carbon atoms in the alkoxy group is not particularly limited, but may be, for example, 1 to 20 or 1 to 10. Examples of an oxy group may include methoxy, ethoxy, n-propoxy, isopropoxy, butoxy, pentyloxy, hexyloxy, octyloxy, nonyloxy, decyloxy, benzyloxy, etc., but embodiments are not limited thereto.

In the specification, the boron group may include a boron atom that is bonded to the alkyl group or the aryl group as defined above. The boron group may include an alkyl boron group and an aryl boron group. Examples of the boron group may include a trimethylboron group, a triethylboron group, a t-butyldimethylboron group, a triphenylboron group, a diphenylboron group, a phenylboron group, etc., but embodiments are not limited thereto.

In the specification, the alkenyl group may be linear or branched. The number of carbon atoms in the alkenyl group is not specifically limited, but may be 2 to 30, 2 to 20, or 2 to 10. Examples of the alkenyl group may include a vinyl group, a 1-butenyl group, a 1-pentenyl group, a 1,3-butadienyl aryl group, a styrenyl group, a styryl vinyl group, etc., but embodiments are not limited thereto.

In the specification, the number of carbon atoms in an amine group is not specifically limited, but may be 1 to 30. The amine group may include an alkyl amine group and an aryl amine group. Examples of the amine group may include a methylamine group, a dimethylamine group, a phenylamine group, a diphenylamine group, a naphthylamine group, a 9-methyl-anthracenylamine group, a triphenylamine group, etc., but embodiments are not limited thereto.

In the specification, the alkyl group included in an alkylthio group, an alkylsulfoxy group, an alkylaryl group, an alkylamino group, an alkyl boron group, an alkyl silyl group, and an alkyl amine group may be the same as the examples of the alkyl group described above.

In the specification, the aryl group included in an aryloxy group, an arylthio group, an arylsulfoxy group, an arylamino group, an arylboron group, an arylsilyl group, an arylamine group may be the same as the examples of the aryl group described above.

In the specification, a direct linkage herein may be a single bond.

In the specification,

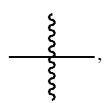

and ——*, and ⁀⁀⁀ each represent a binding site to a neighboring atom.

Hereinafter, embodiments will be described with reference to the accompanying drawings.

Figure 2:
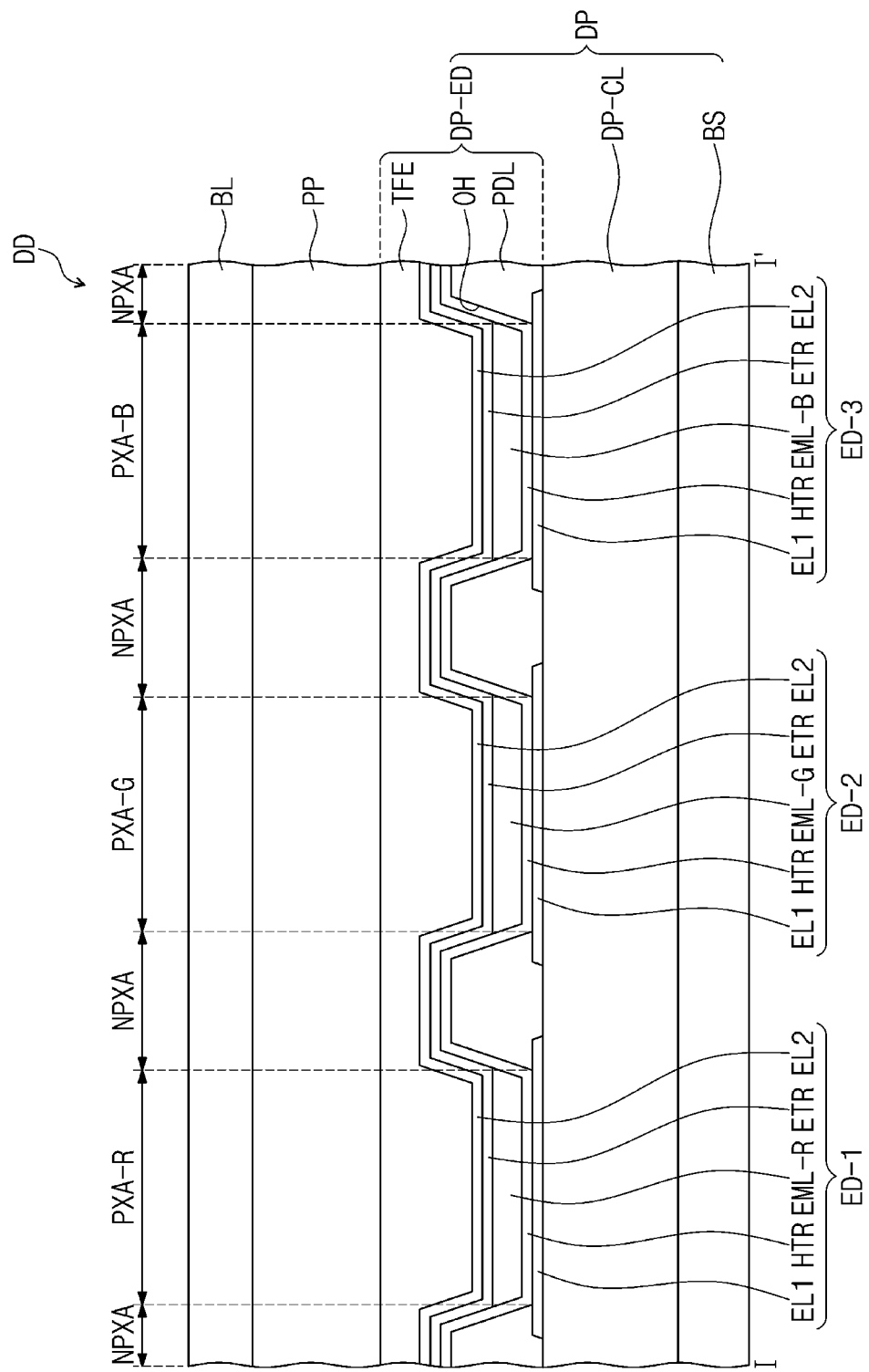
FIG. 2 is a schematic cross-sectional view of a display apparatus according to an embodiment.

FIG. 1 is a plan view illustrating an embodiment of a display apparatus DD. FIG. 2 is a schematic cross-sectional view of the display apparatus DD of the embodiment. FIG. 2 is a schematic cross-sectional view illustrating a part taken along line I-I' of FIG. 1.

The display apparatus DD may include a display panel DP and an optical layer PP disposed on the display panel DP.

The display panel DP includes luminescence devices ED-1, ED-2, and ED-3. The display apparatus DD may include multiple luminescence devices each of ED-1, ED-2, and ED-3. The optical layer PP may be disposed on the display panel DP and may control light reflected at the display panel DP from an external light. The optical layer PP may include, for example, a polarization layer or a color filter layer. Although not shown in the drawing, in an embodiment, the optical layer PP may be omitted from the display apparatus DD.

A base substrate BL may be disposed on the optical layer PP. The base substrate BL may be a member which provides a base surface on which the optical layer PP may be disposed. The base substrate BL may be a glass substrate, a metal substrate, a plastic substrate, etc. However, embodiments are not limited thereto, and the base substrate BL may include an inorganic layer, an organic layer, or a composite material layer. Although not shown in the drawing, in an embodiment, the base substrate BL may be omitted.

The display apparatus DD according to an embodiment may further include a filling layer (not shown). The filling layer (not shown) may be disposed between a display device layer DP-ED and the base substrate BL. The filling layer (not shown) may include an organic material layer. The filling layer (not shown) may include at least one of an acrylic-based resin, a silicone-based resin, and an epoxy-based resin.

The display panel DP may include a base layer BS, a circuit layer DP-CL provided on the base layer BS, and a display device layer DP-ED. The display device layer DP-ED may include a pixel defining film PDL, the light emitting devices ED-1, ED-2, and ED-3 disposed between portions of the pixel defining film PDL, and an encapsulation layer TFE disposed on the light emitting devices ED-1, ED-2, and ED-3.

The base layer BS may be a member which provides a base surface on which the display device layer DP-ED is disposed. The base layer BS may be a glass substrate, a metal substrate, a plastic substrate, etc. However, embodiments are not limited thereto, and the base layer BS may include an inorganic layer, an organic layer, or a composite material layer.

In an embodiment, the circuit layer DP-CL is disposed on the base layer BS, and the circuit layer DP-CL may include transistors (not shown). Each of the transistors (not shown) may include a control electrode, an input electrode, and an output electrode. For example, the circuit layer DP-CL may include a switching transistor and a driving transistor in order to drive the light emitting devices ED-1, ED-2, and ED-3 of the display device layer DP-ED.

Each of the light emitting devices ED-1, ED-2, and ED-3 may have a structure of a light emitting device ED of an embodiment according to FIGS. 3 to 6, which will be described later. Each of the light emitting devices ED-1, ED-2 and ED-3 may include a first electrode EL1, a hole transport region HTR, emission layers EML-R, EML-G and EML-B, an electron transport region ETR, and a second electrode EL2.

FIG. 2 illustrates an embodiment in which the emission layers EML-R, EML-G, and EML-B of the light emitting devices ED-1, ED-2, and ED-3 are disposed in the openings OH defined in the pixel defining film PDL, and the hole transport region HTR, the electron transport region ETR, and the second electrode EL2 are each provided as a common layer in the entire light emitting devices ED-1, ED-2, and ED-3. However, embodiments are not limited thereto. Although not shown in FIG. 2, in an embodiment, the hole transport region HTR and the electron transport region ETR may each be provided by being patterned inside the opening OH defined in the pixel defining film PDL. For example, the hole transport region HTR, the emission layers EML-R, EML-G, and EML-B, and the electron transport region ETR of the light emitting devices ED-1, ED-2, and ED-3 in an embodiment may be provided by being patterned in an inkjet printing method.

The encapsulation layer TFE may cover the light emitting devices ED-1, ED-2, and ED-3. The encapsulation layer TFE may seal the display device layer DP-ED. The encapsulation layer TFE may be a thin film encapsulation layer. The encapsulation layer TFE may be formed by laminating one layer or multiple layers. The encapsulation layer TFE includes at least one insulation layer. The encapsulation layer TFE according to an embodiment may include at least one inorganic film (hereinafter, an encapsulation-inorganic film). The encapsulation layer TFE according to an embodiment may also include at least one organic film (hereinafter, an encapsulation-organic film) and at least one encapsulation-inorganic film.

The encapsulation-inorganic film may protect the display device layer DP-ED from moisture and/or oxygen, and the encapsulation-organic film may protect the display device layer DP-ED from foreign substances such as dust particles. The encapsulation-inorganic film may include silicon nitride, silicon oxynitride, silicon oxide, titanium oxide, aluminum oxide, or the like, but embodiments are not limited thereto. The encapsulation-organic film may include an acrylic-based compound, an epoxy-based compound, or the like. The encapsulation-organic film may include a photopolymerizable organic material, but embodiments are not limited thereto.

The encapsulation layer TFE may be disposed on the second electrode EL2 and may be disposed to fill the opening OH.

Referring to FIGS. 1 and 2, the display apparatus DD may include a non-light emitting region NPXA and light emitting regions PXA-R, PXA-G, and PXA-B. Each of the light emitting regions PXA-R, PXA-G, and PXA-B may be a region which emits light generated from the light emitting devices ED-1, ED-2, and ED-3, respectively. The light emitting regions PXA-R, PXA-G, and PXA-B may be spaced apart from each other in a plane.

Each of the light emitting regions PXA-R, PXA-G, and PXA-B may be a region divided by pixel defining film PDL. The non-light emitting regions NPXA may be regions between the adjacent light emitting regions PXA-R, PXA-G, and PXA-B, which correspond to portions of the pixel defining film PDL. In the specification, each of the light emitting regions PXA-R, PXA-G, and PXA-B may correspond to a pixel. The pixel defining film PDL may separate the light emitting devices ED-1, ED-2, and ED-3. The emission layers EML-R, EML-G, and EML-B of the light emitting devices ED-1, ED-2, and ED-3 may be disposed in openings OH defined by the pixel defining film PDL and separated from each other.

The light emitting regions PXA-R, PXA-G, and PXA-B may be divided into groups according to the color of light generated from the light emitting devices ED-1, ED-2, and ED-3. In the display apparatus DD of an embodiment shown in FIGS. 1 and 2, three light emitting regions PXA-R, PXA-G, and PXA-B which emit red light, green light, and blue light, respectively, are illustrated. For example, the display apparatus DD of an embodiment may include the red light emitting region PXA-R, the green light emitting region PXA-G, and the blue light emitting region PXA-B which are separated from one another.

In the display apparatus DD according to an embodiment, the light emitting devices ED-1, ED-2, and ED-3 may emit light having wavelengths different from one another. For example, in an embodiment, the display apparatus DD may include a first light emitting device ED-1 that emits red light, a second light emitting device ED-2 that emits green light, and a third light emitting device ED-3 that emits blue light. For example, the red light emitting region PXA-R, the green light emitting region PXA-G, and the blue light emitting region PXA-B of the display apparatus DD may correspond to the first light emitting device ED-1, the second light emitting device ED-2, and the third light emitting device ED-3, respectively.

However, embodiments are not limited thereto, and the first to third light emitting devices ED-1, ED-2, and ED-3 may emit light in a same wavelength range or at least one light emitting device may emit a light in a wavelength range different from the others. For example, the first to third light emitting devices ED-1, ED-2, and ED-3 may all emit blue light.

The light emitting regions PXA-R, PXA-G, and PXA-B in the display apparatus DD according to an embodiment may be arranged in a stripe form. Referring to FIG. 1, the red light emitting regions PXA-R, the green light emitting regions PXA-G, and the blue light emitting regions PXA-B may each be arranged along a second directional axis DR2. The red light emitting region PXA-R, the green light emitting region PXA-G, and the blue light emitting region PXA-B may be alternately arranged in this order along a first directional axis DR1.

FIGS. 1 and 2 illustrate the light emitting regions PXA-R, PXA-G, and PXA-B as each having a similar area, but embodiments are not limited thereto, and the light emitting regions PXA-R, PXA-G, and PXA-B may have different areas from each other according to a wavelength range of the emitted light. For example, the areas of the light emitting regions PXA-R, PXA-G, and PXA-B may be areas in a plan view that are defined by the first directional axis DR1 and the second directional axis DR2.

The arrangement form of the light emitting regions PXA-R, PXA-G, and PXA-B is not limited to the feature illustrated in FIG. 1, and the order in which the red light emitting region PXA-R, the green light emitting region PXA-G, and the blue light emitting region PXA-B are arranged may be variously combined and provided according to characteristics of a display quality required in the display apparatus DD. For example, the arrangement form of the light emitting regions PXA-R, PXA-G, and PXA-B may be a PenTile® arrangement form or a diamond arrangement form.

The areas of the light emitting regions PXA-R, PXA-G, and PXA-B may be different from each other. For example, in an embodiment, an area of the green light emitting region PXA-G may be smaller than an area of the blue light emitting region PXA-B, but embodiments are not limited thereto.

Hereinafter, FIGS. 3 to 6 are each a schematic cross-sectional view illustrating luminescence devices according to embodiments. Each of the light emitting devices ED according to embodiments may include a first electrode EL1, a hole transport region HTR, an emission layer EML, an electron transport region ETR, and a second electrode EL2 that are sequentially stacked.

Figure 3:
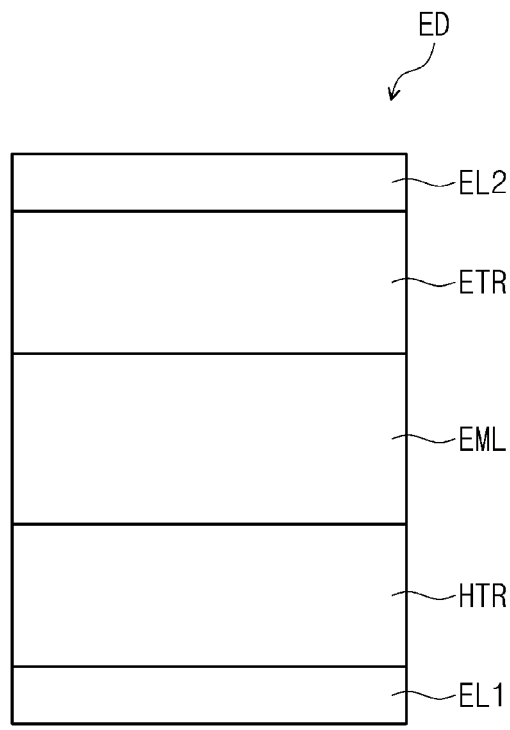
FIG. 3 is a schematic cross-sectional view illustrating a light emitting device according to an embodiment.
Figure 4:
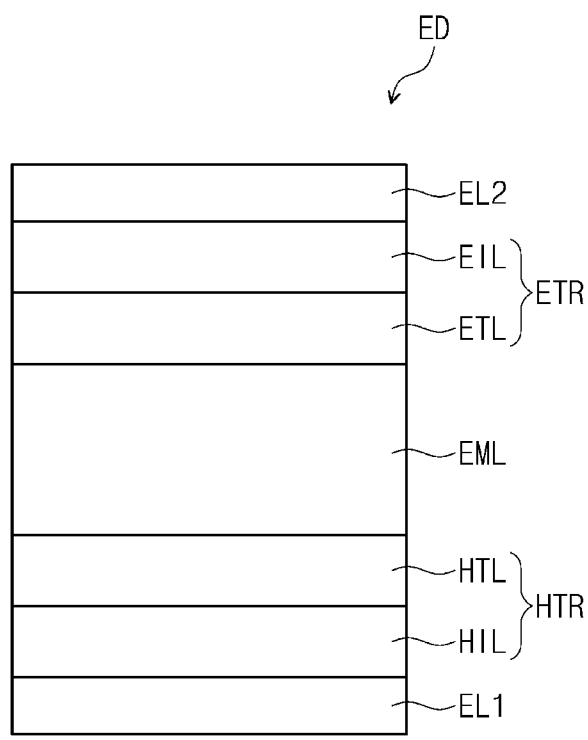
FIG. 4 is a schematic cross-sectional view illustrating a light emitting device according to an embodiment.
Figure 5:
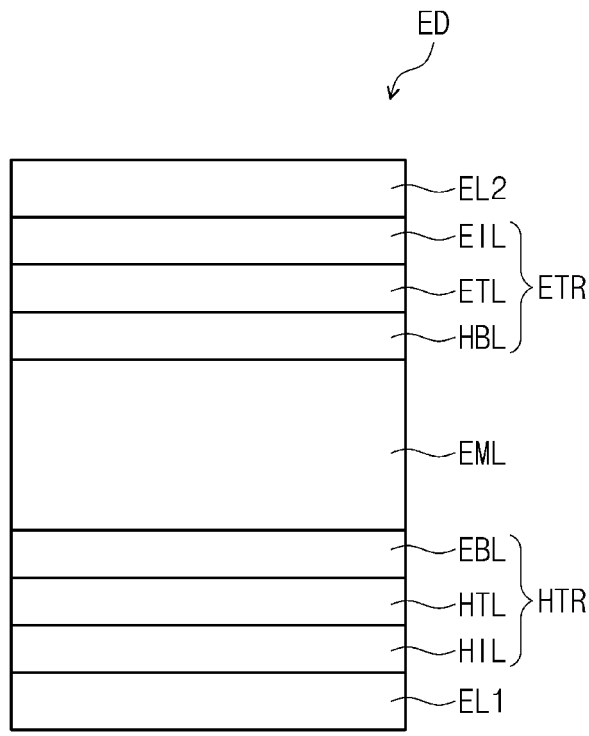
FIG. 5 is a schematic cross-sectional view illustrating a light emitting device according to an embodiment.
Figure 6:
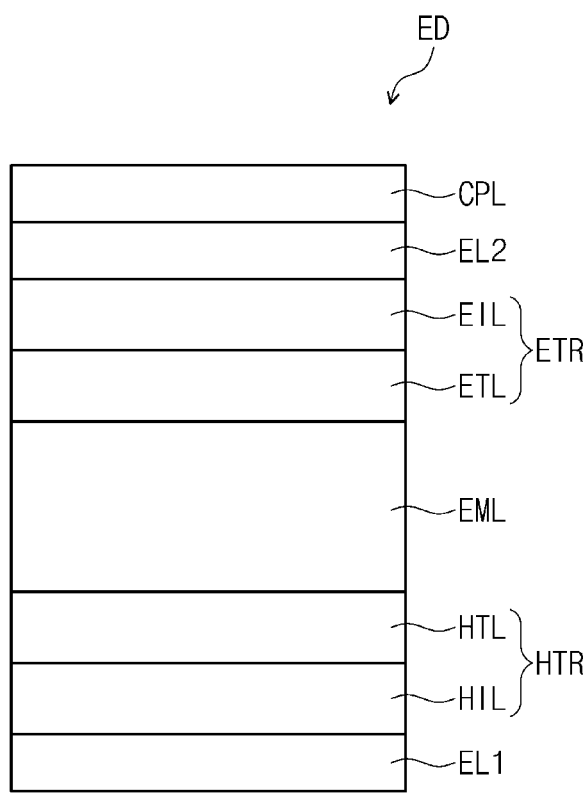
FIG. 6 is a schematic cross-sectional view illustrating a light emitting device according to an embodiment.

In comparison to FIG. 3, FIG. 4 illustrates a schematic cross-sectional view of a light emitting device ED of an embodiment, in which a hole transport region HTR includes a hole injection layer HIL and a hole transport layer HTL, and an electron transport region ETR includes an electron injection layer EIL and an electron transport layer ETL. In comparison to FIG. 3, FIG. 5 illustrates a schematic cross-sectional view of a light emitting device ED of an embodiment, in which a hole transport region HTR includes a hole injection layer HIL, a hole transport layer HTL, and an electron blocking layer EBL, and an electron transport region ETR includes an electron injection layer EIL, an electron transport layer ETL, and a hole blocking layer HBL. In comparison to FIG. 4, FIG. 6 illustrates a schematic cross-sectional view of a light emitting device ED of an embodiment that includes a capping layer CPL disposed on a second electrode EL2.

The first electrode EL1 has conductivity. The first electrode EL1 may be formed of a metal material, a metal alloy, or a conductive compound. The first electrode EL1 may be an anode or a cathode. However, embodiments are not limited thereto. For example, the first electrode EL1 may be a pixel electrode. The first electrode EL1 may be a transmissive electrode, a transflective electrode, or a reflective electrode. If the first electrode EL1 is a transmissive electrode, the first electrode EL1 may be formed using a transparent metal oxide such as indium tin oxide (ITO), indium zinc oxide (IZO), zinc oxide (ZnO), and indium tin zinc oxide (ITZO). If the first electrode EL1 is a transflective electrode or a reflective electrode, the first electrode EL1 may include Ag, Mg, Cu, Al, Pt, Pd, Au, Ni, Nd, Ir, Cr, Li, Ca, LiF/Ca, LiF/Al, Mo, Ti, W, a compound thereof, or a mixture thereof (e.g., a mixture of Ag and Mg). In another embodiment, the first electrode EL1 may have a multilayer structure including a reflective film or a transflective film formed of the above-described materials, and a transparent conductive film formed of ITO, IZO, ZnO, ITZO, etc. For example, the first electrode EL1 may have a three-layer structure of ITO/Ag/ITO, but embodiments are not limited thereto. In another embodiment, the first electrode EL1 may include the above-described metal materials, combinations of at least two metal materials of the above-described metal materials, oxides of the above-described metal materials, or the like. A thickness of the first electrode EL1 may be in a range of about 700 Å to about 10,000 Å. For example, the thickness of the first electrode EL1 may be in a range of about 1,000 Å to about 3,000 Å.

The hole transport region HTR is provided on the first electrode EL1. The hole transport region HTR may include at least one of a hole injection layer HIL, a hole transport layer HTL, a buffer layer (not shown), an emission-auxiliary layer (not shown), and an electron blocking layer EBL. A thickness of the hole transport region HTR may be, for example, in a range of about 50 Å to about 15,000 Å.

The hole transport region HTR may have a single layer formed of a single material, a single layer formed of a different materials, or a multilayer structure including layers formed of different materials.

For example, the hole transport region HTR may have a single layer structure of the hole injection layer HIL or the hole transport layer HTL, and may have a single layer structure formed of a hole injection material and a hole transport material. The hole transport region HTR may have a single layer structure formed of different materials, or a structure in which a hole injection layer HIL/hole transport layer HTL, a hole injection layer HIL/hole transport layer HTL/buffer layer (not shown), a hole injection layer HIL/buffer layer (not shown), a hole transport layer HTL/buffer layer (not shown), or a hole injection layer HIL/hole transport layer HTL/electron blocking layer EBL are stacked in order from the first electrode EL1, but embodiments are not limited thereto.

The hole transport region HTR may be formed using various methods such as a vacuum deposition method, a spin coating method, a cast method, a Langmuir-Blodgett (LB) method, an inkjet printing method, a laser printing method, and a laser induced thermal imaging (LITI) method.

The hole transport region HTR may include a compound represented by Formula H-1 below:

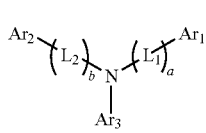

[Formula H-1]

In Formula H-1 above, $L_1$ and $L_2$ may each independently be a direct linkage, a substituted or unsubstituted arylene group having 6 to 30 ring-forming carbon atoms, or a substituted or unsubstituted heteroarylene group having 2 to 30 ring-forming carbon atoms. In Formula H-1, a and b may each independently be an integer from 0 to 10. In Formula H-1, when a or b is 2 or greater, multiple $L_1$ groups and multiple $L_2$ groups may each independently be a substituted or unsubstituted arylene group having 6 to 30 ring-forming carbon atoms, or a substituted or unsubstituted heteroarylene group having 2 to 30 ring-forming carbon atoms.

In Formula H-1, $Ar_1$ and $Ar_2$ may each independently be a substituted or unsubstituted aryl group having 6 to 30 ring-forming carbon atoms, or a substituted or unsubstituted heteroaryl group having 2 to 30 ring-forming carbon atoms. In Formula H-1, $Ar_3$ may be a substituted or unsubstituted aryl group having 6 to 30 ring-forming carbon atoms.

The compound represented by Formula H-1 above may be a monoamine compound. In another embodiment, the compound represented by Formula H-1 above may be a diamine compound in which at least one among $Ar_1$ to $Ar_3$ includes an amine group as a substituent. The compound represented by Formula H-1 above may be a carbazole-based compound including a substituted or unsubstituted carbazole group in at least one of $Ar_1$ or $Ar_2$, or a fluorene-based compound including a substituted or unsubstituted fluorene group in at least one of $Ar_1$ or $Ar_2$.

The compound represented by Formula H-1 may be represented by any one among the compounds of Compound Group H below. However, the compounds listed in Compound Group H below are examples, and the compounds represented by Formula H-1 are not limited to those represented by Compound Group H below:

[Compound Group H]

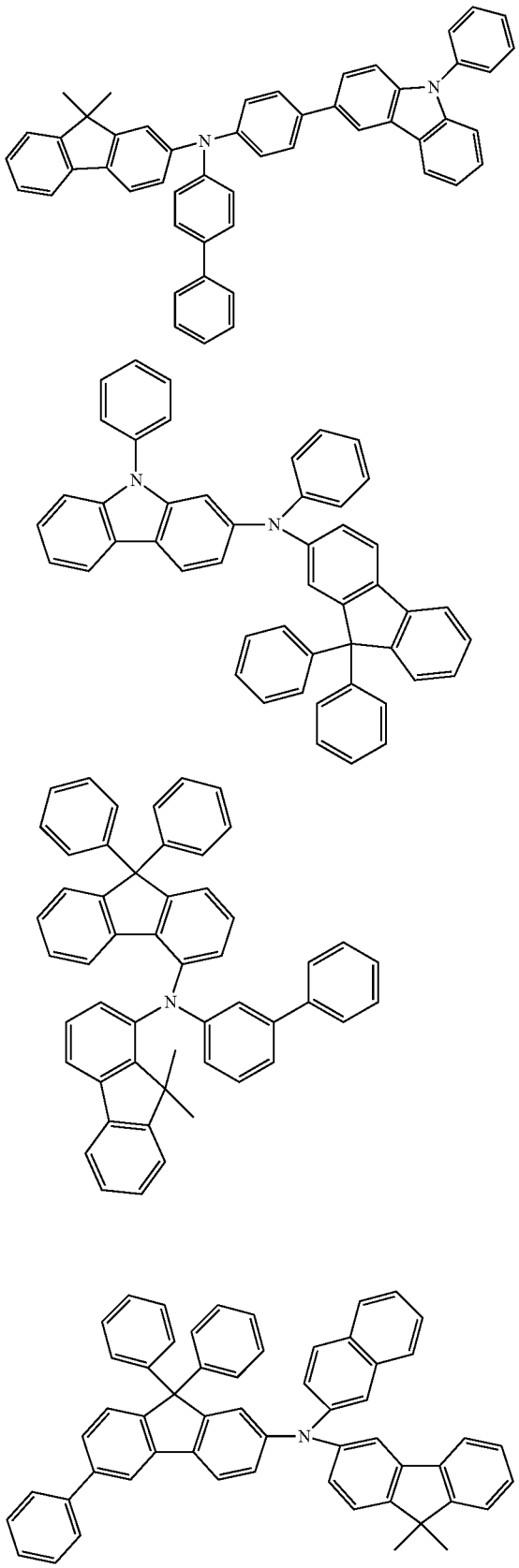

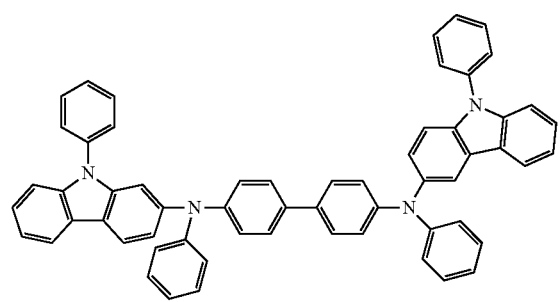
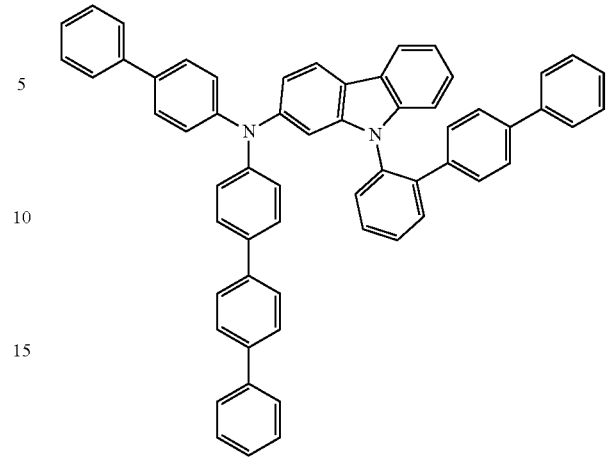
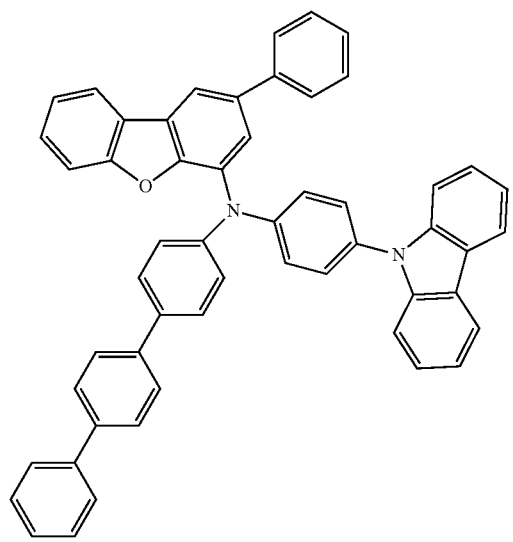
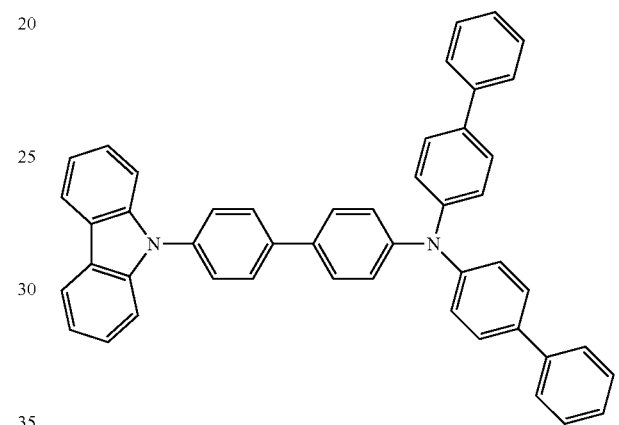
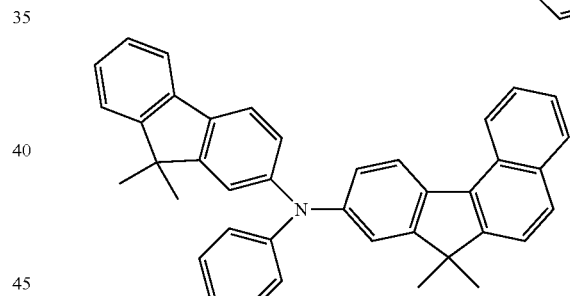
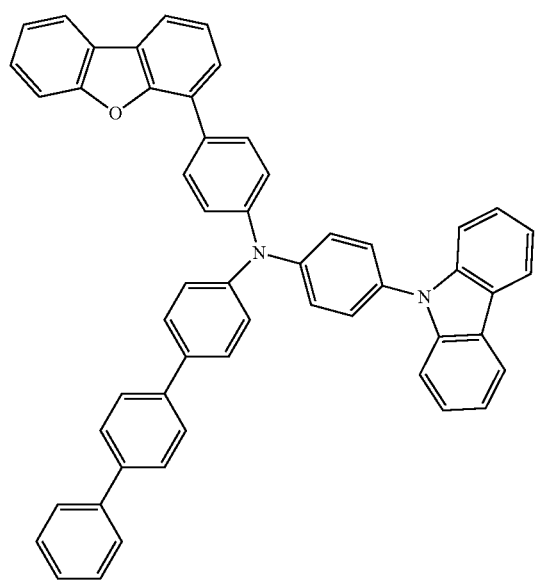
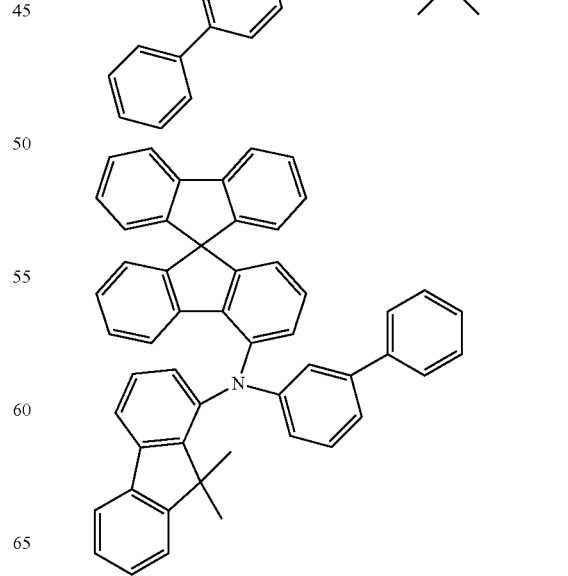

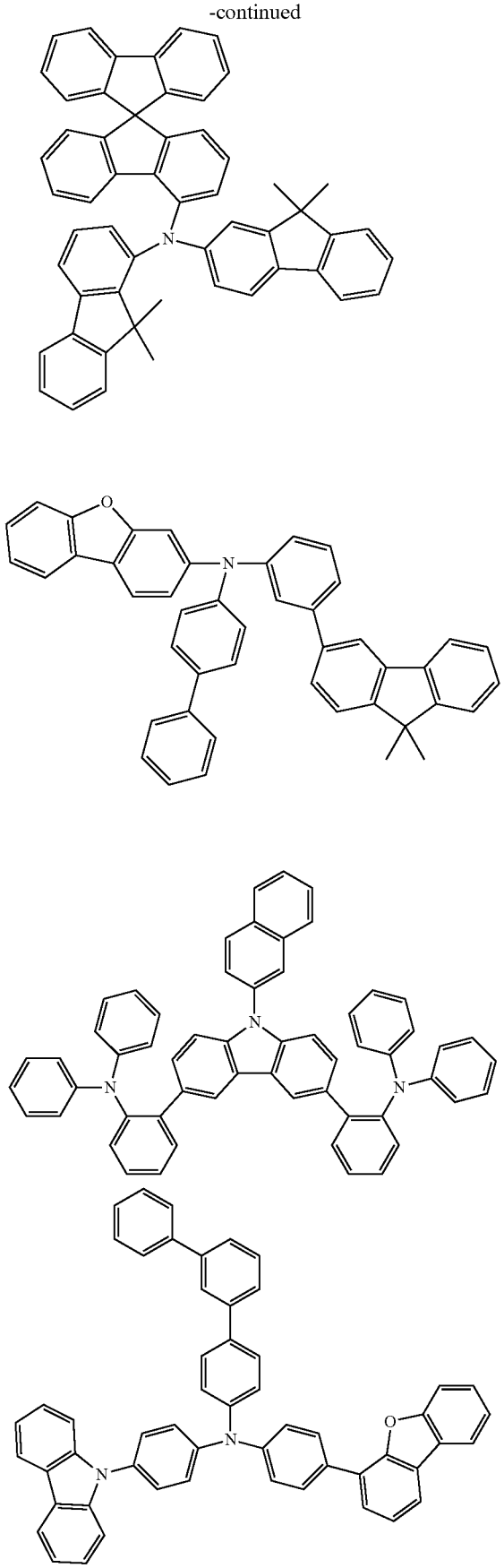
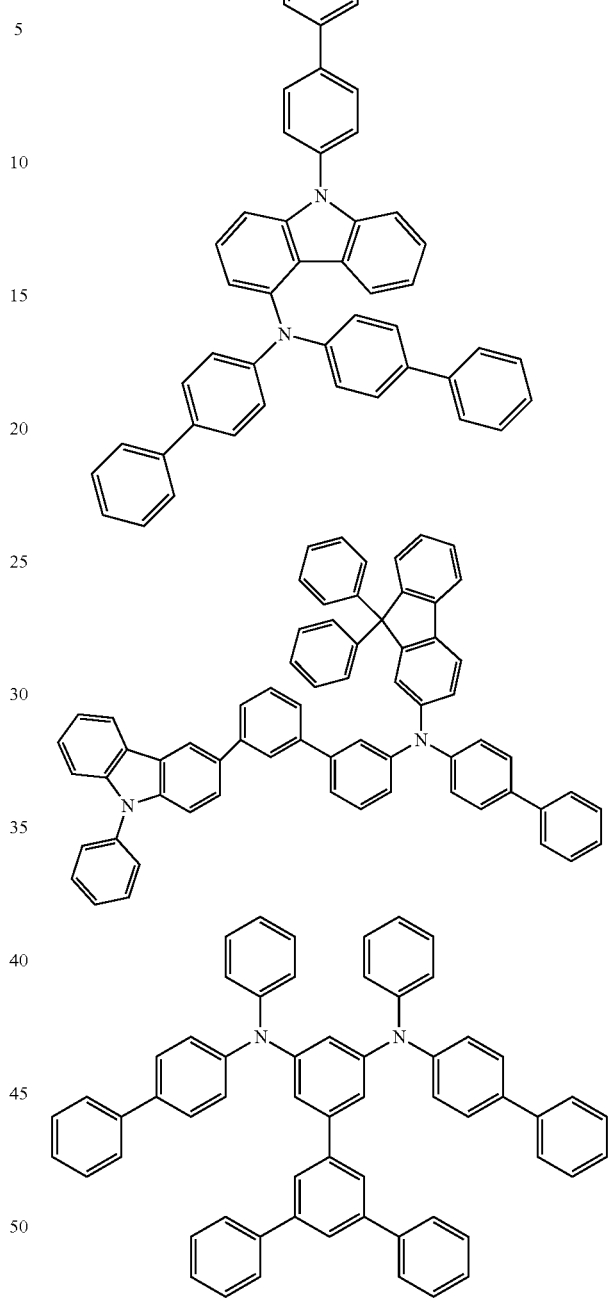

The hole transport region HTR may include a phthalocyanine compound such as copper phthalocyanine; $N^1,N^{1'}$-([1,1'-biphenyl]-4,4'-diyl)bis($N^1$-phenyl-$N^4,N^4$-di-m-tolyl-benzene-1,4-diamine) (DNTPD), 4,4',4''-[tris(3-methylphenyl)phenylamino]triphenylamine (m-MTDATA), 4,4'4''-tris(N,N-diphenylamino)triphenylamine (TDATA), 4,4',4''-tris[N(2-naphthyl)-N-phenylamino]-triphenylamine (2-TNATA), poly(3,4-ethylenedioxythiophene)/poly(4-styrenesulfonate) (PEDOT/PSS), polyaniline/dodecylbenzene-sulfonic acid (PANI/DBSA), polyaniline/camphor sulfonic acid (PANI/CSA), polyaniline/poly(4-styrenesulfonate) (PANI/PSS), N,N'-di(naphthalene-1-yl)-N,N'-diphenyl-benzidine (NPB), triphenylamine-containing polyetherketone (TPAPEK), 4-isopropyl-4'-methyldiphenyliodonium [tetrakis(pentafluorophenyl)borate], dipyrazino[2,3-f: 2',3'-h]quinoxaline-2,3,6,7,10,11-hexacarbonitrile (HATCN), etc.

The hole transport region HTR may include carbazole derivatives such as N-phenyl carbazole and polyvinyl carbazole, fluorene derivatives, N,N'-bis(3-methylphenyl)-N,N'-diphenyl-[1,1-biphenyl]-4,4'-diamine (TPD), triphenylamine derivatives such as 4,4',4''-tris(N-carbazolyl)triphenylamine (TCTA), N,N'-di(naphthalene-1-yl)-N,N'-diphenyl-benzidine (NPB), 4,4'-cyclohexylidene bis[N,N-bis(4-methylphenyl]benzenamine] (TAPC), 4,4'-bis[N,N'-(3-tolyl)amino]-3,3'-dimethylbiphenyl (HMTPD), 1,3-bis(N-carbazolyl)benzene (mCP), etc.

The hole transport region HTR may include 9-(4-tert-butylphenyl)-3,6-bis(triphenylsilyl)-9H-carbazole (CzSi), 9-phenyl-9H-3,9'-bicarbazole (CCP), 1,3-bis(1,8-dimethyl-9H-carbazol-9-yl)benzene (mDCP), etc.

The hole transport region HTR may include the above-described compound of the hole transport region in at least one of a hole injection layer HIL, a hole transport layer HTL, and an electron blocking layer EBL.

A thickness of the hole transport region HTR may be in a range of about 100 Å to about 10,000 Å. For example, the thickness of the hole transport region HTR may be in a range of about 100 Å to about 5,000 Å. When the hole transport region HTR includes a hole injection layer HIL, the hole injection layer HIL may have, for example, a thickness in a range of about 30 Å to about 1,000 Å. When the hole transport region HTR includes a hole transport layer HTL, the hole transport layer HTL may have a thickness in a range of about 30 Å to about 1,000 Å. For example, when the hole transport region HTR includes an electron blocking layer EBL, the electron blocking layer EBL may have a thickness in a range of about 10 Å to about 1,000 Å. If the thicknesses of the hole transport region HTR, the hole injection layer HIL, the hole transport layer HTL and the electron blocking layer EBL satisfy the above-described ranges, satisfactory hole transport characteristic may be achieved without a substantial increase of driving voltage.

The hole transport region HTR may further include a charge generating material in addition to the above-described materials to increase conductivity. The charge generating material may be dispersed uniformly or non-uniformly in the hole transport region HTR. The charge generating material may be, for example, a p-dopant. The p-dopant may include at least one of a halogenated metal compound, a quinone derivative, a metal oxide, or a cyano group-containing compound, but embodiments are not limited thereto. For example, the p-dopant may include metal halides such as CuI and RbI, quinone derivatives such as tetracyanoquinodimethane (TCNQ) and 2,3,5,6-tetrafluoro-7,7',8,8'-tetracyanoquinodimethane (F4-TCNQ), metal oxides such as tungsten oxide and molybdenum oxide, dipyrazino[2,3-f: 2',3'-h] quinoxaline-2,3,6,7,10,11-hexacarbonitrile (HATCN), 4-[[2,3-bis[cyano-(4-cyano-2,3,5,6-tetrafluorophenyl)methylidene]cyclopropylidene]-cyanomethyl]-2,3,5,6-tetrafluorobenzonitrile, etc., but embodiments are not limited thereto.

As described above, the hole transport region HTR may further include at least one of a buffer layer (not shown) and an electron blocking layer EBL in addition to the hole injection layer HIL and the hole transport layer HTL. The buffer layer (not shown) may compensate a resonance distance according to the wavelength of light emitted from the emission layer EML and may thus increase light emission efficiency. Materials which may be included in the hole transport region HTR may be used as materials to be included in the buffer layer (not shown). The electron blocking layer EBL may be a layer that serves to prevent electrons from being injected from the electron transport region ETR to the hole transport region HTR.

The emission layer EML is provided on the hole transport region HTR. The emission layer EML may have a thickness, for example, in a range of about 100 Å to about 1,000 Å. For example, a thickness of the emission layer EML may be in a range of about 100 Å to about 300 Å. The emission layer EML may have a single layer formed of a single material, a single layer formed of different materials, or a multilayer structure having layers formed of different materials.

The emission layer EML in the light emitting device ED of an embodiment may include a polycyclic compound represented by Formula 1 below:

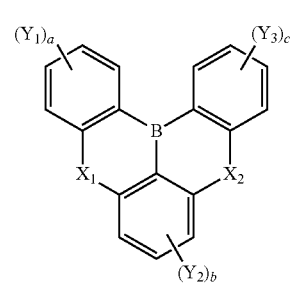

[Formula 1]

In Formula 1 above, a to c may each independently be 1 or 2, and $X_1$ and $X_2$ may each independently be O or $N(R_a)$. $R_a$ may be a hydrogen atom, a deuterium atom, a halogen atom, a cyano group, a substituted or unsubstituted amine group, a substituted or unsubstituted boryl group, a substituted or unsubstituted oxy group, a substituted or unsubstituted thio group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms.

In Formula 1, $Y_1$ to $Y_3$ may each independently be a hydrogen atom, a deuterium atom, a halogen atom, a cyano group, a substituted or unsubstituted amine group, a substituted or unsubstituted boryl group, a substituted or unsubstituted oxy group, a substituted or unsubstituted thio group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, and at least one of $Y_1$ to $Y_3$ may be a group represented by Formula $Z_1$ or Formula $Z_2$ below:

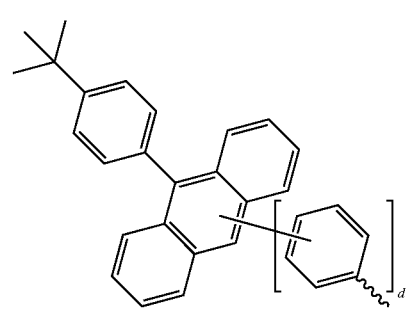

[Formula $Z_1$]

[Formula Z₂]

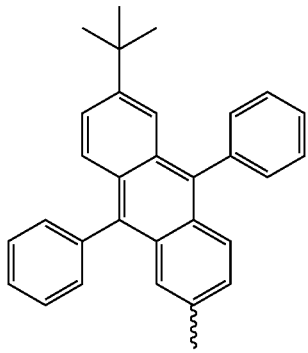

In Formula Z₁ above, d may be 0 or 1.

In an embodiment, the polycyclic compound of an embodiment included in the emission layer EML may emit blue light or green light.

In an embodiment, Formula 1 above may be represented by any one of Formula 2 to Formula 4 below:

[Formula 2]

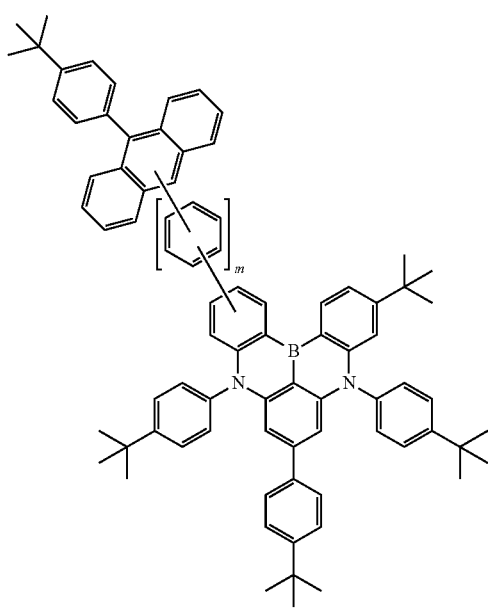

[Formula 3]

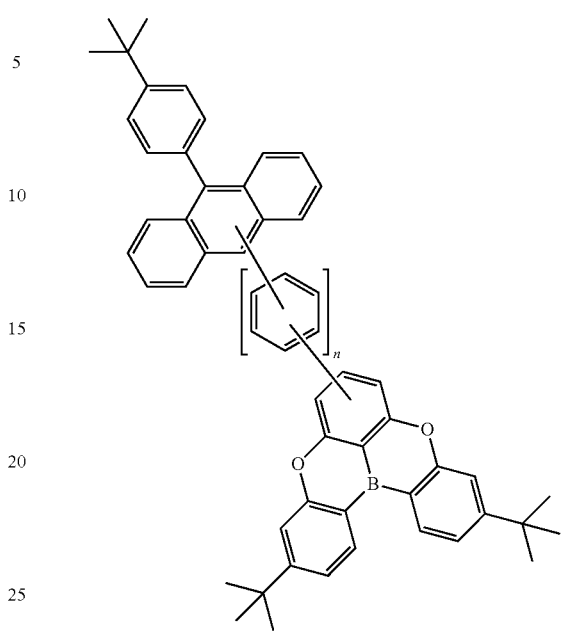

[Formula 4]

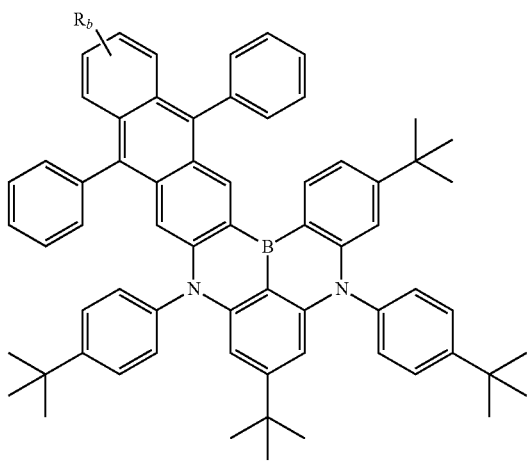

Formula 2 is a case where $Y_1$ is an anthracenyl group, and $X_1$ and $X_2$ are nitrogen atoms in Formula 1. Formula 3 is a case where $Y_2$ is an anthracenyl group, and $X_1$ and $X_2$ are oxygen atoms in Formula 1. Formula 4 is a case where two $Y_1$ groups form a condensed cyclic ring with an adjacent multiple-substituted phenyl group, and each of $X_1$ and $X_2$ is a nitrogen atom in Formula 1.

In Formula 2, m may be 0 or 1. When m is 0, the anthracenyl group may be directly bonded to the moiety containing boron, and when m is 1, the anthracenyl group may be bonded to the divalent phenyl group which is bonded to the moiety containing boron.

In Formula 3, n may be 0 or 1. When n is 0, the anthracenyl group may be directly bonded to the moiety containing boron, and when n is 1, the anthracenyl group may be bonded to the divalent phenyl group which is bonded to the moiety containing boron.

In Formula 4, $R_b$ may be a hydrogen atom, a deuterium atom, a halogen atom, a cyano group, a substituted or unsubstituted amine group, a substituted or unsubstituted boryl group, a substituted or unsubstituted oxy group, a substituted or unsubstituted thio group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms.

A first polycyclic compound represented by Formula 2 or Formula 3 and a second polycyclic compound represented by Formula 4 each include a trivalent phenyl group bonded to the boron, a tetravalent phenyl group bonded to the boron, a divalent phenyl group bonded to each nitrogen, and a tert-butyl group bonded to the anthracenyl group, and thus may provide a polycyclic compound having an improved service life compared to a structure in which a tert-butyl group is not a substitutent. The first polycyclic compound represented by Formula 2 or Formula 3 may emit blue light, and the second polycyclic compound represented by Formula 4 may emit green light.

In an embodiment, the polycyclic compound may be represented by Formula 2-1, Formula 2-2, or Formula 2-3 below:

[Formula 2-1]

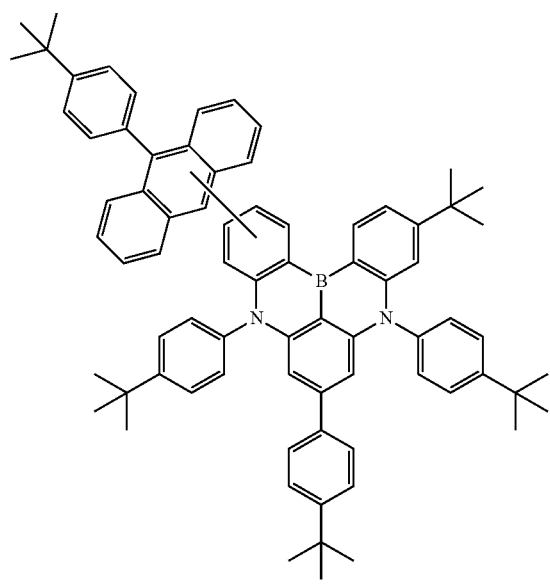

[Formula 2-2]

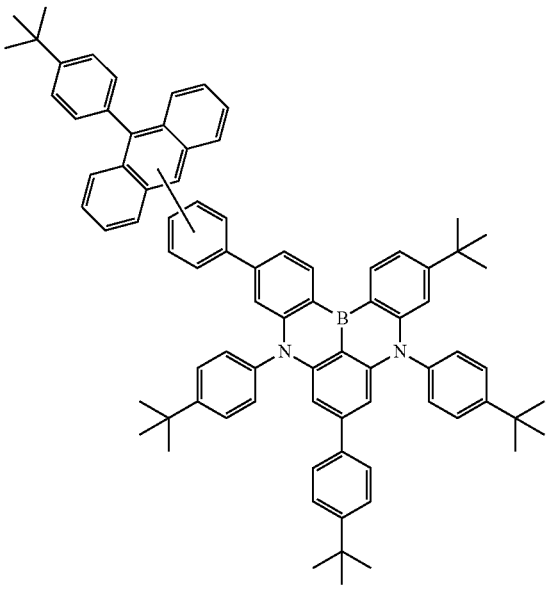

[Formula 2-3]

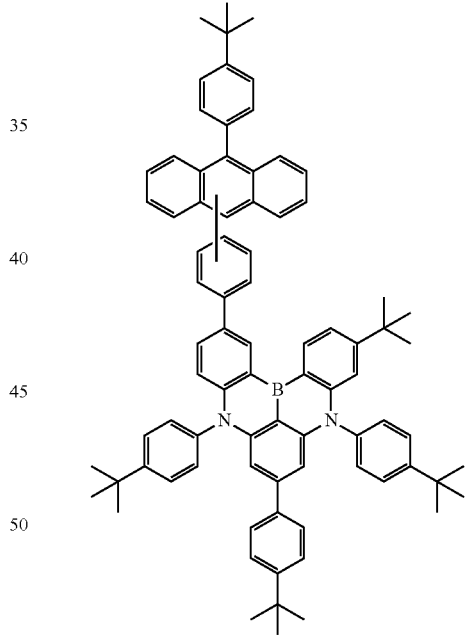

Formula 2-1 is a case where m is 0 in Formula 2. Formula 2-2 is a case where, in Formula 2, m is 1 and the divalent phenyl group as a linker is present at the para-position with the boron atom in the phenyl group to which the boron atom is bonded. Formula 2-3 is a case where, in Formula 2, m is 1 and the divalent phenyl group as a linker is present at the meta-position with the boron atom and at the para-position with the nitrogen atom in the phenyl group to which the boron atom is bonded.

In an embodiment, the polycyclic compound may be represented by Formula 3-1 or Formula 3-2 below:

[Formula 3-1]

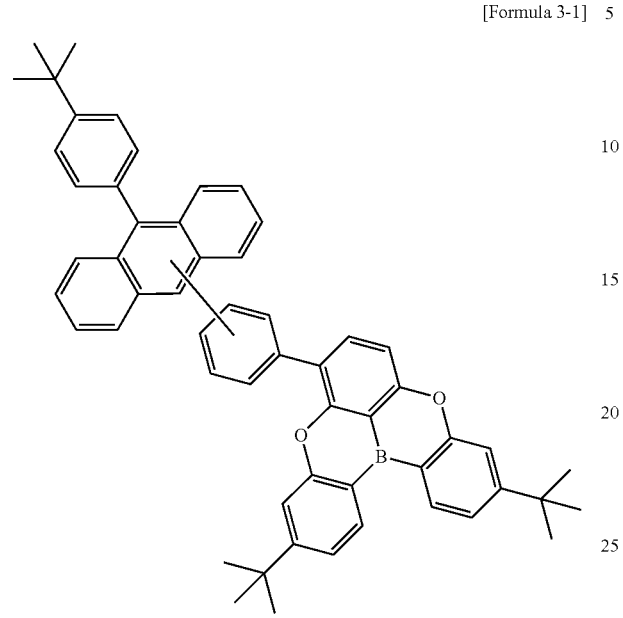

[Formula 3-2]

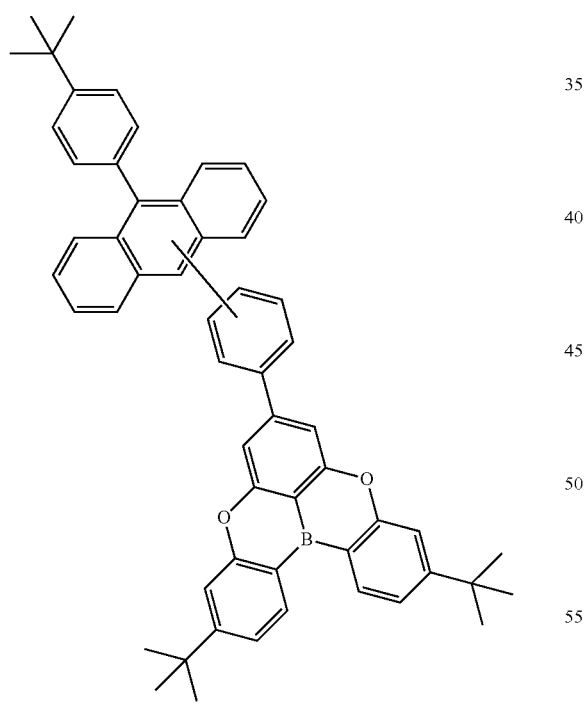

Formula 3-1 is a case where n is 0 in Formula 3, and Formula 3-2 is a case where n is 1 in Formula 3.

In an embodiment, the polycyclic compound may be represented by any one among compounds in Compound Group 1 below. For example, the emission layer EML may include at least one compound selected from Compound Group 1 below:

[Compound Group 1]

BD1

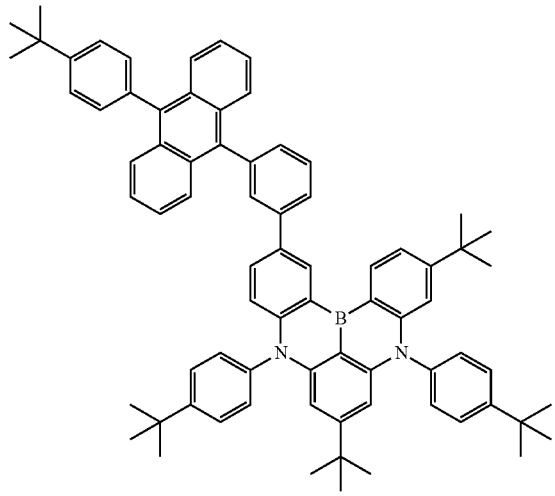

BD2

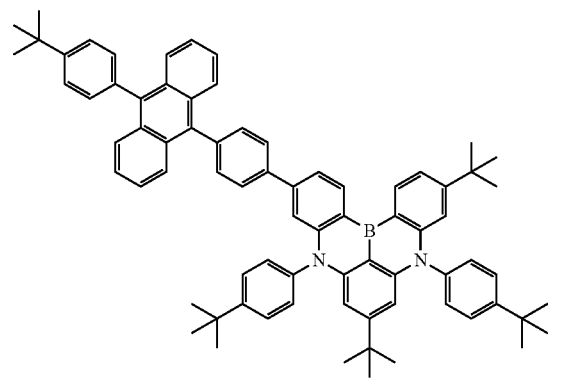

BD3

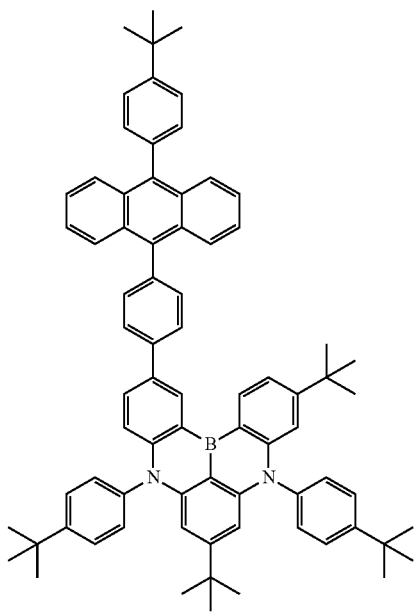

BD4
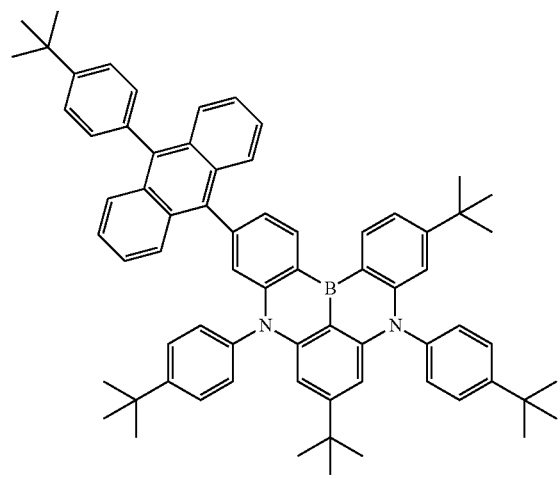
BD5
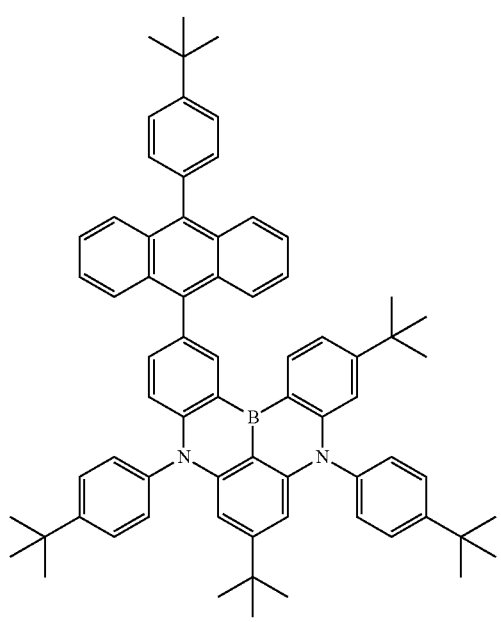
BD6
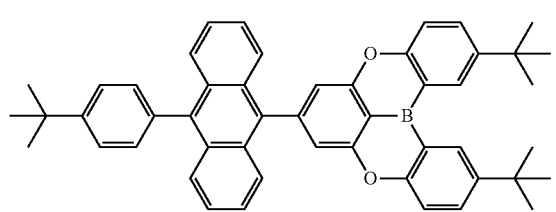
BD7
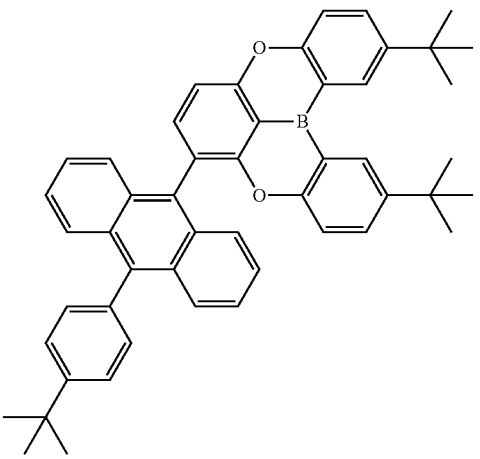
BD9
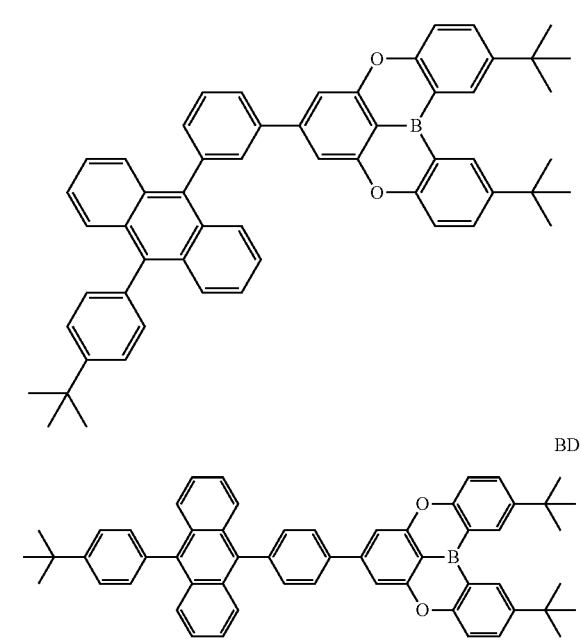
BD8
GD1
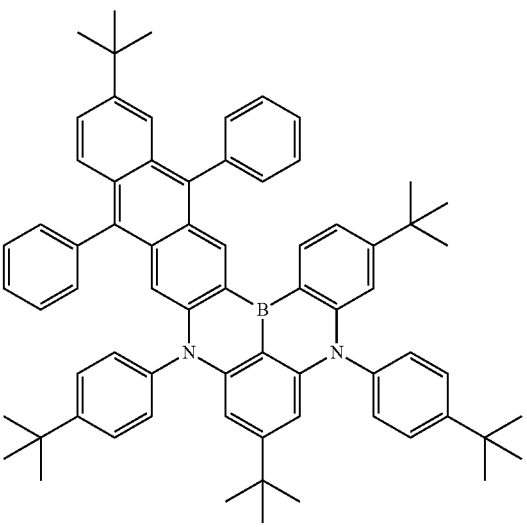

In the light emitting devices ED of embodiments illustrated in FIGS. 3 to 6, the emission layer EML may include a host and a dopant. The polycyclic compound according to an embodiment may be used as a dopant material. The polycyclic compound according to an embodiment may be used as a dopant material of the emission layer which emits fluorescence, phosphorescence, delayed fluorescence, etc.

The emission layer EML may further include a compound represented by Formula E-1 below in addition to the polycyclic compound of an embodiment. The compound represented by Formula E-1 below may be used as a fluorescence host material.

[Formula E-1]

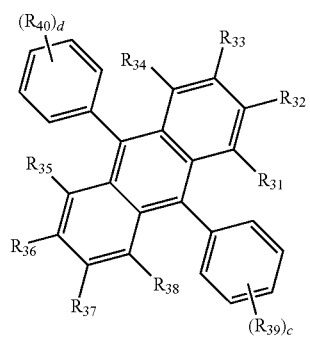

In Formula E-1, $R_{31}$ to $R_{40}$ may each independently be a hydrogen atom, a deuterium atom, a halogen atom, a substituted or unsubstituted silyl group, a substituted or unsubstituted alkyl group having 1 to 10 carbon atoms, a substituted or unsubstituted aryl group having 6 to 30 ring-forming carbon atoms, or a substituted or unsubstituted heteroaryl group having 2 to 30 ring-forming carbon atoms, or may be bonded to an adjacent group to form a ring. In Formula E-1, $R_{31}$ to $R_{40}$ may be bonded to an adjacent group to form a saturated hydrocarbon ring or an unsaturated hydrocarbon ring.

In Formula E-1, c and d may each independently be an integer from 0 to 5.

The compound represented by Formula E-1 may be selected from any one among Compound E1 to Compound E19 below:

E1

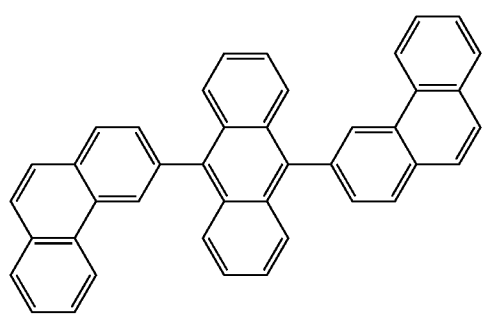

-continued

E2

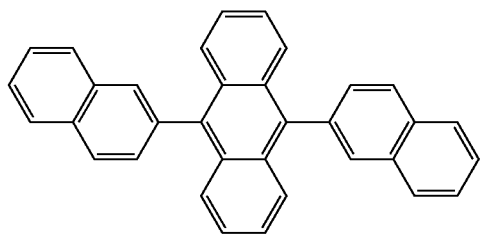

E3

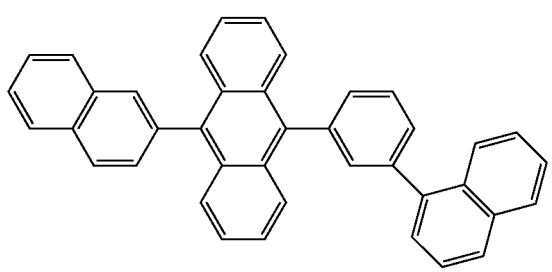

E4

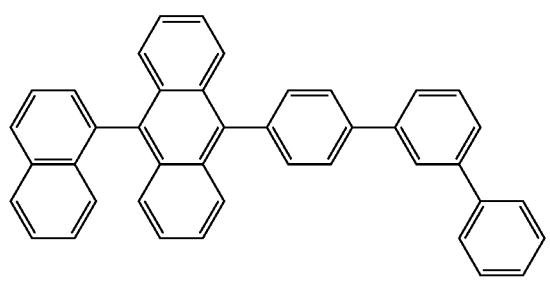

E5

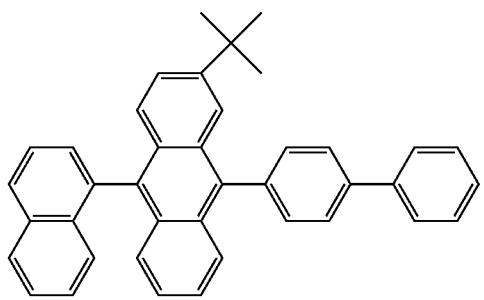

E6

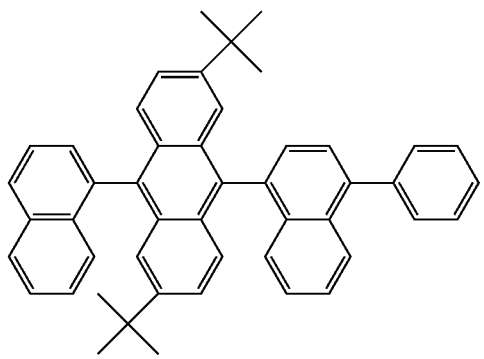

E7
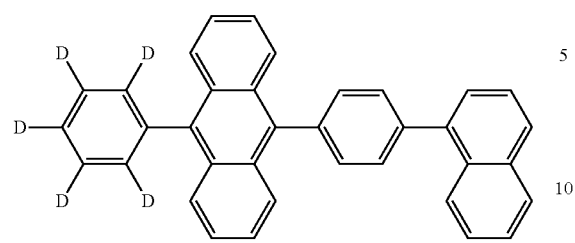
E8
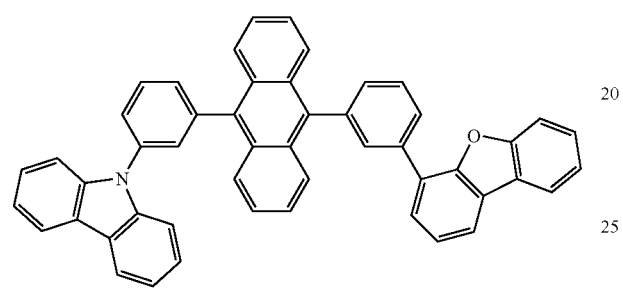
E9
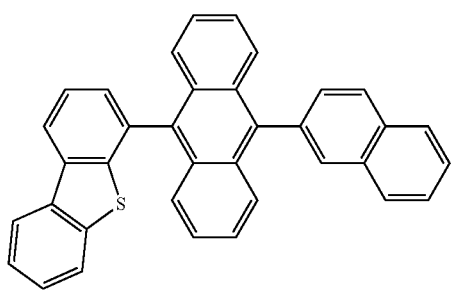
E10
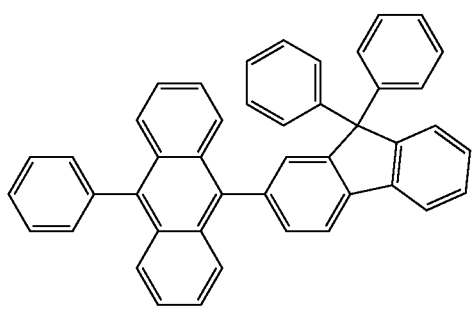
E11
E12
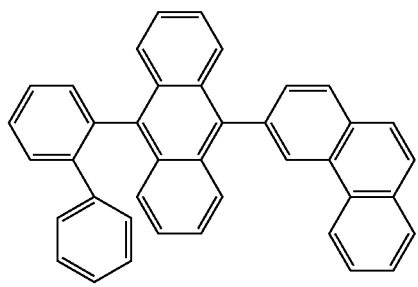
E13
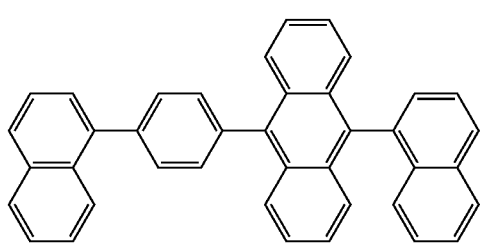
E14
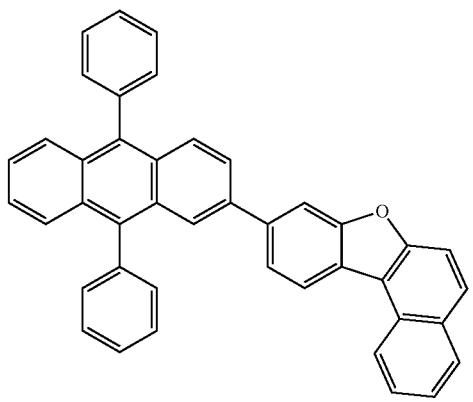
E15
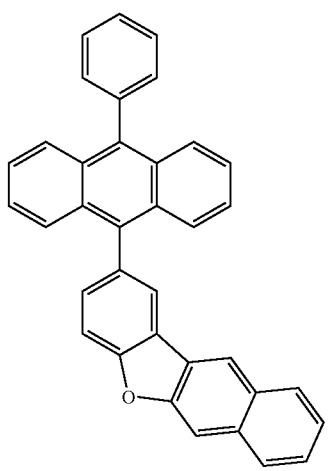

E16

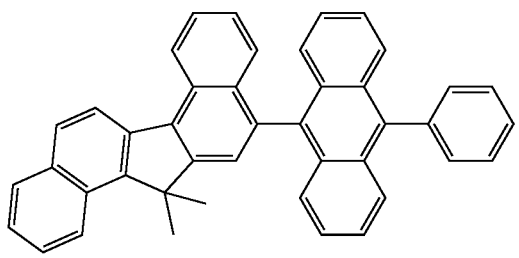

E17

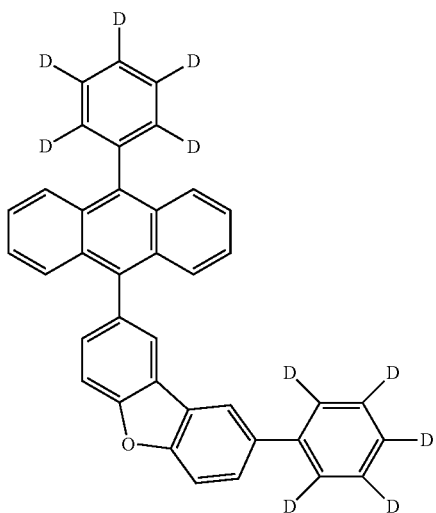

E18

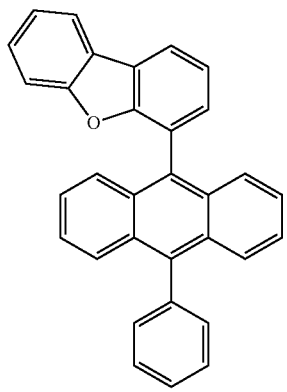

E19

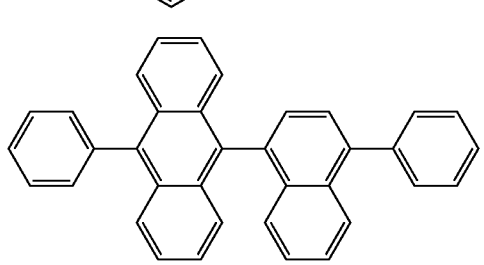

In an embodiment, the emission layer EML may further include a compound represented by Formula E-2a or Formula E-2b below in addition to the polycyclic compound of an embodiment. The compound represented by Formula E-2a or Formula E-2b below may be used as a phosphorescence host material.

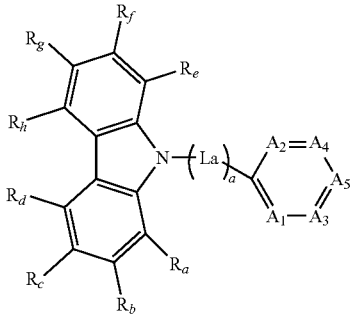

[Formula E-2a]

In Formula E-2a, a may be an integer from 0 to 10, and La may be a direct linkage, a substituted or unsubstituted arylene group having 6 to 30 ring-forming carbon atoms, or a substituted or unsubstituted heteroarylene group having 2 to 30 ring-forming carbon atoms. In Formula E-2a, if a is 2 or greater, multiple La groups may each independently be a substituted or unsubstituted arylene group having 6 to 30 ring-forming carbon atoms, or a substituted or unsubstituted heteroarylene group having 2 to 30 ring-forming carbon atoms.

In Formula E-2a, $A_1$ to $A_5$ may each independently be N or $C(R_i)$. $R_a$ to $R_i$ may each independently be a hydrogen atom, a deuterium atom, a substituted or unsubstituted amine group, a substituted or unsubstituted thio group, a substituted or unsubstituted oxy group, a substituted or unsubstituted alkyl group having 1 to 20 carbon atoms, a substituted or unsubstituted alkenyl group having 2 to 20 carbon atoms, a substituted or unsubstituted aryl group having 6 to 30 ring-forming carbon atoms, or a substituted or unsubstituted heteroaryl group having 2 to 30 ring-forming carbon atoms, or may be bonded to an adjacent group to form a ring. $R_a$ to $R_i$ may be bonded to an adjacent group to form a hydrocarbon ring or to form a heterocycle containing N, O, S, etc. as a ring-forming atom.

In Formula E-2a, two or three of $A_1$ to $A_5$ may be N, and the remainder of $A_1$ to $A_5$ may be $C(R_i)$.

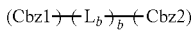

[Formula E-2b]

In Formula E-2b, Cbz1 and Cbz2 may each independently be an unsubstituted carbazole group, or a carbazole group substituted with an aryl group having 6 to 30 ring-forming carbon atoms. $L_b$ is a direct linkage, a substituted or unsubstituted arylene group having 6 to 30 ring-forming carbon atoms, or a substituted or unsubstituted heteroarylene group having 2 to 30 ring-forming carbon atoms. In Formula E-2b, b may be an integer from 0 to 10, and when b is 2 or greater, multiple $L_b$ groups may each independently be a substituted or unsubstituted arylene group having 6 to 30 ring-forming carbon atoms, or a substituted or unsubstituted heteroarylene group having 2 to 30 ring-forming carbon atoms.

The compound represented by Formula E-2a or Formula E-2b may be selected from any one among the compounds of Compound Group E-2 below. However, the compounds listed in Compound Group E-2 below are examples, the compound represented by Formula E-2a or Formula E-2b is not limited to those represented by Compound Group E-2 below.

[Compound Group E-2]
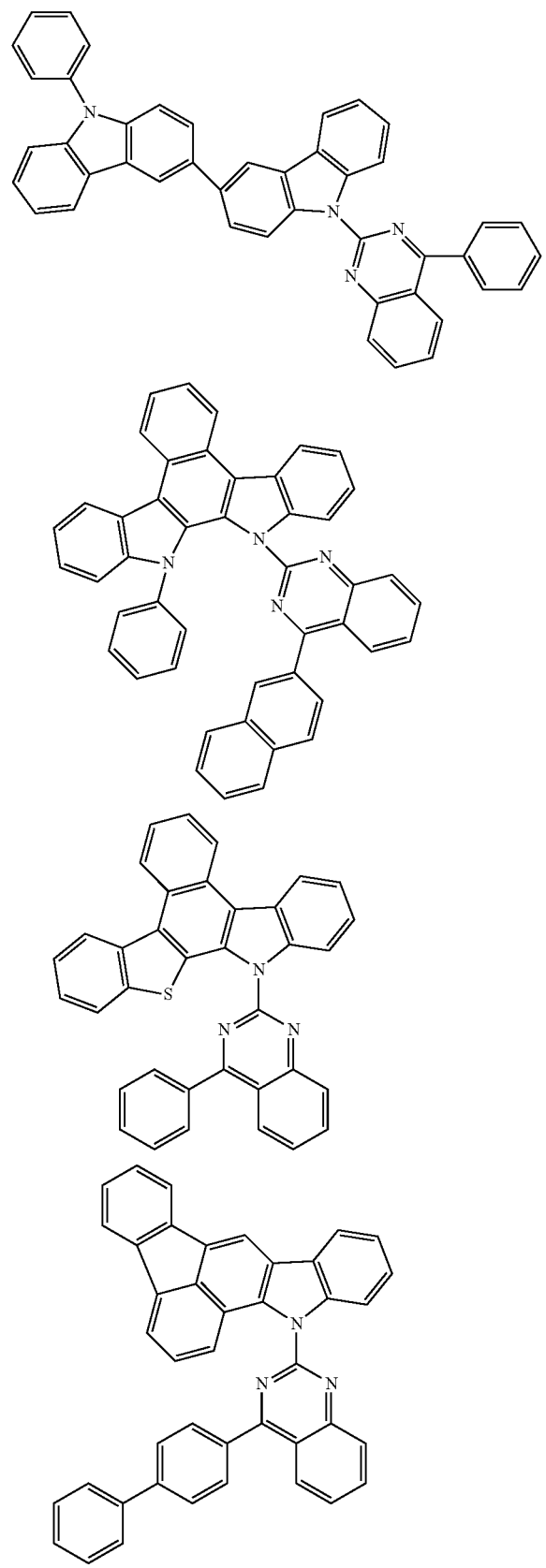
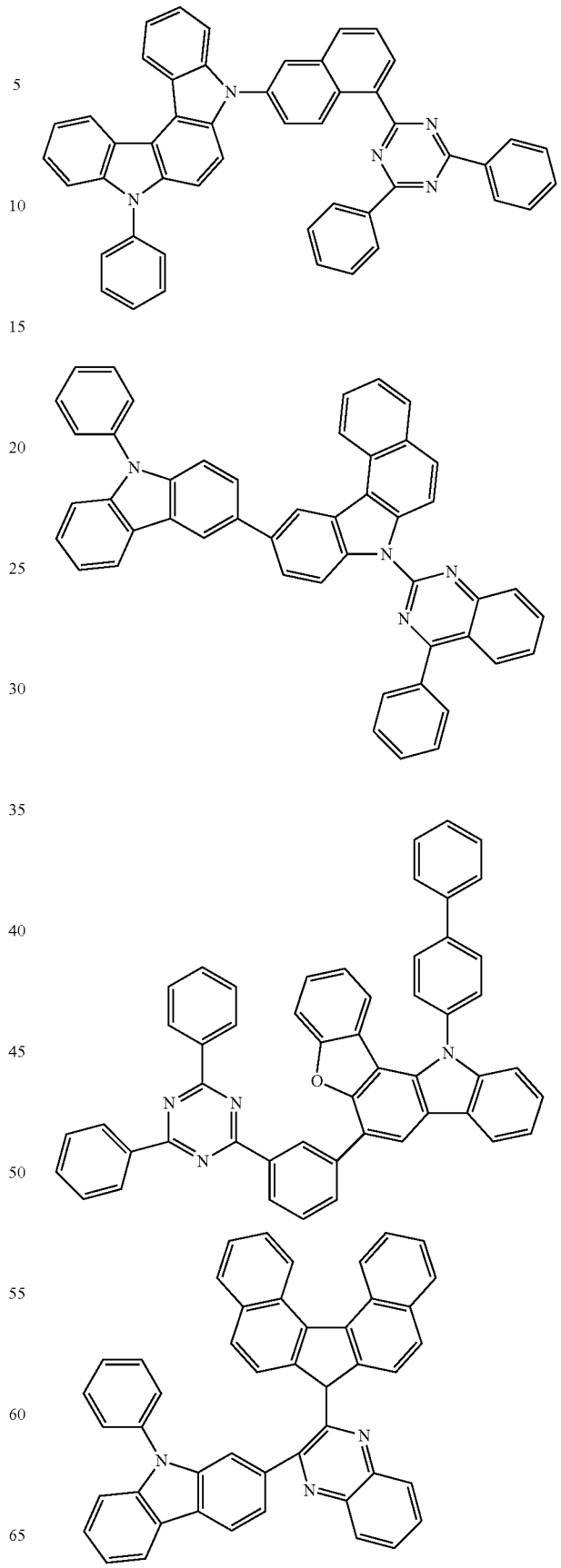

49
-continued
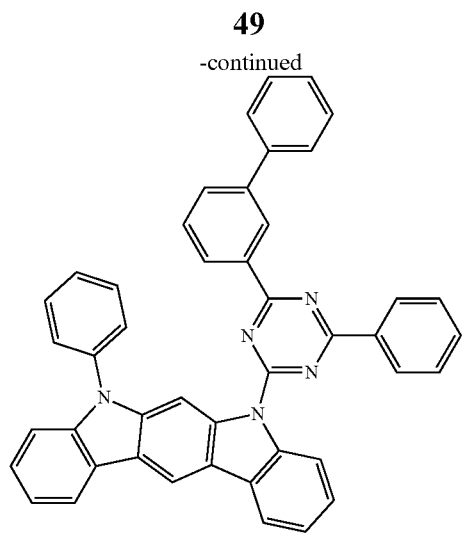
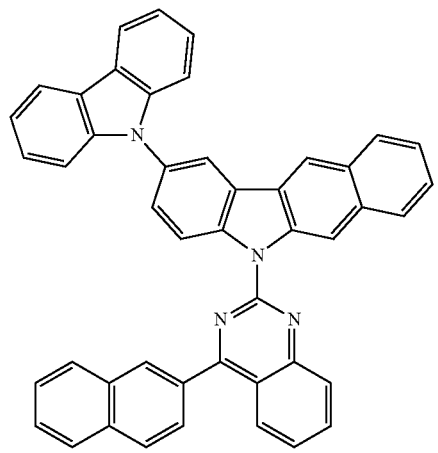
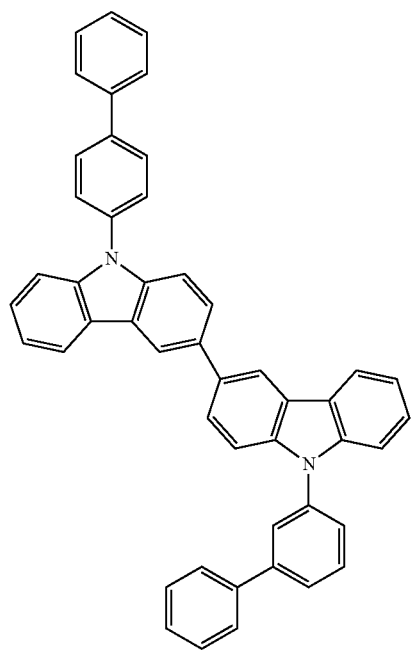
50
-continued
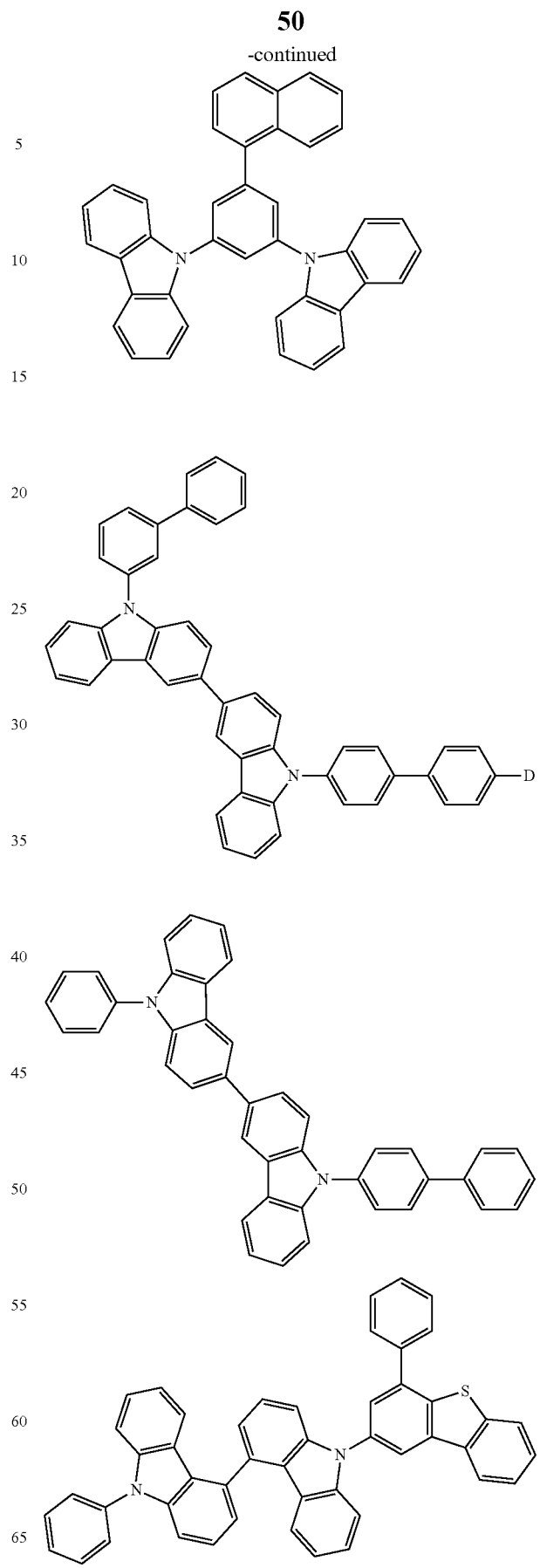

51
-continued
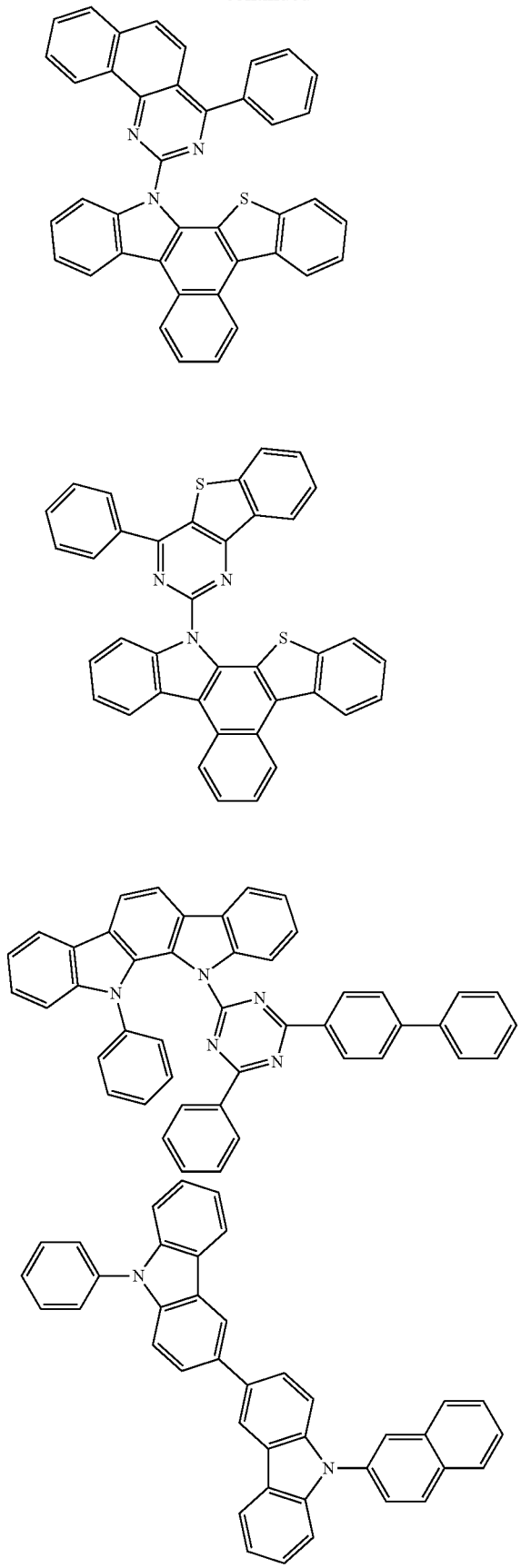
52
-continued
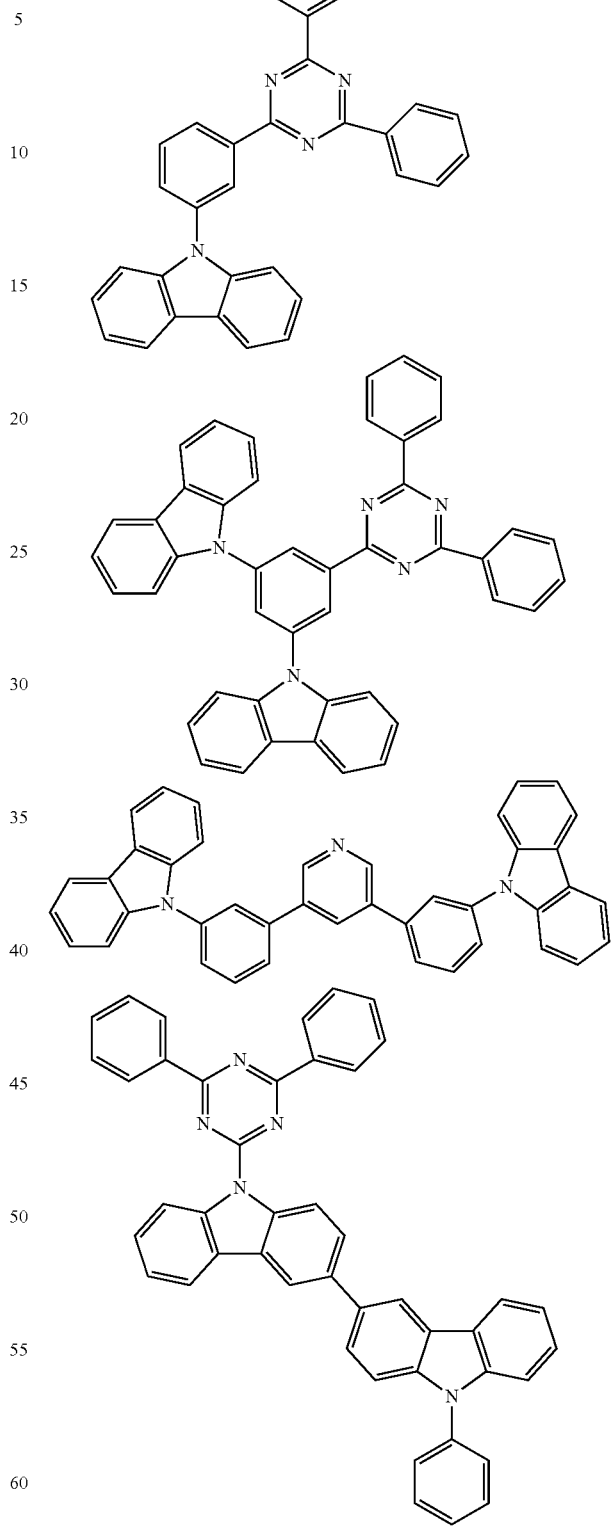
The emission layer EML may further include a general material in the art as a host material in addition to the polycyclic compound of an embodiment. For example, the emission layer EML may include, as a host material, at least one of bis[2-(diphenylphosphino)phenyl]ether oxide (DPEPO), 4,4'-bis(carbazol-9-yl)biphenyl (CBP), 1,3-bis(carbazol-9-yl)benzene (mCP), 2,8-bis(diphenylphosphoryl)dibenzo[b,d]furan (PPF), 4,4',4"-tris(carbazol-9-yl)-triphenylamine (TCTA), and 1,3,5-tris(1-phenyl-1H-benzo[d]imidazole-2-yl)benzene (TPBi). However, embodiments are not limited thereto, and for example, tris(8-hydroxyquinolino)aluminum ($Alq_3$), 4,4'-bis(N-carbazolyl)-1,1'-biphenyl (CBP), poly(N-vinylcarbazole) (PVK), 9,10-di(naphthalene-2-yl)anthracene (ADN), 4,4',4"-tris(carbazol-9-yl)-triphenylamine (TCTA), 1,3,5-tris(N-phenylbenzimidazole-2-yl)benzene (TPBi), 2-tert-butyl-9,10-di(naphth-2-yl)anthracene (TBADN), distyrylarylene (DSA), 4,4'-bis(9-carbazolyl)-2,2'-dimethyl-biphenyl (CDBP), 2-methyl-9,10-bis(naphthalen-2-yl)anthracene (MADN), hexaphenylcyclotriphosphazene (CP1), 1,4-bis(triphenylsilyl)benzene (UGH2), hexaphenylcyclotrisiloxane ($DPSiO_3$), octaphenylcyclotetra siloxane ($DPSiO_4$), 2,8-bis(diphenylphosphoryl)dibenzofuran (PPF), etc. may be used as a host material.

The emission layer EML may further include a compound represented by Formula M-a or Formula M-b below in addition to the polycyclic compound of an embodiment. The compound represented by Formula M-a or Formula M-b below may be used as a phosphorescence dopant material.

[Formula M-a]

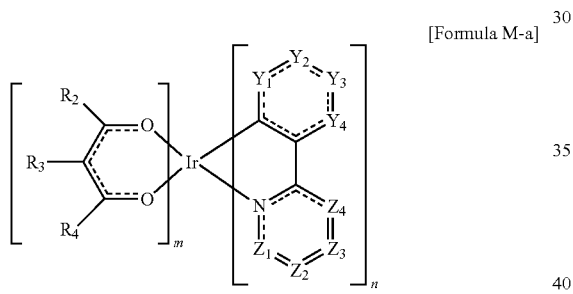

In Formula M-a above, $Y_1$ to $Y_4$ and $Z_1$ to $Z_4$ may each independently be $C(R_1)$ or N, $R_1$ to $R_4$ may each independently be a hydrogen atom, a deuterium atom, a substituted or unsubstituted amine group, a substituted or unsubstituted thio group, a substituted or unsubstituted oxy group, a substituted or unsubstituted alkyl group having 1 to 20 carbon atoms, a substituted or unsubstituted alkenyl group having 2 to 20 carbon atoms, a substituted or unsubstituted aryl group having 6 to 30 ring-forming carbon atoms, or a substituted or unsubstituted heteroaryl group having 2 to 30 ring-forming carbon atoms, or may be bonded to an adjacent group to form a ring. In Formula M-a, m may be 0 or 1, and n may be 2 or 3. In Formula M-a, when m is 0, n may be 3, and when m is 1, n may be 2.

The compound represented by Formula M-a may be used as a red phosphorescence dopant or a green phosphorescence dopant.

The compound represented by Formula M-a may be selected from any one among Compound M-a1 to Compound M-a19 below. However, Compounds M-a1 to M-a19 below are examples, and the compound represented by Formula M-a is not limited to those represented by Compounds M-a1 to M-a19 below.

M-a1

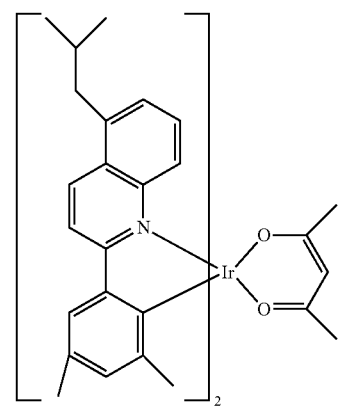

M-a2

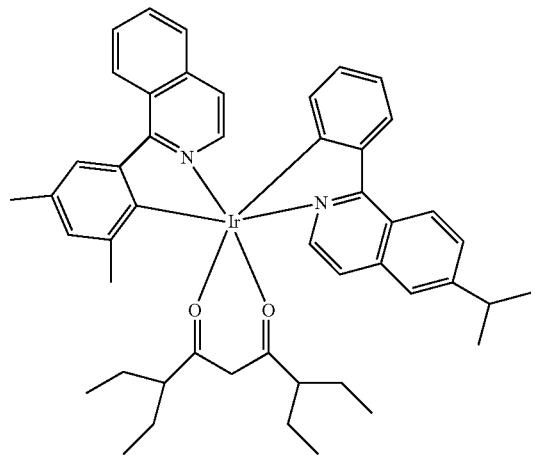

M-a3

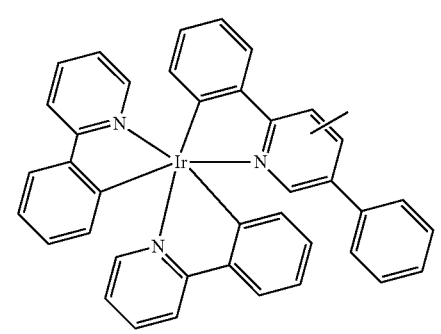

M-a4

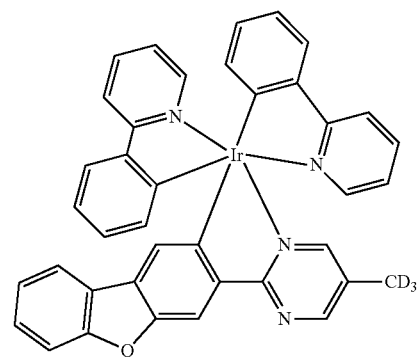

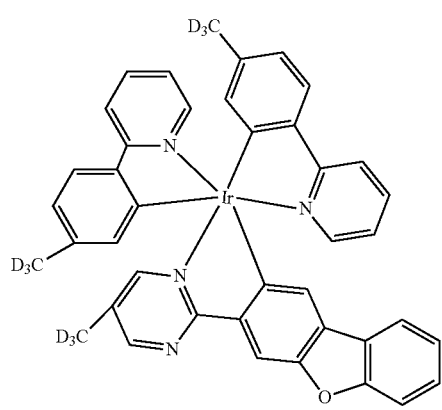
M-a5
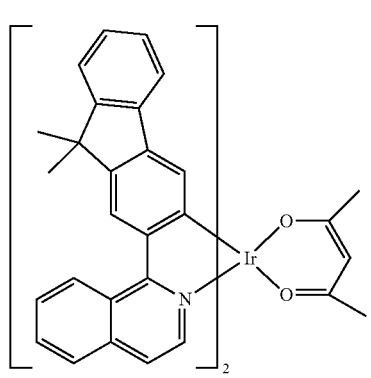
M-a10
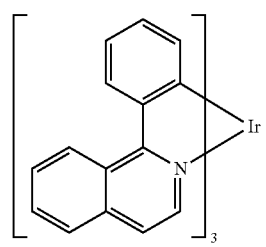
M-a6
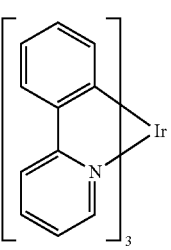
M-a11
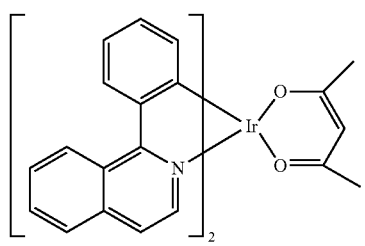
M-a7
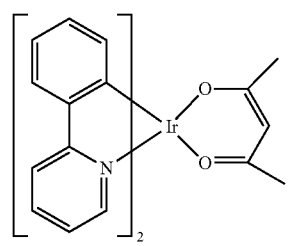
M-a12
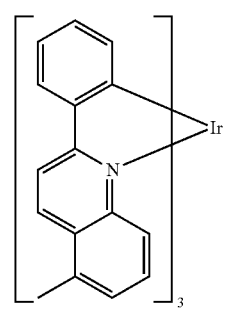
M-a8
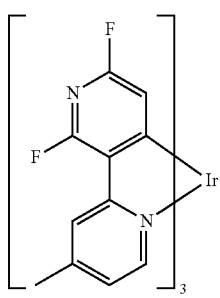
M-a13
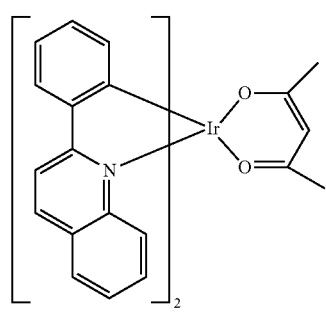
M-a9
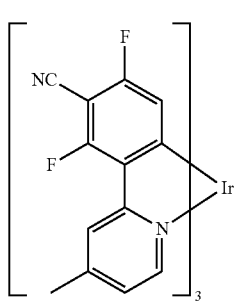
Ma-14

M-a15

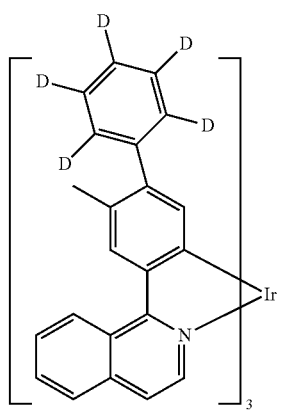

Ma-16

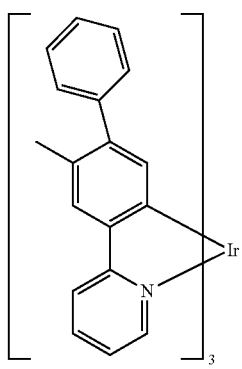

Ma-17

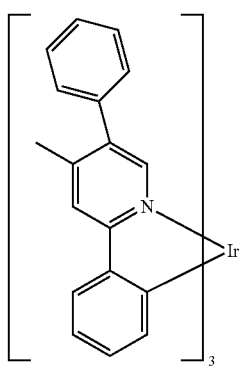

M-a18

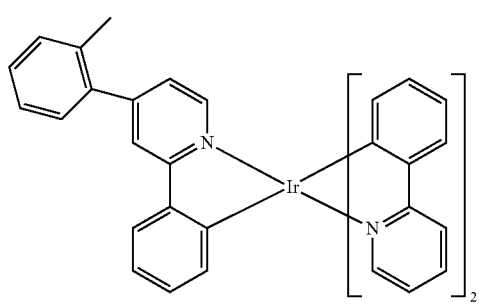

M-a19

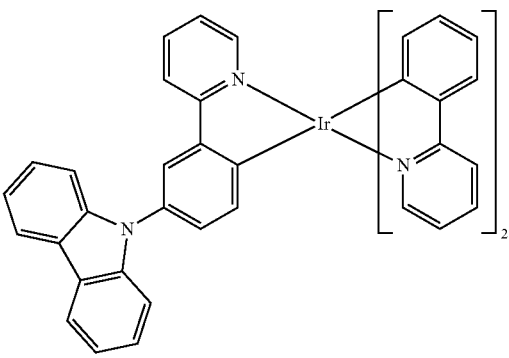

Compound M-a1 and Compound M-a2 may be used as a red dopant material, and Compound M-a3 to Compound M-a5 may be used as a green dopant material.

[Formula M-b]

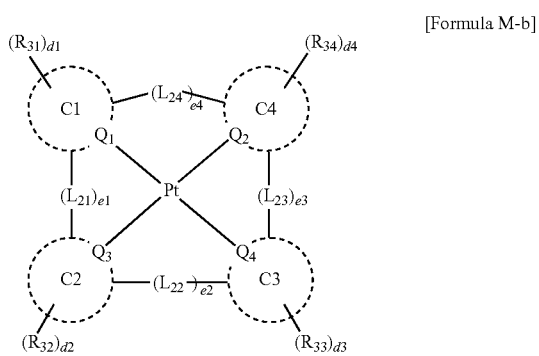

In Formula M-b, $Q_1$ to $Q_4$ may each independently be C or N, and C1 to C4 may each independently be a substituted or unsubstituted hydrocarbon ring having 5 to 30 ring-forming carbon atoms, or a substituted or unsubstituted heterocycle having 2 to 30 ring-forming carbon atoms. $L_{21}$ to $L_{24}$ may each independently be a direct linkage,

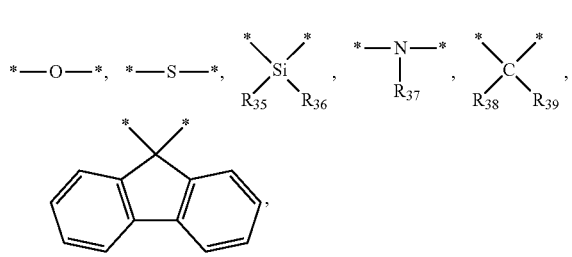

a substituted or unsubstituted divalent alkyl group having 1 to 20 carbon atoms, a substituted or unsubstituted arylene group having 6 to 30 ring-forming carbon atoms, or a substituted or unsubstituted heteroarylene group having 2 to 30 ring-forming carbon atoms, and e1 to e4 may each independently be 0 or 1. $R_{31}$ to $R_{39}$ may each independently be a hydrogen atom, a deuterium atom, a halogen atom, a cyano group, a substituted or unsubstituted amine group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, or may be bonded to an adjacent group to form a ring, and d1 to d4 may each independently be an integer from 0 to 4.

The compound represented by Formula M-b may be used as a blue phosphorescence dopant or a green phosphorescence dopant.

The compound represented by Formula M-b may be selected from any one among the compounds below. However, the compounds below are examples, and the compound represented by Formula M-b is not limited to those represented by the compounds below.

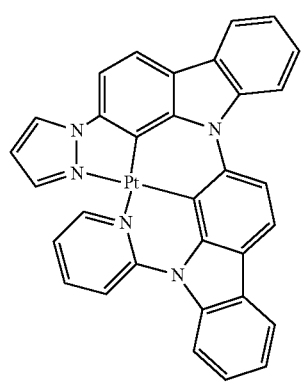

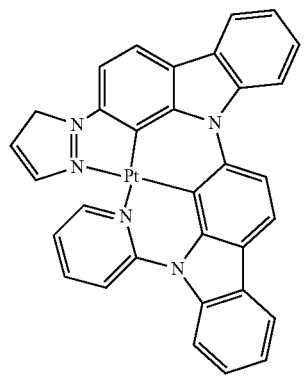

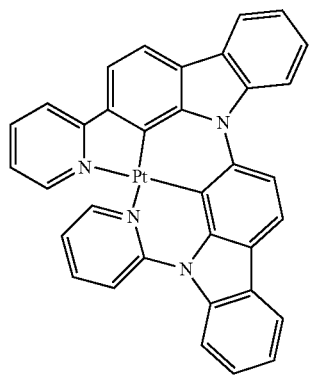

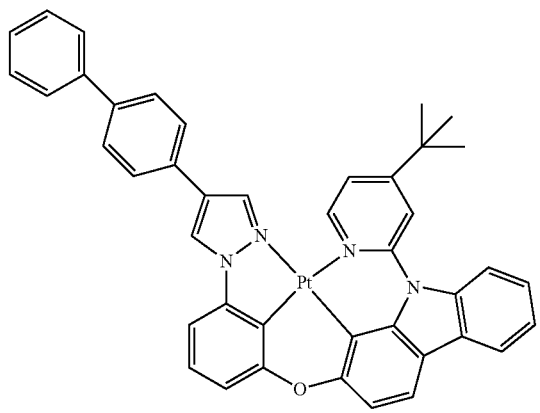

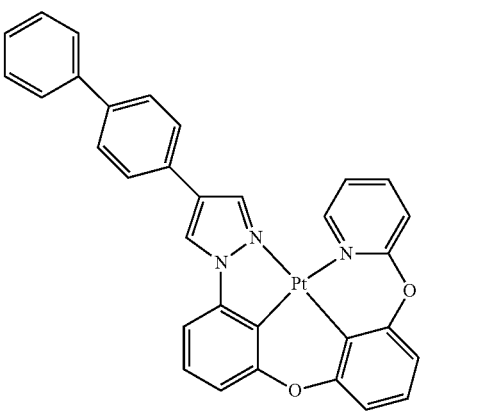

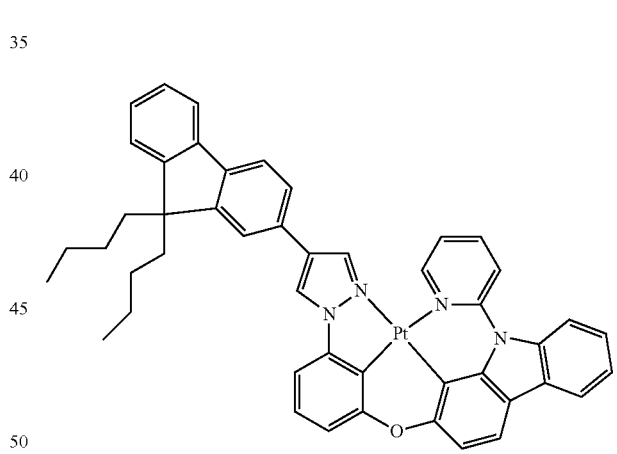

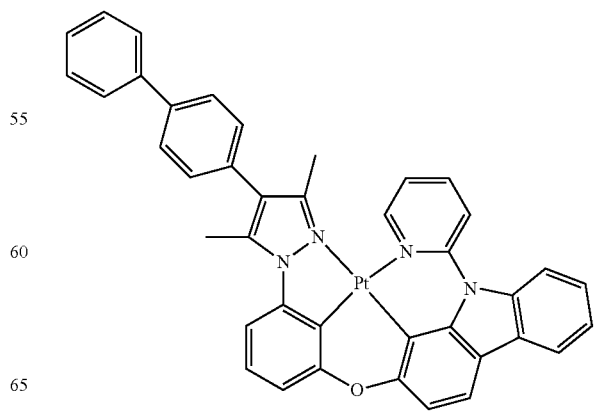

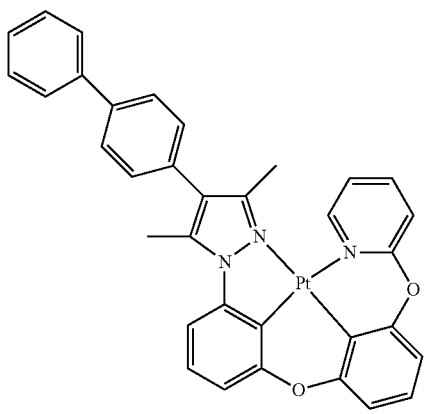

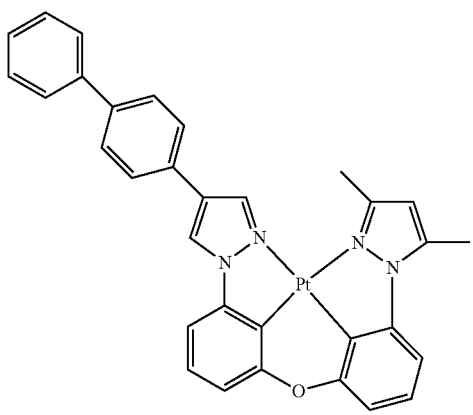

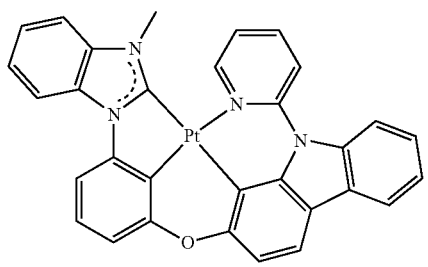

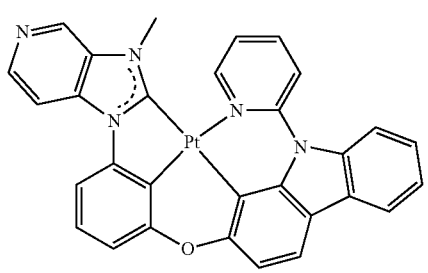

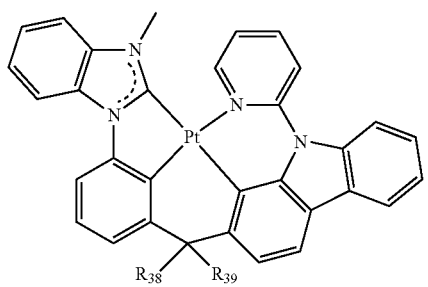

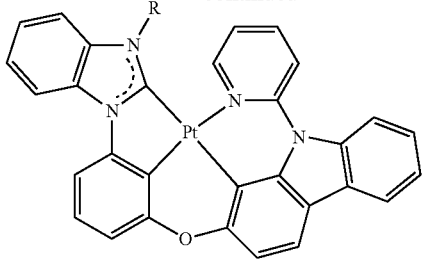

In the compounds above, R, $R_{38}$, and $R_{39}$ may each independently be a hydrogen atom, a deuterium atom, a halogen atom, a cyano group, a substituted or unsubstituted amine group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms.

The emission layer EML may further include a compound represented by any one among Formula F-a to Formula F-c below in addition to the polycyclic compound of an embodiment. The compound represented by any one of Formula F-a to Formula F-c below may be used as a fluorescence dopant material.

[Formula F-a]

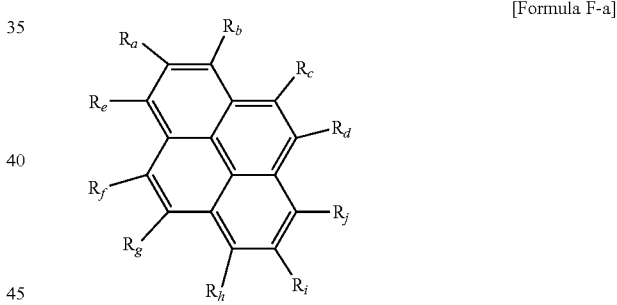

In Formula F-a, two selected from among $R_a$ to $R_j$ may each independently be substituted with *—$NAr_1,Ar_2$. The remainder of $R_a$ to $R_j$ which are not substituted with *—$NAr_1,Ar_2$ may each independently be a hydrogen atom, a deuterium atom, a halogen atom, a cyano group, a substituted or unsubstituted amine group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms. In the group *—$NAr_1,Ar_2$, $Ar_1$ and $Ar_2$ may each independently be a substituted or unsubstituted aryl group having 6 to 30 ring-forming carbon atoms, or a substituted or unsubstituted heteroaryl group having 2 to 30 ring-forming carbon atoms. For example, at least one of $Ar_1$, and $Ar_2$ may be a heteroaryl group containing O or S as a ring-forming atom.

[Formula F-b]

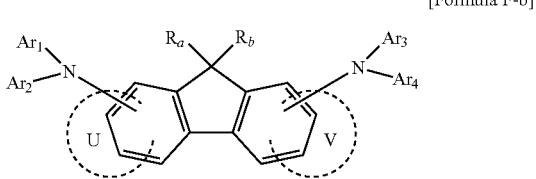

In Formula F-b, $R_a$ and $R_b$ may each independently be a hydrogen atom, a deuterium atom, a substituted or unsubstituted alkyl group having 1 to 20 carbon atoms, a substituted or unsubstituted alkenyl group having 2 to 20 carbon atoms, a substituted or unsubstituted aryl group having 6 to 30 ring-forming carbon atoms, or a substituted or unsubstituted heteroaryl group having 2 to 30 ring-forming carbon atoms, or may be bonded to an adjacent group to form a ring.

In Formula F-b, U and V may each independently a substituted or unsubstituted hydrocarbon ring having 5 to 30 ring-forming carbon atoms, or a substituted or unsubstituted heterocycle having 2 to 30 ring-forming carbon atoms.

In Formula F-b, the number of rings represented by U and V may each independently be 0 or 1. For example, in Formula F-b, when the number of U or V is 1, one ring may form a condensed ring at a part described as U or V, and when the number of U or V is 0, a ring described as U or V may not be present. When the number of U is 0 and the number of V is 1, or when the number of U is 1 and the number of V is 0, the condensed ring having a fluorene core of Formula F-b may be a four-ring cyclic compound. When the number of U and V is each 0, the condensed ring of Formula F-b may be a three-ring cyclic compound. When the number of U and V is each 1, the condensed ring having a fluorene core of Formula F-b may be a five-ring cyclic compound.

[Formula F-c]

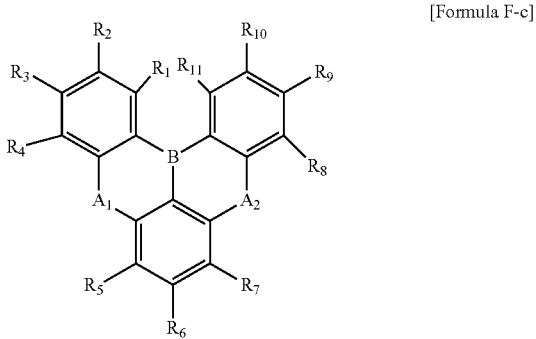

In Formula F-c, $A_1$ and $A_2$ may each independently be O, S, Se, or $N(R_m)$, and $R_m$ may be a hydrogen atom, a deuterium atom, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms. $R_1$ to $R_{11}$ may each independently be a hydrogen atom, a deuterium atom, a halogen atom, a cyano group, a substituted or unsubstituted amine group, a substituted or unsubstituted boryl group, a substituted or unsubstituted oxy group, a substituted or unsubstituted thio group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, or may be bonded to an adjacent group to form a ring.

In Formula F-c, $A_1$ and $A_2$ may each independently be bonded to substituents of an adjacent ring to form a condensed ring. For example, when $A_1$ and $A_2$ are each independently $N(R_m)$, $A_1$ may be bonded to $R_4$ or $R_5$ to form a ring. In Formula F-c, $A_2$ may be bonded to $R_7$ or $R_8$ to form a ring.

In an embodiment, the emission layer EML may further include, as a dopant material in addition to the polycyclic compound of an embodiment, styryl derivatives (e.g., 1,4-bis[2-(3-N-ethylcarbazoryl)vinyl]benzene (BCzVB), 4-(di-p-tolylamino)-4'-[(di-p-tolylamino)styryl]stilbene (DPAVB), and N-(4-((E)-2-(6-((E)-4-(diphenylamino)styryl)naphthalen-2-yl)vinyl)phenyl)-N-phenylbenzenamine (N-BDAVBi), 4,4'-bis[2-(4-(N,N-diphenylamino)phenyl)vinyl]biphenyl(DPAVBi), perylene and the derivatives thereof (e.g., 2,5,8,11-tetra-t-butylperylene (TBP)), pyrene and the derivatives thereof (e.g., 1,1-dipyrene, 1,4-dipyrenylbenzene, 1,4-bis(N,N-diphenylamino)pyrene), etc.

The emission layer EML may further include a phosphorescence dopant material in addition to the polycyclic compound of an embodiment. For example, a metal complex including iridium (Ir), platinum (Pt), osmium (Os), aurum (Au), titanium (Ti), zirconium (Zr), hafnium (Hf), europium (Eu), terbium (Tb), or thulium (Tm) may be used as a phosphorescence dopant. For example, iridium(III) bis(4,6-difluorophenylpyridinato-N,C2') (FIrpic), bis(2,4-difluorophenylpyridinato)-tetrakis(1-pyrazolyl)borate iridium(III) (Fir6), or platinum octaethyl porphyrin (PtOEP) may be used as a phosphorescence dopant. However, embodiments are not limited thereto.

The emission layer EML may include a quantum dot material. The core of the quantum dot may be selected from among a Group II-VI compound, a Group III-VI compound, a Group I-III-VI compound, a Group III-V compound, a Group IV-VI compound, a Group IV element, a Group IV compound, and a combination thereof.

A Group II-VI compound may be selected from the group consisting of a binary compound selected from the group consisting of CdSe, CdTe, CdS, ZnS, ZnSe, ZnTe, ZnO, HgS, HgSe, HgTe, MgSe, MgS, and a mixture thereof, a ternary compound selected from the group consisting of CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and a mixture thereof, and a quaternary compound selected from the group consisting of HgZnTeS, CdZnSeS, CdZnSeTe, CdZnSTe, CdHgSeS, CdHgSeTe, CdHgSTe, HgZnSeS, HgZnSeTe, HgZnSTe, and a mixture thereof.

The Group III-VI compound may include a binary compound such as $In_2S_3$ and $In_2Se_3$, a ternary compound such as $InGaS_3$ and $InGaSe_3$, or any combination thereof.

A Group I-III-VI compound may be selected from a ternary compound selected from the group consisting of AgInS, $AgInS_2$, CuInS, $CuInS_2$, $AgGaS_2$, $CuGaS_2$ $CuGaO_2$, $AgGaO_2$, $AgAlO_2$, and a mixture thereof, or a quaternary compound such as $AgInGaS_2$ and $CuInGaS_2$.

The Group III-V compound may be selected from the group consisting of a binary compound selected from the group consisting of GaN, GaP, GaAs, GaSb, AlN, AlP, AlAs, AlSb, InN, InP, InAs, InSb, and a mixture thereof, a ternary compound selected from the group consisting of GaNP, GaNAs, GaNSb, GaPAs, GaPSb, AlNP, AlNAs, AlNSb, AlPAs, AlPSb, InGaP, InAlP, InNP, InNAs, InNSb, InPAs, InPSb, and a mixture thereof, and a quaternary compound selected from the group consisting of GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and a mixture thereof. The Group III-V compound may further include a Group II metal. For example, InZnP, etc. may be selected as a Group III-II-V compound.

The Group IV-VI compound may be selected from the group consisting of a binary compound selected from the group consisting of SnS, SnSe, SnTe, PbS, PbSe, PbTe, and a mixture thereof, a ternary compound selected from the group consisting of SnSeS, SnSeTe, SnSTe, PbSeS, PbSeTe, PbSTe, SnPbS, SnPbSe, SnPbTe, and a mixture thereof, and a quaternary compound selected from the group consisting of SnPbSSe, SnPbSeTe, SnPbSTe, and a mixture thereof. The Group IV element may be selected from the group consisting of Si, Ge, and a mixture thereof. The Group IV compound may be a binary compound selected from the group consisting of SiC, SiGe, and a mixture thereof.

For example, a binary compound, a ternary compound, or a quaternary compound may be present in particles at a uniform concentration distribution, or may be present in the same particle in a partially different concentration distribution. A quantum dot may have a core/shell structure in which a quantum dot surrounds another quantum dot. In a core/shell structure, an interface between the core and the shell may have a concentration gradient in which the concentration of an element present in the shell becomes lower towards the core.

In an embodiment, a quantum dot may have the above-described core-shell structure including a core containing a nanocrystal and a shell surrounding the core. The shell of the quantum dot may serve as a protection layer to prevent the chemical deformation of the core so as to maintain semiconductor properties, and/or as a charging layer to impart electrophoresis properties to the quantum dot. The shell may be a single layer or a multilayer. An example of the shell of the quantum dot may include a metal or non-metal oxide, a semiconductor compound, or a combination thereof.

For example, the metal or non-metal oxide may be a binary compound such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, and NiO, or a ternary compound such as $MgAl_2O_4$, $CoFe_2O_4$, $NiFe_2O_4$, and $CoMn_2O_4$, but embodiments are not limited thereto.

The semiconductor compound may be, for example, CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, etc., but embodiments are not limited thereto.

The quantum dot may have a full width of half maximum (FWHM) of a light emission wavelength spectrum equal to or less than about 45 nm. For example, the quantum dot may have a FWHM of a light emission wavelength spectrum equal to or less than about 40 nm. For example, the quantum dot may have a FWHM of a light emission wavelength spectrum equal to or less than about 30 nm. Color purity and/or color reproducibility may be improved in the above ranges. Light emitted through the quantum dot may be emitted in all directions, and thus a wide viewing angle may be improved.

The form of the quantum dot may be selected from among forms used in the art, without specific limitation. For example, the quantum dot may have a spherical, a pyramidal, a multi-arm, or a cubic shape, or the quantum dot may be in the form of nanoparticles, nanotubes, nanowires, nanofibers, nanoplate particles, etc.

The quantum dot may control the color of emitted light according to the particle size thereof. Accordingly, the quantum dot may have various light emission colors such as blue, red, and green.

In each light emitting device ED of embodiments illustrated in FIGS. 3 to 6, the electron transport region ETR is provided on the emission layer EML. The electron transport region ETR may include at least one of a hole blocking layer HBL, an electron transport layer ETL, and an electron injection layer EIL, but embodiments are not limited thereto.

The electron transport region ETR may have a single layer formed of a single material, a single layer formed of different materials, or a multilayer structure including layers formed of different materials.

For example, the electron transport region ETR may have a single layer structure of the electron injection layer EIL or the electron transport layer ETL, and may have a single layer structure formed of an electron injection material and an electron transport material. The electron transport region ETR may have a single layer structure formed of different materials, or may have a structure in which an electron transport layer ETL/electron injection layer EIL and a hole blocking layer HBL/electron transport layer ETL/electron injection layer EIL are stacked in order from the emission layer EML, but embodiments are not limited thereto. The electron transport region ETR may have a thickness, for example, in a range of about 1,000 Å to about 1,500 Å.

The electron transport region ETR may be formed by using various methods such as a vacuum deposition method, a spin coating method, a cast method, a Langmuir-Blodgett (LB) method, an inkjet printing method, a laser printing method, a laser induced thermal imaging (LITI) method, etc.

The electron transport region ETR may include a compound represented by Formula ET-1 below:

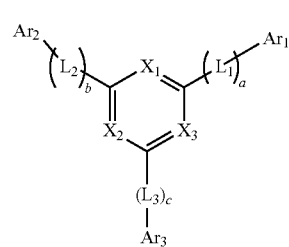

[Formula ET-1]

In Formula ET-1, at least one among $X_1$ to $X_3$ may be N, and the remainder of $X_1$ to $X_3$ may be $C(R_a)$. $R_a$ may be a hydrogen atom, a deuterium atom, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms. In Formula ET-1, $Ar_1$ to $Ar_3$ may each independently be a hydrogen atom, a deuterium atom, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms.

In Formula ET-1, a to c may each independently be an integer from 0 to 10. In Formula ET-1, $L_1$ to $L_3$ may each independently be a direct linkage, a substituted or unsubstituted arylene group having 6 to 30 ring-forming carbon atoms, or a substituted or unsubstituted heteroarylene group having 2 to 30 ring-forming carbon atoms. In Formula ET-1, when a to c are 2 or greater, $L_1$ to $L_3$ may each independently be a substituted or unsubstituted arylene group having 6 to 30 ring-forming carbon atoms, or a substituted or unsubstituted heteroarylene group having 2 to 30 ring-forming carbon atoms.

The electron transport region ETR may include an anthracene-based compound. However, embodiments are not limited thereto, and the electron transport region ETR may include, for example, tris(8-hydroxyquinolinato)aluminum ($Alq_3$), 1,3,5-tri[(3-pyridyl)-phen-3-yl]benzene, 2,4,6-tris(3'-(pyridin-3-yl)biphenyl-3-yl)-1,3,5-triazine, 2-(4-(N-phenylbenzoimidazol-1-yl)phenyl)-9,10-dinaphthylanthracene, 1,3,5-tri(1-phenyl-1H-benzo[d]imidazol-2-yl)benzene (TPBi), 2,9-dimethyl-4,7-diphenyl-1,10-phenanthroline (BCP), 4,7-diphenyl-1,10-phenanthroline (Bphen), 3-(4-biphenylyl)-4-phenyl-5-tert-butylphenyl-1,2,4-triazole (TAZ), 4-(naphthalen-1-yl)-3,5-diphenyl-4H-1,2,4-triazole (NTAZ), 2-(4-biphenylyl)-5-(4-tert-butylphenyl)-1,3,4-oxadiazole (tBu-PBD), bis(2-methyl-8-quinolinolato-N1,O8)-(1,1'-biphenyl-4-olato)aluminum (BAlq), berylliumbis(benzoquinolin-10-olate ($Bebg_2$), 9,10-di(naphthalene-2-yl)anthracene (ADN), 1,3-Bis[3,5-di(pyridin-3-yl)phenyl]benzene (BmPyPhB), or a mixture thereof.

The electron transport regions ETR may include a metal halide such as LiF, NaCl, CsF, RbCl, RbI, CuI, or KI, a lanthanide metal such as Yb, and a vacuum-deposited material of the metal halide and the lanthanide metal. For example, the electron transport region ETR may include KI:Yb, RbI:Yb, etc. as a vacuum-deposited material. The electron transport region ETR may be formed using a metal oxide such as $Li_2O$ or BaO, or 8-hydroxyl-lithium quinolate (Liq), etc., but embodiments are not limited thereto. The electron transport region ETR may also be formed of a mixture material of an electron transport material and an insulating organometallic salt. The organometallic salt may be a material having an energy band gap equal to or greater than about 4 eV. For example, the organometallic salt may include metal acetates, metal benzoates, metal acetoacetates, metal acetylacetonates, or metal stearates.

The electron transport region ETR may further include at least one of 2,9-dimethyl-4,7-diphenyl-1,10-phenanthroline (BCP), or 4,7-diphenyl-1,10-phenanthroline (Bphen) in addition to the above-described materials, but embodiments are not limited thereto.

The electron transport region ETR may include the above-described compounds of the hole transport region in at least one of the electron injection layer EIL, the electron transport layer ETL, and the hole blocking layer HBL.

When the electron transport region ETR includes an electron transport layer ETL, the electron transport layer ETL may have a thickness in a range of about 100 Å to about 1,000 Å. For example, a thickness of the electron transport layer ETL may be in a range of about 150 Å to about 500 Å. If the thickness of the electron transport layer ETL satisfies the aforementioned range, satisfactory electron transport characteristics may be obtained without a substantial increase in driving voltage. When the electron transport region ETR includes an electron injection layer EIL, the electron injection layer EIL may have a thickness in a range of about 1 Å to about 100 Å. For example, a thickness of the electron injection layer EIL may be in a range about 3 Å to about 90 Å. If the thickness of the electron injection layer EIL satisfies the above-described range, satisfactory electron injection characteristics may be obtained without a substantial increase in driving voltage.

The second electrode EL2 is provided on the electron transport region ETR. The second electrode EL2 may be a common electrode. The second electrode EL2 may be a cathode or an anode, but embodiments are not limited thereto. For example, when the first electrode EL1 is an anode, the second electrode EL2 may be a cathode, and when the first electrode EL1 is a cathode, the second electrode EL2 may be an anode.

The second electrode EL2 may be a transmissive electrode, a transflective electrode, or a reflective electrode. When the second electrode EL2 is a transmissive electrode, the second electrode EL2 may be formed of a transparent metal oxide, for example, indium tin oxide (ITO), indium zinc oxide (IZO), zinc oxide (ZnO), indium tin zinc oxide (ITZO), etc.

When the second electrode EL2 is a transflective electrode or a reflective electrode, the second electrode EL2 may include Ag, Mg, Cu, Al, Pt, Pd, Au, Ni, Nd, Ir, Cr, Li, Ca, LiF/Ca, LiF/Al, Mo, Ti, Yb, W, a compound thereof, or a mixture thereof (e.g., AgMg, AgYb, or MgAg). In another embodiment, the second electrode EL2 may have a multi-layer structure including a reflective film or a transflective film formed of the above-described materials, and a transparent conductive film formed of ITO, IZO, ZnO, ITZO, etc. For example, the second electrode EL2 may include the above-described metal materials, combinations of at least two metal materials of the above-described metal materials, oxides of the above-described metal materials, or the like.

Although not shown, the second electrode EL2 may be electrically connected to an auxiliary electrode. If the second electrode EL2 is electrically connected to the auxiliary electrode, the resistance of the second electrode EL2 may decrease.

In an embodiment, the light emitting device ED may further include a capping layer CPL disposed on the second electrode EL2. The capping layer CPL may include a multilayer or a single layer.

In an embodiment, the capping layer CPL may include an organic layer or an inorganic layer. For example, when the capping layer CPL includes an inorganic material, the inorganic material may include an alkaline metal compound such as LiF, an alkaline earth metal compound such as $MgF_2$, SiON, $SiN_x$, SiOy, etc.

For example, when the capping layer CPL includes an organic material, the organic material may include α-NPD, NPB, TPD, m-MTDATA, $Alq_3$, CuPc, N4,N4,N4',N4'-tetra(biphenyl-4-yl)biphenyl-4,4'-diamine (TPD15), 4,4',4"-tris(carbazol sol-9-yl)triphenylamine (TCTA), etc., or an epoxy resin, or an acrylate such as methacrylate. However, embodiments are not limited thereto, and the capping layer CPL may include at least one among Compounds P1 to P5 below:

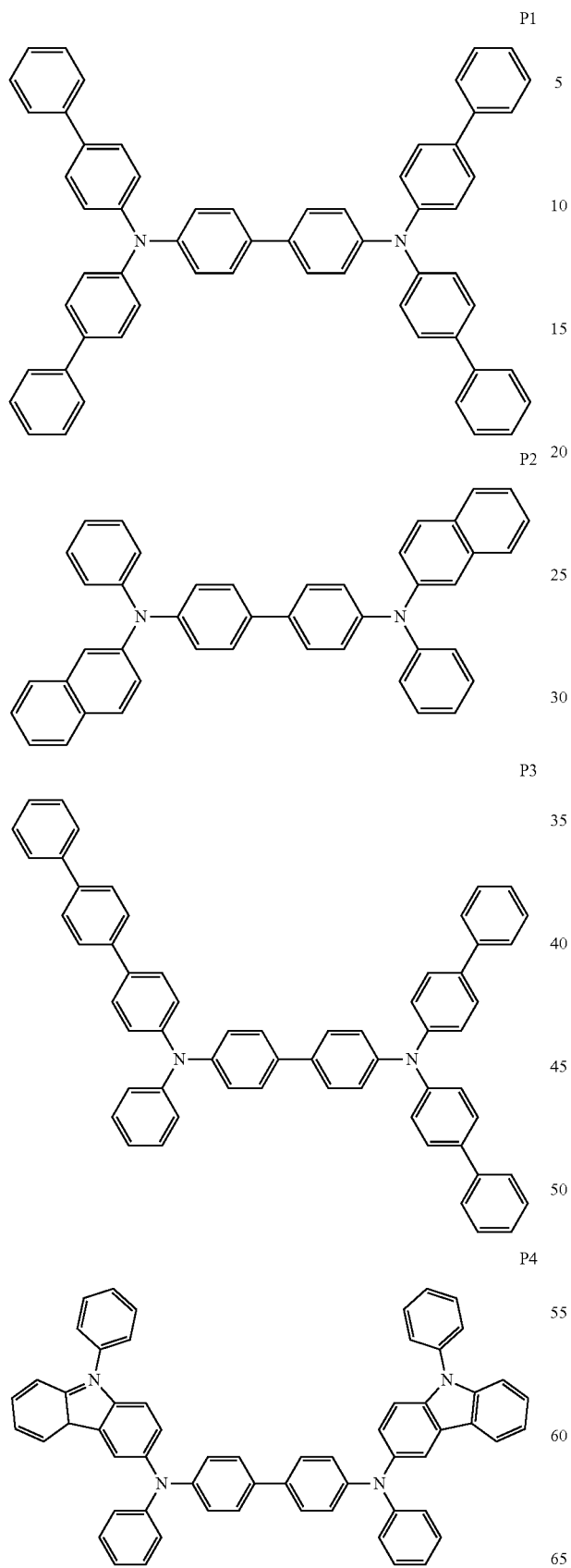

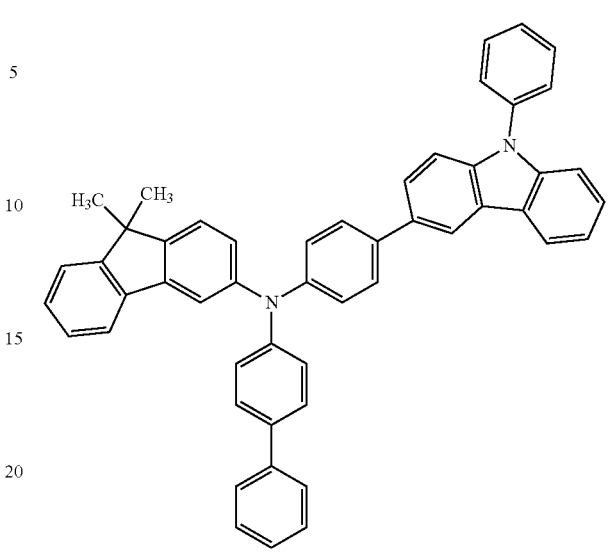

A refractive index of the capping layer CPL may be equal to or greater than about 1.6. For example, a refractive index of the capping layer CPL may be equal to or greater than about 1.6 with respect to light in a wavelength range of about 550 nm to about 660 nm.

Figure 7:
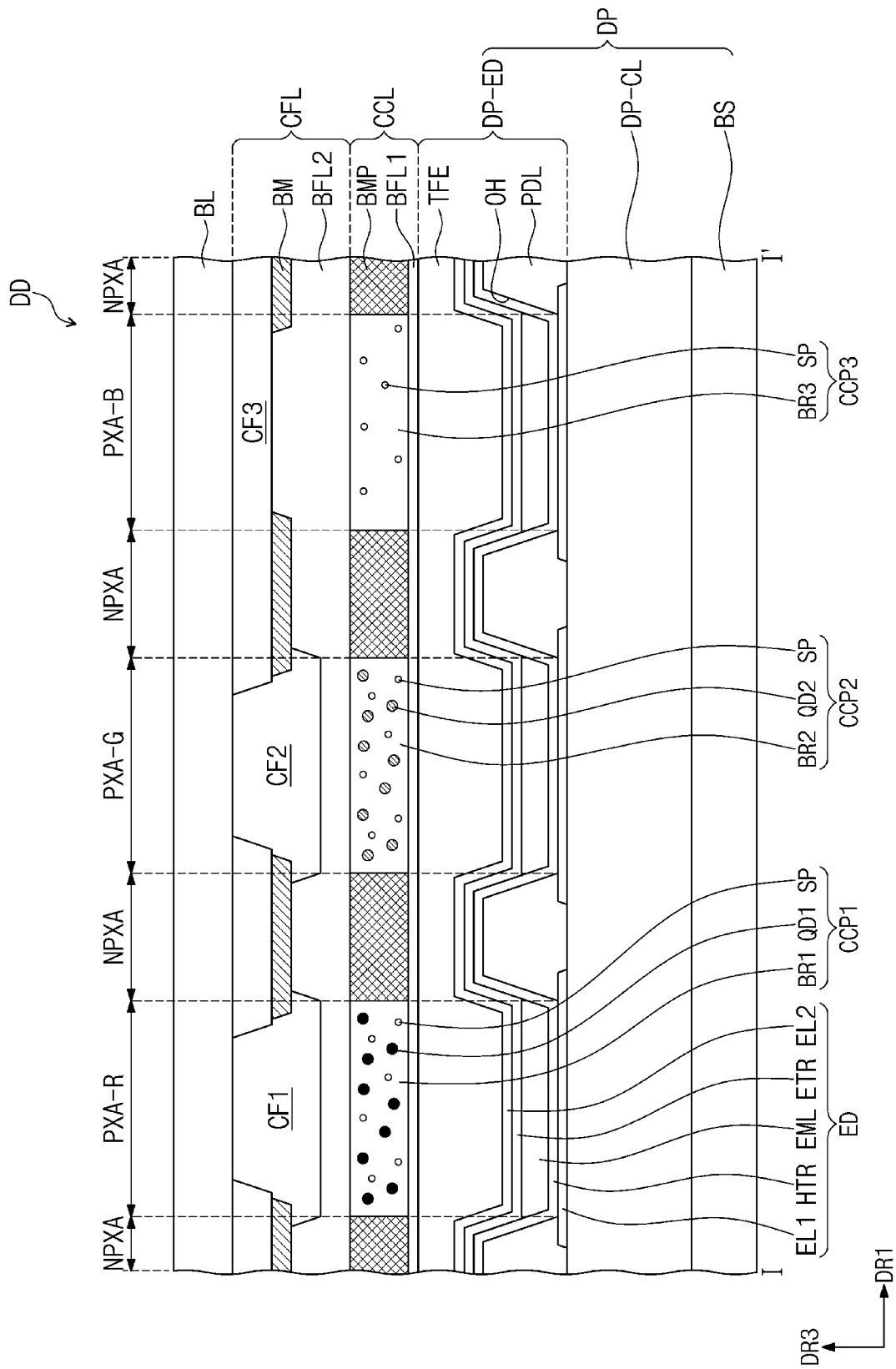
FIG. 7 is a schematic cross-sectional view of a display apparatus according to an embodiment.
Figure 8:
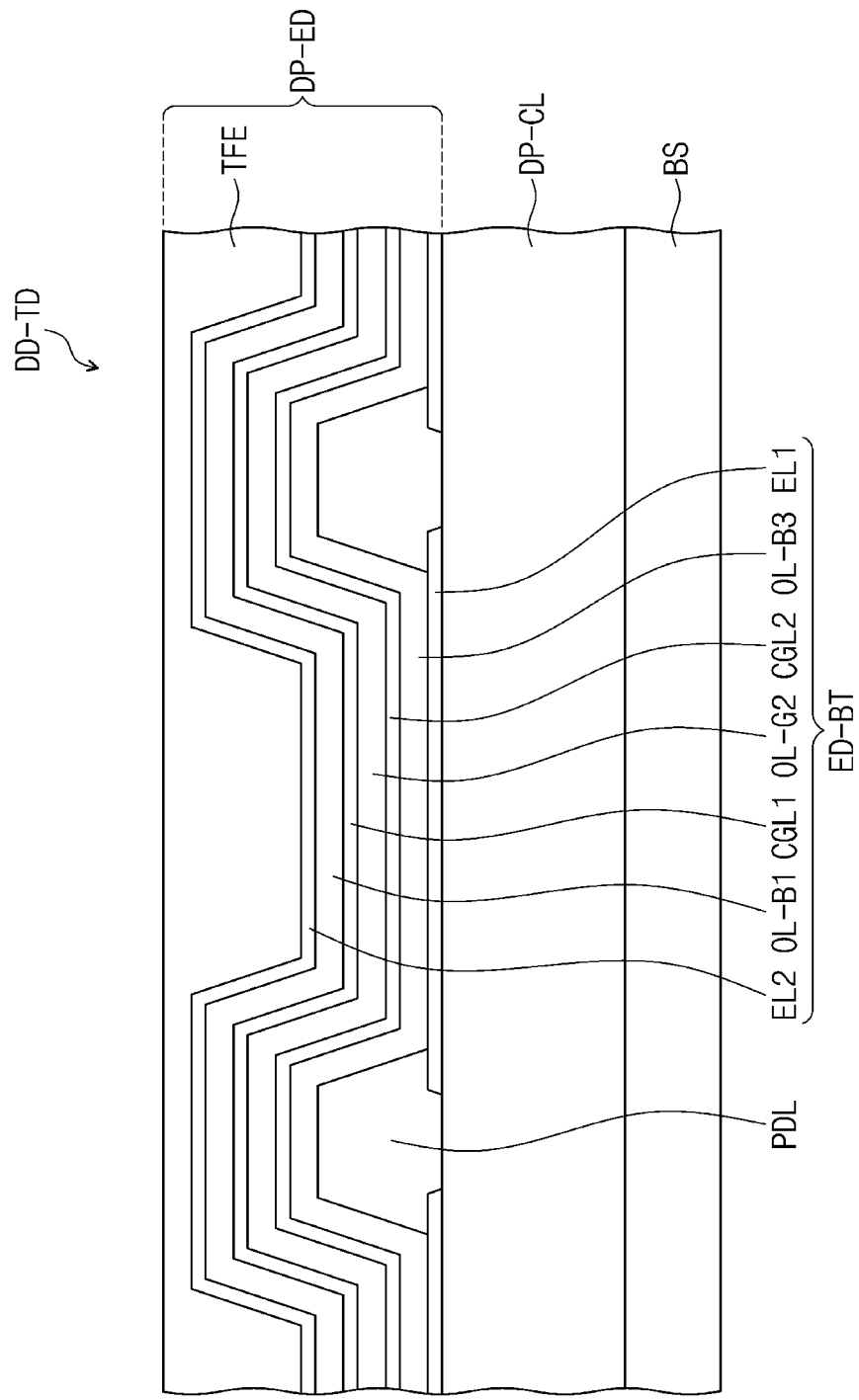
FIG. 8 is a schematic cross-sectional view of a display apparatus according to an embodiment.

FIGS. 7 and 8 each are a schematic cross-sectional view of a display apparatus according to an embodiment. Hereinafter, in describing the display apparatus of an embodiment with reference to FIGS. 7 and 8, the duplicated features which have been described in FIGS. 1 to 6 are not described again, but their differences will be described.

Referring to FIG. 7, the display apparatus DD according to an embodiment may include a display panel DP including a display device layer DP-ED, a light control layer CCL disposed on the display panel DP, and a color filter layer CFL.

In an embodiment illustrated in FIG. 7, the display panel DP may include a base layer BS, a circuit layer DP-CL provided on the base layer BS, and the display device layer DP-ED, and the display device layer DP-ED may include a light emitting device ED.

The light emitting device ED may include a first electrode EL1, a hole transport region HTR disposed on the first electrode EL1, an emission layer EML disposed on the hole transport region HTR, an electron transport region ETR disposed on the emission layer EML, and a second electrode EL2 disposed on the electron transport region ETR. The structures of the light emitting devices of FIGS. 3 to 6 as described above may be applied to the structure of the light emitting device ED shown in FIG. 7.

Referring to FIG. 7, the emission layer EML may be disposed in an opening OH defined in a pixel defining film PDL. For example, the emission layer EML which is divided by the pixel defining film PDL and provided corresponding to each light emitting regions PXA-R, PXA-G, and PXA-B may emit light in a same wavelength range. In the display apparatus DD of an embodiment, the emission layer EML may emit blue light. Although not shown in the drawing, in an embodiment, the emission layer EML may be provided as a common layer for all light emitting regions PXA-R, PXA-G, and PXA-B.

The light control layer CCL may be disposed on the display panel DP. The light control layer CCL may include a light conversion body. The light conversion body may include a quantum dot, a phosphor, or the like. The light conversion body may converting the wavelength of provided light and then transmit the converted light. For example, the light control layer CCL may be a layer containing the quantum dot or a layer containing the phosphor.

The light control layer CCL may include light control units CCP1, CCP2, and CCP3. The light control units CCP1, CCP2, and CCP3 may be spaced apart from one another.

Referring to FIG. 7, divided patterns BMP may be disposed between the light control units CCP1, CCP2, and CCP3 which are spaced apart from each other, but embodiments are not limited thereto. FIG. 7 illustrates that the divided patterns BMP do not overlap the light control units CCP1, CCP2, and CCP3, but at least a portion of the edges of the light control units CCP1, CCP2, and CCP3 may overlap the divided patterns BMP.

The light control layer CCL may include a first light control unit CCP1 containing a first quantum dot QD1 which converts first color light provided from the light emitting device ED into second color light, a second light control unit CCP2 containing a second quantum dot QD2 which converts the first color light into third color light, and a third light control unit CCP3 which transmits the first color light.

In an embodiment, the first light control unit CCP1 may provide red light that is the second color light, and the second light control unit CCP2 may provide green light that is the third color light. The third light control unit CCP3 may provide by transmitting blue light that is the first color light provided in the luminescence device ED. For example, the first quantum dot QD1 may be a red quantum dot, and the second quantum dot QD2 may be a green quantum dot. The same as described above may be applied with respect to the quantum dots QD1 and QD2.

The light control layer CCL may further include a scatterer SP. The first light control unit CCP1 may include the first quantum dot QD1 and the scatterer SP, the second light control unit CCP2 may include the second quantum dot QD2 and the scatterer SP, and the third light control unit CCP3 may not include any quantum dot but include the scatterer SP.

The scatterer SP may be inorganic particles. For example, the scatterer SP may include at least one of $TiO_2$, ZnO, $Al_2O_3$, $SiO_2$, and hollow silica. The scatterer SP may include any one of $TiO_2$, ZnO, $Al_2O_3$, $SiO_2$, and hollow silica, or may be a mixture of at least two materials selected from among $TiO_2$, ZnO, $Al_2O_3$, $SiO_2$, and hollow silica.

The first light control unit CCP1, the second light control unit CCP2, and the third light control unit CCP3 may respectively include base resins BR1, BR2, and BR3 in which the quantum dots QD1 and QD2 and the scatterer SP are dispersed. In an embodiment, the first light control unit CCP1 may include the first quantum dot QD1 and the scatterer SP dispersed in a first base resin BR1, the second light control unit CCP2 may include the second quantum dot QD2 and the scatterer SP dispersed in a second base resin BR2, and the third light control unit CCP3 may include the scatterer SP dispersed in a third base resin BR3. The base resins BR1, BR2, and BR3 are media in which the quantum dots QD1 and QD2 and the scatterer SP are dispersed, and may be formed of various resin compositions, which may be generally referred to as a binder. For example, the base resins BR1, BR2, and BR3 may be acrylic-based resins, urethane-based resins, silicone-based resins, epoxy-based resins, etc. The base resins BR1, BR2, and BR3 may be transparent resins. In an embodiment, the first base resin BR1, the second base resin BR2, and the third base resin BR3 each may be the same as or different from each other.

The light control layer CCL may include a barrier layer BFL1. The barrier layer BFL1 may prevent the penetration of moisture and/or oxygen (hereinafter, referred to as 'moisture/oxygen'). The barrier layer BFL1 may be disposed on the light control units CCP1, CCP2, and CCP3 to block the exposure of light control units CCP1, CCP2, and CCP3 to moisture/oxygen. The barrier layer BFL1 may cover the light control units CCP1, CCP2, and CCP3. The barrier layer BFL2 may be provided between the light control units CCP1, CCP2, and CCP3 and the color filter layer CFL.

The barrier layers BFL1 and BFL2 may include at least one inorganic layer. For example, the barrier layers BFL1 and BFL2 may include an inorganic material. For example, the barrier layers BFL1 and BFL2 may include a silicon nitride, an aluminum nitride, a zirconium nitride, a titanium nitride, a hafnium nitride, a tantalum nitride, a silicon oxide, an aluminum oxide, a titanium oxide, a tin oxide, a cerium oxide, a silicon oxynitride, a metal thin film which secures a transmittance, etc. The barrier layers BFL1 and BFL2 may further include an organic film. The barrier layers BFL1 and BFL2 may be formed of a single layer or of multiple layers.

In the display apparatus DD of an embodiment, the color filter layer CFL may be disposed on the light control layer CCL. For example, the color filter layer CFL may be directly disposed on the light control layer CCL. For example, the barrier layer BFL2 may be omitted.

The color filter layer CFL may include a light shielding unit BM and filters CF1, CF2, and CF3. The color filter layer CFL may include a first filter CF1 that transmits the second color light, a second filter CF2 that transmits the third color light, and a third filter CF3 that transmits the first color light. For example, the first filter CF1 may be a red filter, the second filter CF2 may be a green filter, and the third filter CF3 may be a blue filter. The filters CF1, CF2, and CF3 may each include a polymeric photosensitive resin and a pigment or dye. The first filter CF1 may include a red pigment or dye, the second filter CF2 may include a green pigment or dye, and the third filter CF3 may include a blue pigment or dye. However, embodiments are not limited thereto, and the third filter CF3 may not include a pigment or dye. The third filter CF3 may include a polymeric photosensitive resin and may not include a pigment or dye. The third filter CF3 may be transparent. The third filter CF3 may be formed of a transparent photosensitive resin.

In an embodiment, the first filter CF1 and the second filter CF2 may be a yellow filter. The first filter CF1 and the second filter CF2 may not be separated but be provided as one filter.

The light shielding unit BM may be a black matrix. The light shielding unit BM may include an organic light shielding material or an inorganic light shielding material containing a black pigment or dye. The light shielding unit BM may prevent light leakage, and may define boundaries between the adjacent filters CF1, CF2, and CF3. In an embodiment, the light shielding unit BM may be formed of a blue filter.

The first to third filters CF1, CF2, and CF3 may be disposed corresponding to the red light emitting region PXA-R, the green light emitting region PXA-G, and the blue light emitting region PXA-B, respectively.

A base substrate BL may be disposed on the color filter layer CFL. The base substrate BL may be a member which provides a base surface in which the color filter layer CFL, the light control layer CCL, and the like are disposed. The base substrate BL may include a glass substrate, a metal substrate, a plastic substrate, etc. However, embodiments are not limited thereto, and the base substrate BL may include an inorganic layer, an organic layer, or a composite material layer. Although not shown in the drawing, in an embodiment, the base substrate BL may be omitted.

FIG. 8 is a schematic cross-sectional view illustrating a part of a display apparatus according to an embodiment. FIG. 8 illustrates a schematic cross-sectional view of a part corresponding to the display panel DP of FIG. 7. In the display apparatus DD-TD of an embodiment, the light emitting device ED-BT may include light emitting structures OL-B1, OL-B2, and OL-B3. The light emitting device ED-BT may include a first electrode EL1 and a second electrode EL2 which face each other, and the light emitting structures OL-B1, OL-B2, and OL-B3 sequentially stacked in a thickness direction between the first electrode EL1 and the second electrode EL2. The light emitting structures OL-B1, OL-B2, and OL-B3 may each include an emission layer EML (FIG. 7), a hole transport region HTR, and an electron transport region ETR, with the emission layer EML (FIG. 7) disposed therebetween.

For example, the light emitting device ED-BT included in the display apparatus DD-TD of an embodiment may be a light emitting device having a tandem structure and including multiple emission layers.

In an embodiment illustrated in FIG. 8, each of the light emitting structures OL-B1, OL-G2, and OL-B3 may emit light in a different wavelength range. The light emitting device ED-BT including the light emitting structures OL-B1, OL-G2, and OL-B3, which emit light in wavelength ranges different from each other, may emit white light. However, this is merely an example, and embodiments are not limited thereto, and the light emitting structures OL-B1, OL-G2, and OL-B3 may all emit light in a same wavelength range, or some may emit light in the same wavelength range and the remainder of the light emitting structures OL-B1, OL-G2, and OL-B3 may emit light in a wavelength range different from others.

In an embodiment, at least one among the light emitting structures OL-B1, OL-G2, and OL-B3 may include a polycyclic compound represented by Formula 1 of an embodiment as described above. In an embodiment, the polycyclic compound may include a first polycyclic compound represented by Formula 2 or Formula 3 and a second polycyclic compound represented by Formula 4.

In an embodiment, the light emitting structures OL-B1, OL-G2, and OL-B3 may include a first light emitting structure OL-B1, a second light emitting structure OL-G2 disposed below the first light emitting structure OL-B1, and a third light emitting structure OL-B3 disposed below the second light emitting structure OL-G2. An embodiment may further include a charge generation layer disposed between adjacent ones of the light emitting structures OL-B1, OL-G2, and OL-B3. For example, an embodiment may include a first charge generation layer CGL1 disposed between the first light emitting structure OL-B1 and the second light emitting structure OL-G2 and a second charge generation layer CGL2 disposed between the second light emitting structure OL-G2 and the third light emitting structure OL-B3.

The first light emitting structure OL-B1 may include the first polycyclic compound, the second light emitting structure OL-G2 may include the second polycyclic compound, and the third light emitting structure OL-B3 may include the first polycyclic compound. However, this is merely an example, and embodiments are not limited thereto. For example, in an embodiment, the first light emitting structure OL-B1 may include the first polycyclic compound, the second light emitting structure OL-G2 may include the first polycyclic compound, and the third light emitting structure OL-B3 may include the second polycyclic compound. In another embodiment, the first light emitting structure OL-B1 may include the second polycyclic compound, the second light emitting structure OL-G2 may include the first polycyclic compound, and the third light emitting structure OL-B3 may include the first polycyclic compound.

Charge generation layers CGL1 and CGL2 may be disposed between the neighboring light emitting structures OL-B1, OL-B2, and OL-B3. Each of the charge generation layers CGL1 and CGL2 may include a p-type charge generation layer and/or an n-type charge generation layer.

Figure 9:
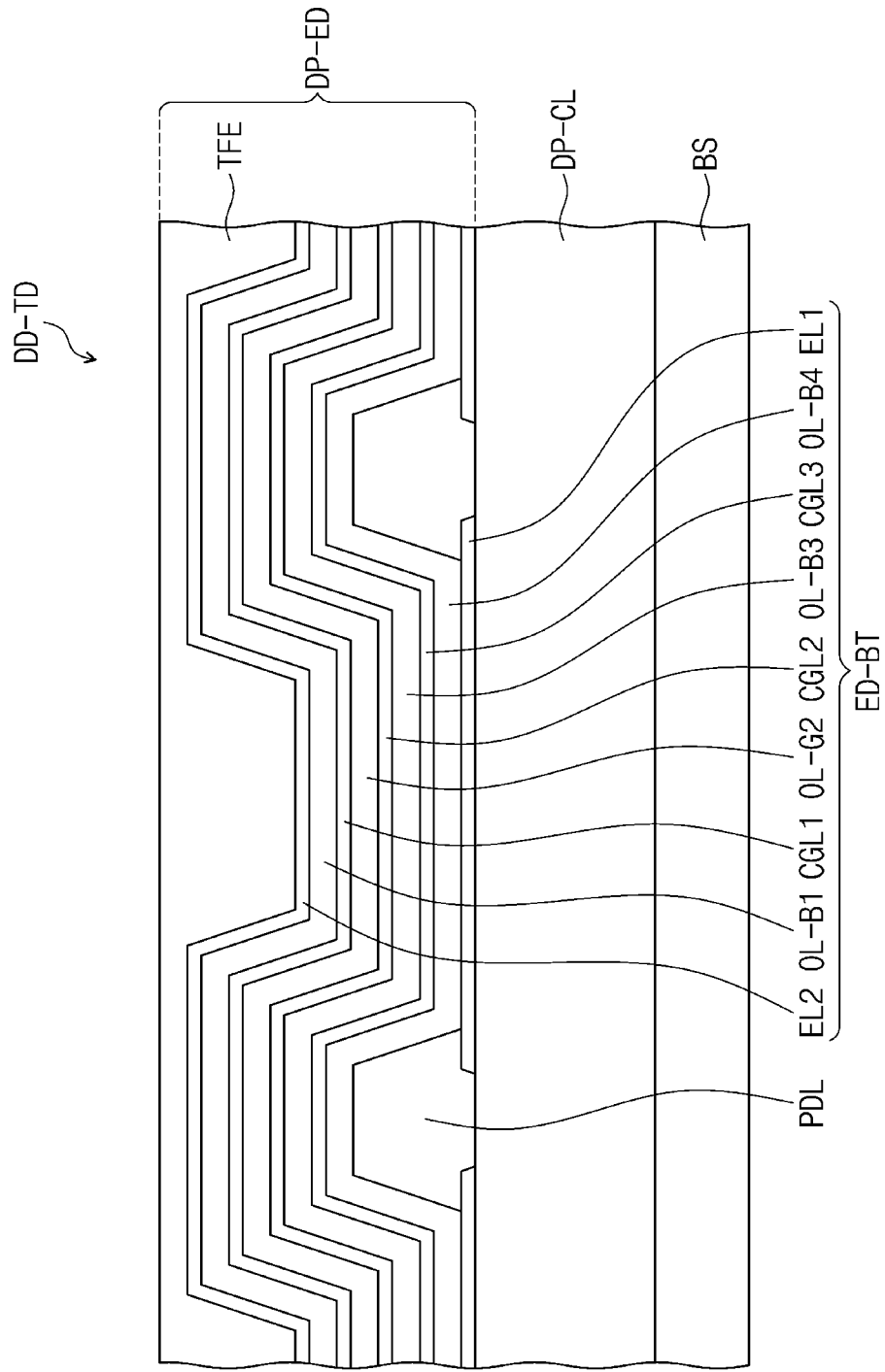
FIG. 9 is a schematic cross-sectional view of a display apparatus according to an embodiment.

FIG. 9 is a schematic cross-sectional view showing a part of a display device according to an embodiment; FIG. 9 illustrates a schematic cross-sectional view of a part corresponding to the display panel DP of FIG. 7. Hereinafter, in describing the display apparatus of an embodiment with reference to FIG. 9, the duplicated features which have been described in FIGS. 1 to 8 are not described again, but their differences will be described.

In contrast to the display apparatus illustrated in FIG. 8, FIG. 9 has a difference in that the display apparatus DD-TD of an embodiment further includes a fourth light emitting structure OL-B4 that is disposed below a third light emitting structure OL-B3.

Referring to FIG. 9, the light emitting structures OL-B1, OL-G2, OL-B3, and OL-B4 may include a first light emitting structure OL-B1, a second light emitting structure OL-G2 disposed below the first emitting structure OL-B1, a third light emitting structure OL-B3 disposed below the second emitting structure OL-G2, and a fourth light emitting structure OL-B 4 disposed below the third emitting structure OL-B3. An embodiment may further include a third charge generation layer CGL3 disposed between the third light emitting structure OL-B 3 and the fourth light emitting structure OL-B4.

In an embodiment, the fourth light emitting structure OL-B4 may include the first polycyclic compound. However, this is merely an example, and embodiments are not limited thereto. For example, in an embodiment, the fourth light emitting structure OL-B4 may include the second polycyclic compound.

Hereinafter, with reference to Examples and Comparative Examples, a polycyclic compound according to an embodiment and a light emitting device of an embodiment including the polycyclic compound of an embodiment will be described in detail. The Examples shown below are illustrated only for the understanding of the disclosure, and the scope thereof is not limited thereto.

EXAMPLES

1. Synthesis of Polycyclic Compound of Example

First, a synthesis method for a polycyclic compound according to an example will be described in detail by illustrating a synthesis method of Compounds BD1 to BD9 and GD1. In the following descriptions, a compound synthesis method is provided as an example, but synthesis methods for a compound according to an embodiment is not limited to Examples below.

1-1. Synthesis of Compound BD1

Compound BD1 according to an example may be synthesized by, for example, Reaction Scheme 1 below:

[Reaction Scheme 1]

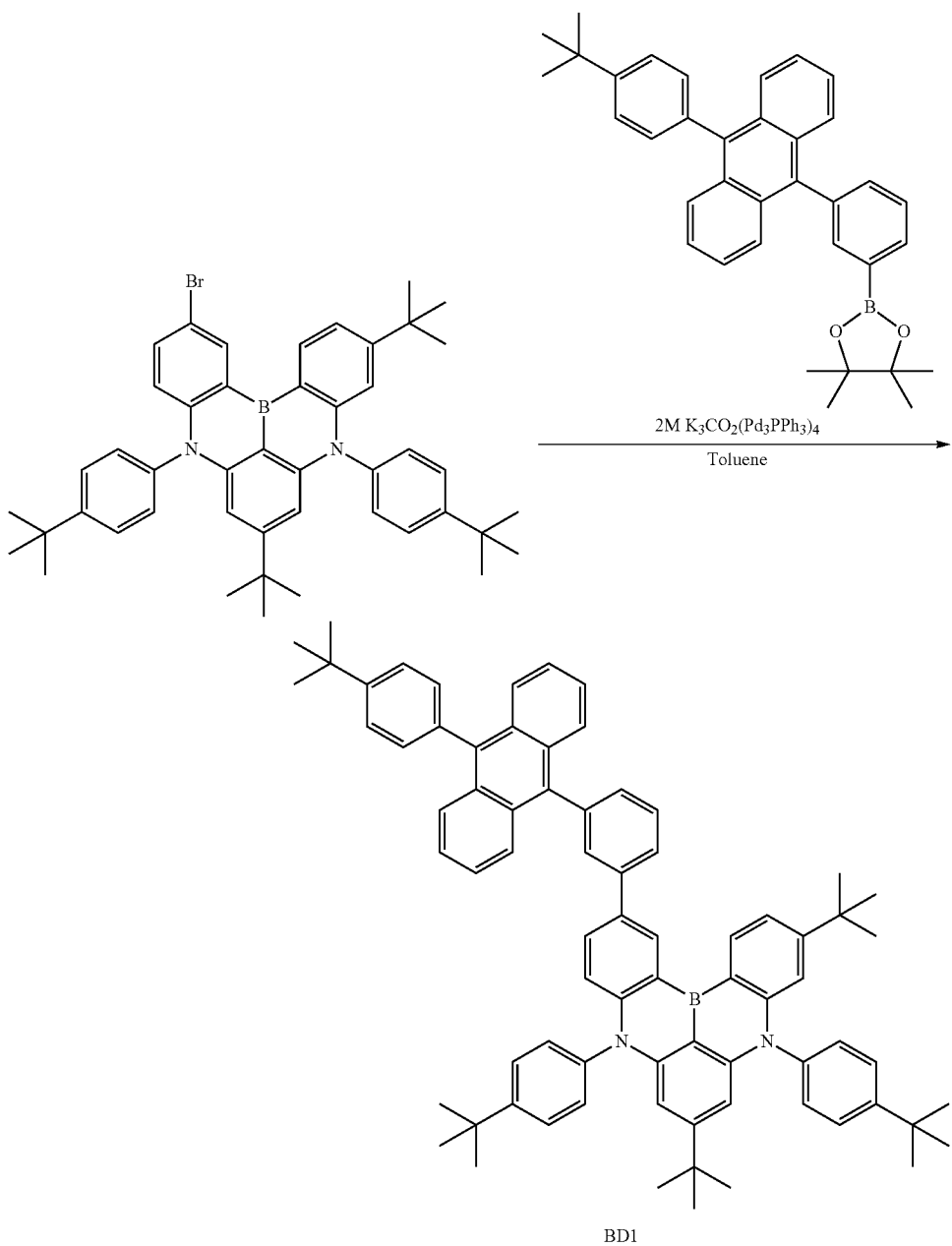

In a nitrogen atmosphere, in a 500 mL round bottom flask, 2-bromo-7,11-di-tert-butyl-5,9-bis(4-(tert-butyl)phenyl)-5,9-dihydro-5,9-diaza-13b-boranaphtho[3,2,1-de]anthracene (5 g, 0.0069 mol), and 2-(3-(10-(4-(tert-butyl)phenyl)anthracen-9-yl)phenyl)-4,4,5,5-tetramethyl-1,3,2-dioxaborane (3.89 g, 0.00759 mol) were completely dissolved in 200 mL of toluene, a 2M potassium carbonate aqueous solution (100 mL) was added, tetrakis(triphenylphosphine)palladium (0.47 g, 0.0004 mmol) was added thereto, and the mixture was refluxed for about 8 hours. The reaction was quenched, the reaction solution was extracted with methyl chloride and was dried over anhydrous magnesium sulfate, and the resultant product was purified by column chromatography using a solvent at a ratio of 1:10 of methylene chloride:hexane to prepare Compound BD1 (5.33 g, yield: 75%).

The H-NMR result and the mass spectrometry measurement result are as follows.

H-NMR (CDCl$_3$): 8.23 (4H, m), 7.95 (1H, s), 7.73 (1H, m), 7.63-7.50 (5H, m), 7.40-7.35 (8H, m), 7.31 (2H, d), 7.10-7.05 (10H, m), 6.95 (1H, m), 1.33 (36H, s), 1.25 (9H, s), m/z: 1029

1-2. Synthesis of Compound BD2

Compound BD2 according to an example may be synthesized by, for example, Reaction Scheme 2 below:

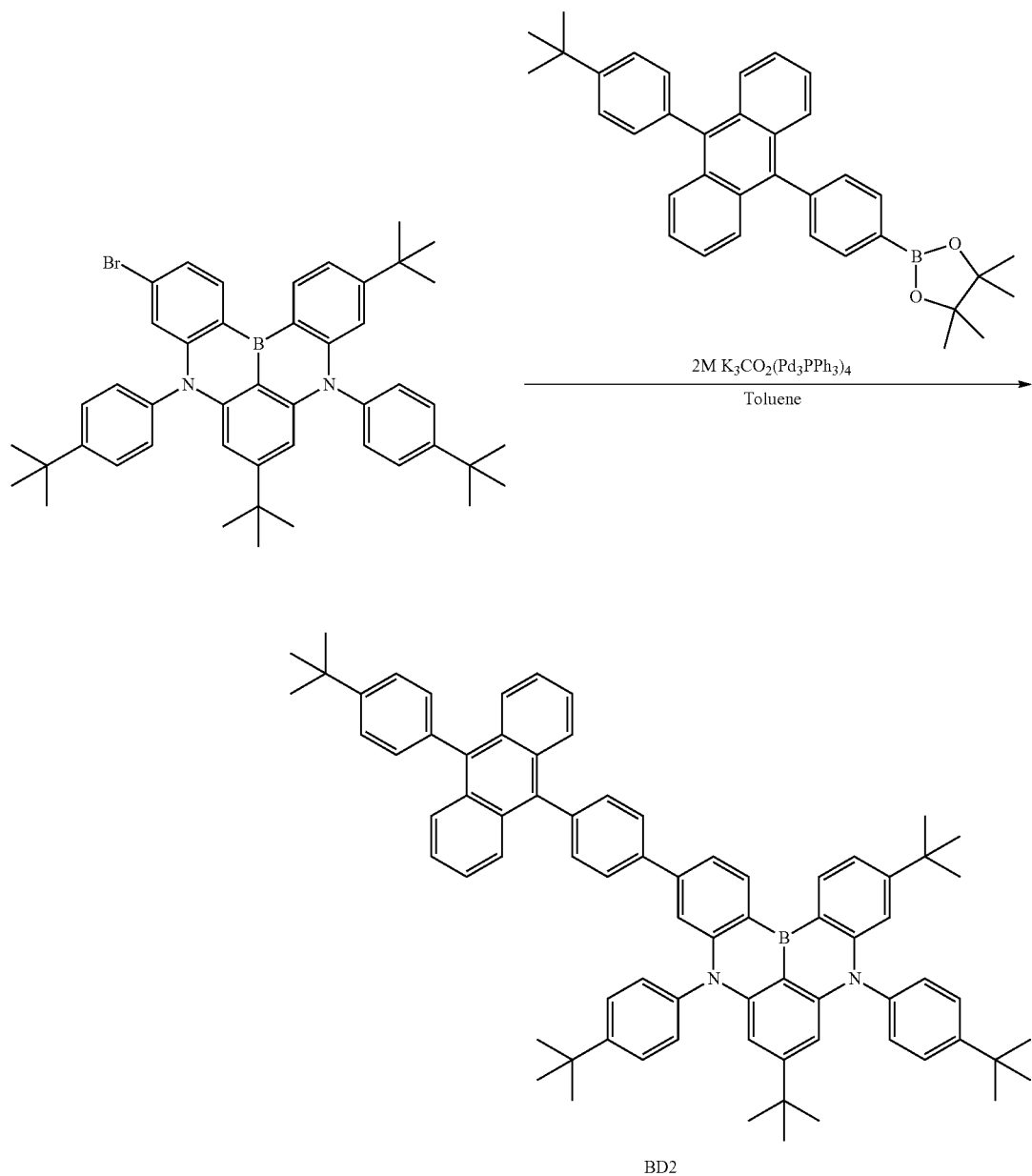

In a nitrogen atmosphere, in a 500 mL round bottom flask, 3-bromo-7,11-di-tert-butyl-5,9-bis(4-(tert-butyl)phenyl)-5,9-dihydro-5,9-diaza-13b-boranaphtho[3,2,1-de]anthracene (5 g, 0.0069 mol), and 2-(4-(10-(4-(tert-butyl)phenyl)anthracen-9-yl)phenyl)-4,4,5,5-tetramethyl-1,3,2-dioxaborane (3.89 g, 0.00759 mol) were completely dissolved in 200 mL of toluene, a 2M potassium carbonate aqueous solution (100 mL) was added, tetrakis(triphenylphosphine)palladium (0.47 g, 0.0004 mmol) was added thereto, and the mixture was refluxed for about 8 hours. The reaction was quenched with water, the reaction solution was extracted with methyl chloride and was dried over anhydrous magnesium sulfate, and the resultant product was subjected to column chromatography using a solvent at a ratio of 1:10 of methylene chloride:hexane to prepare Compound 2 (4.97 g, yield: 70%).

The H-NMR result and the mass spectrometry measurement result are as follows.

H-NMR (CDCl$_3$): 8.21 (4H, m), 7.90 (1H, d), 7.68 (1H, m), 7.48-7.37 (8H, m), 7.30-7.23 (7H, m), 7.10-7.05 (10H, m), 6.99 (1H, d), 1.33 (36H, s), 1.25 (9H, s), m/z: 1029

1-3. Synthesis of Compound BD3

Compound BD3 according to an example may be synthesized by, for example, Reaction Scheme 3 below:

[Reaction Scheme 3]

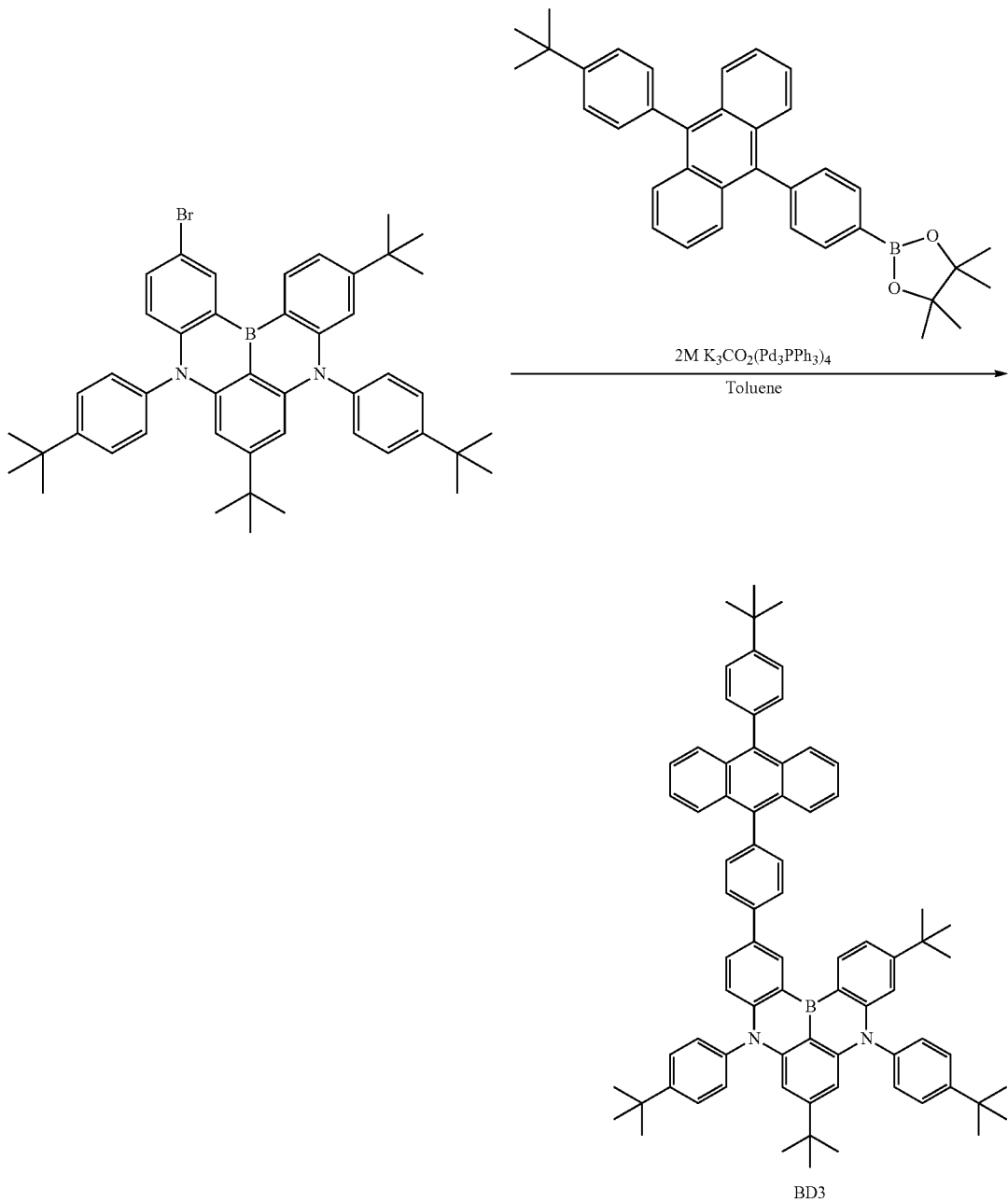

In a nitrogen atmosphere, in a 500 mL round bottom flask, 2-bromo-7,11-di-tert-butyl-5,9-bis(4-(tert-butyl)phenyl)-5,9-dihydro-5,9-diaza-13b-boranaphtho[3,2,1-de]anthracene (5 g, 0.0069 mol), and 2-(4-(10-(4-(tert-butyl)phenyl)anthracen-9-yl)phenyl)-4,4,5,5-tetramethyl-1,3,2-dioxaborane (3.89 g, 0.00759 mol) were completely dissolved in 200 mL of toluene, a 2M potassium carbonate aqueous solution (100 mL) was added, tetrakis(triphenylphosphine)palladium (0.47 g, 0.0004 mmol) was added thereto, and the mixture was refluxed for about 8 hours. The reaction was quenched with water, the reaction solution was extracted with methyl chloride and was dried over anhydrous magnesium sulfate, and the resultant product was subjected to column chromatography using a solvent at a ratio of 1:10 of methylene chloride: hexane to prepare Compound BD3 (4.62 g, yield: 65%).

The H-NMR result and the mass spectrometry measurement result are as follows.

H-NMR (CDCl$_3$): 8.21 (4H, m), 7.65 (2H, m), 7.55 (1H, d), 7.42-7.37 (8H, m), 7.30-7.23 (6H, m), 7.10-7.05 (10H, m), 6.99 (1H, d), 1.33 (36H, s), 1.25 (9H, s), m/z: 1029

1-4. Synthesis of Compound BD4

Compound BD4 according to an example may be synthesized by, for example, Reaction Scheme 4 below:

[Reaction Scheme 4]

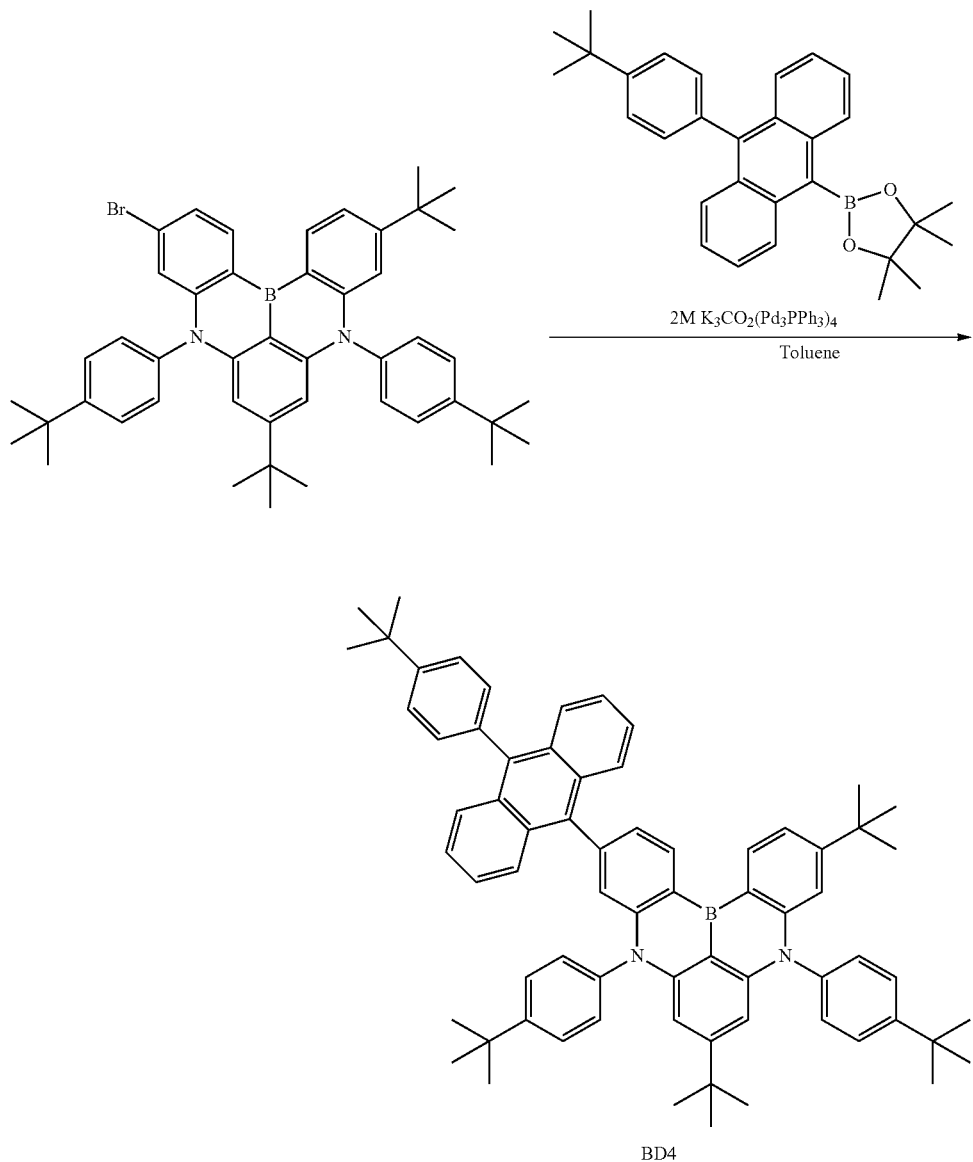

BD4

In a nitrogen atmosphere, in a 500 mL round bottom flask, 3-bromo-7,11-di-tert-butyl-5,9-bis(4-(tert-butyl)phenyl)-5,9-dihydro-5,9-diaza-13b-boranaphtho[3,2,1-de]anthracene (5 g, 0.0069 mol), and 2-(10-(4-(tert-butyl)phenyl)anthracen-9-yl)-4,4,5,5-tetramethyl-1,3,2-dioxaborane (3.31 g, 0.00759 mol) were completely dissolved in 200 mL of toluene, a 2M potassium carbonate aqueous solution (100 mL) was added, tetrakis(triphenylphosphine)palladium (0.47 g, 0.0004 mmol) was added thereto, and the mixture was refluxed for about 8 hours. The reaction was quenched with water, the reaction solution was extracted with methyl chloride and was dried over anhydrous magnesium sulfate, and the resultant product was subjected to column chromatography using a solvent at a ratio of 1:10 of methylene chloride:hexane to prepare Compound BD4 (4.60 g, yield: 70%).

The H-NMR result and the mass spectrometry measurement result are as follows.

H-NMR (CDCl$_3$): 8.21 (4H, m), 7.90 (1H, d), 7.68 (1H, m), 7.40-7.37 (8H, m), 7.30-7.26 (3H, m), 7.10-7.05 (10H, m), 6.99 (1H, d), 1.33 (36H, s), 1.25 (9H, s), m/z: 953

1-5. Synthesis of Compound BD5

Compound BD5 according to an example may be synthesized by, for example, Reaction Scheme 5 below:

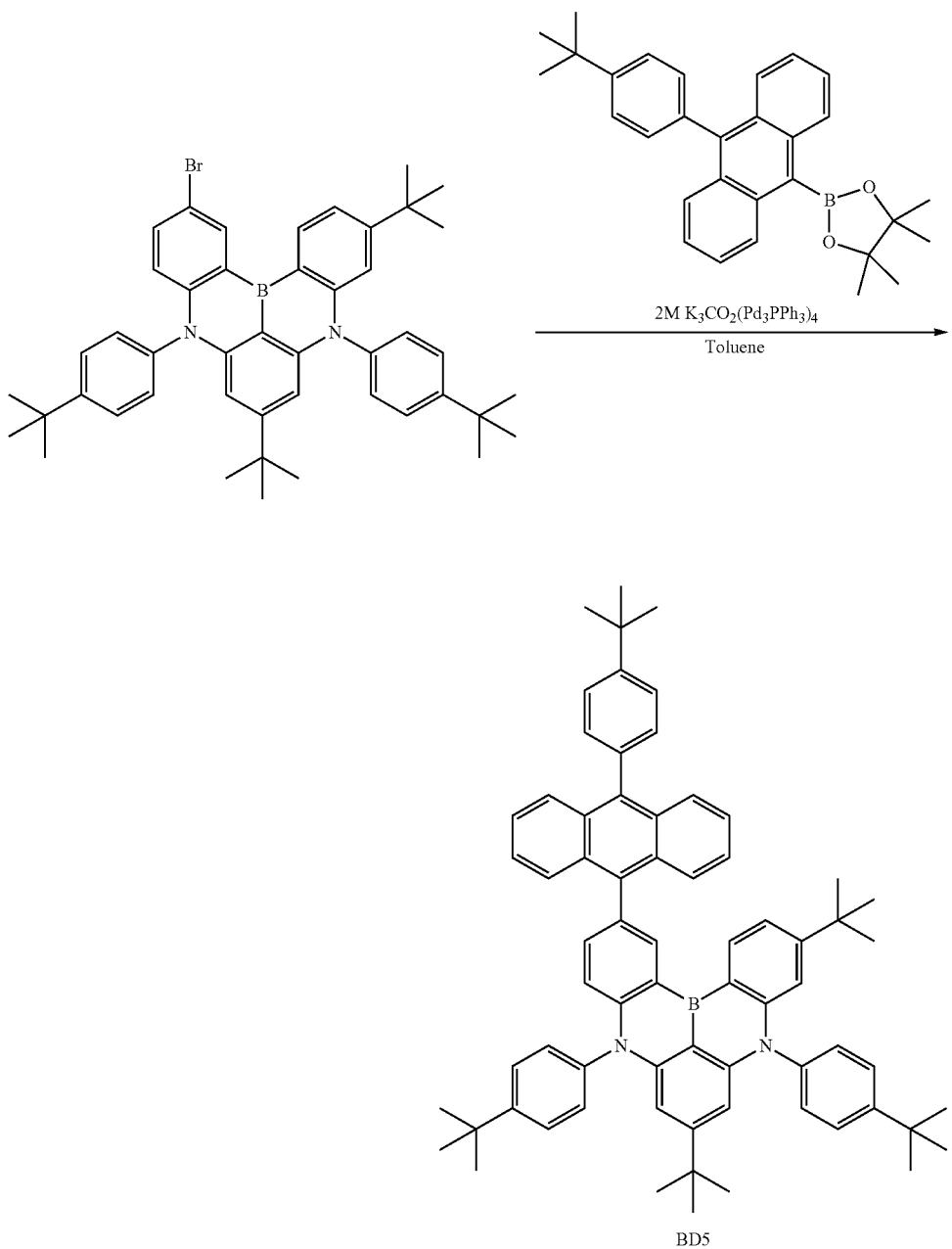

In a nitrogen atmosphere, in a 500 mL round bottom flask, 2-bromo-7,11-di-tert-butyl-5,9-bis(4-(tert-butyl)phenyl)-5,9-dihydro-5,9-diaza-13b-boranaphtho[3,2,1-de]anthracene (5 g, 0.0069 mol), and 2-(10-(4-(tert-butyl)phenyl)anthracen-9-yl)-4,4,5,5-tetramethyl-1,3,2-dioxaborane (3.31 g, 0.00759 mol) were completely dissolved in 200 mL of toluene, a 2M potassium carbonate aqueous solution (100 mL) was added, tetrakis(triphenylphosphine)palladium (0.47 g, 0.0004 mmol) was added thereto, and the mixture was refluxed for about 8 hours. The reaction was quenched with water, the reaction solution was extracted with methyl chloride and was dried over anhydrous magnesium sulfate, and the resultant product was subjected to column chromatography using a solvent at a ratio of 1:10 of methylene chloride:hexane to prepare Compound BD5 (3.62 g, yield: 55%).

The H-NMR result and the mass spectrometry measurement result are as follows.

H-NMR (CDCl$_3$): 8.21 (4H, m), 7.63 (2H, d), 7.55 (1H, d), 7.40-7.37 (8H, m), 7.30-7.26 (2H, m), 7.10-7.05 (10H, m), 6.99 (1H, d), 1.33 (36H, s), 1.25 (9H, s), m/z: 953

1-6. Synthesis of Compound BD6

Compound BD6 according to an example may be synthesized by, for example, Reaction Scheme 6 below:

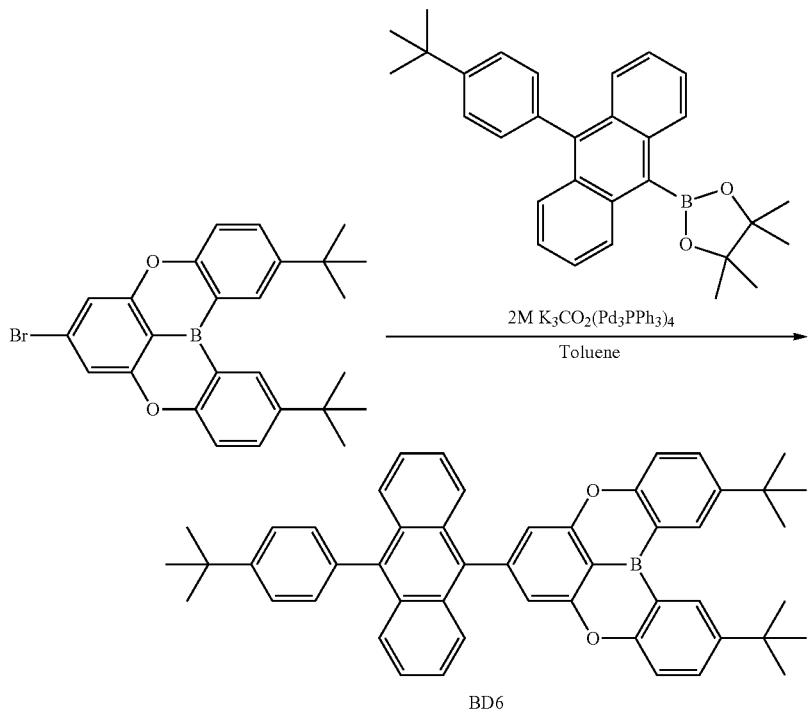

In a nitrogen atmosphere, in a 500 mL round bottom flask, 7-bromo-2,12-di-tert-butyl-5,9-dioxa-13b-boranaphtho[3,2,1-de]anthracene (5 g, 0.0108 mol), and 2-(10-(4-(tert-butyl)phenyl)anthracen-9-yl)-4,4,5,5-tetramethyl-1,3,2-dioxaborane (5.18 g, 0.01188 mol) were completely dissolved in 200 mL of toluene, a 2M potassium carbonate aqueous solution (100 mL) was added, tetrakis(triphenylphosphine)palladium (0.47 g, 0.0004 mmol) was added thereto, and the mixture was refluxed for about 8 hours. The reaction was quenched with water, the reaction solution was extracted with methyl chloride and was dried over anhydrous magnesium sulfate, and the resultant product was subjected to column chromatography using a solvent at a ratio of 1:10 of methylene chloride:hexane to prepare Compound BD6 (6.71 g, yield: 90%).

The H-NMR result and the mass spectrometry measurement result are as follows.

H-NMR (CDCl$_3$): 8.21 (4H, m), 7.50 (2H, d), 7.37-7.32 (10H, m), 7.05 (2H, s), 6.90 (2H, d), 1.32 (27H, s), m/z: 690

1-7. Synthesis of Compound BD7

Compound BD7 according to an example may be synthesized by, for example, Reaction Scheme 7 below:

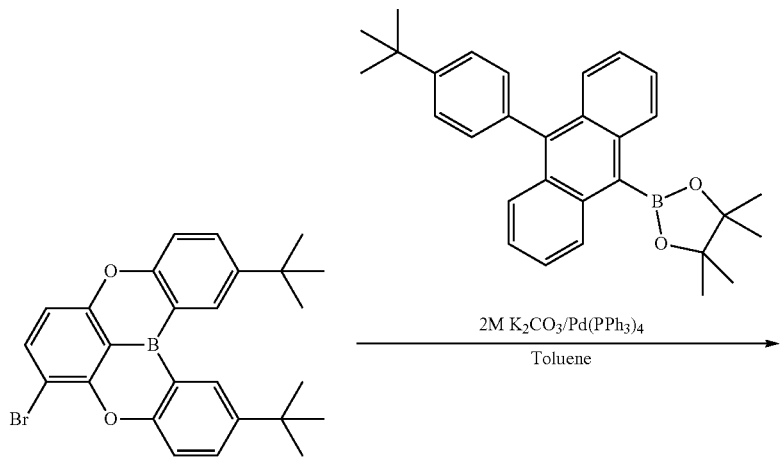

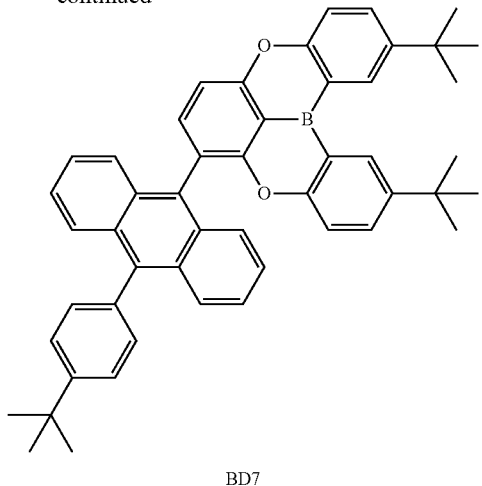

BD7

In a nitrogen atmosphere, in a 500 mL round bottom flask, 8-bromo-2,12-di-tert-butyl-5,9-dioxa-13b-boranaphtho[3,2,1-de]anthracene (5 g, 0.0108 mol), and 2-(10-(4-(tert-butyl)phenyl)anthracen-9-yl)-4,4,5,5-tetramethyl-1,3,2-dioxaborane (5.18 g, 0.01188 mol) were completely dissolved in 200 mL of toluene, a 2M potassium carbonate aqueous solution (100 mL) was added, tetrakis(triphenylphosphine)palladium (0.47 g, 0.0004 mmol) was added thereto, and the mixture was refluxed for about 8 hours. The reaction was quenched with water, the reaction solution was extracted with methyl chloride and was dried over anhydrous magnesium sulfate, and the resultant product was subjected to column chromatography using a solvent at a ratio of 1:10 of methylene chloride:hexane to prepare Compound BD7 (6.56 g, yield: 88%).

The H-NMR result and the mass spectrometry measurement result are as follows.

H-NMR (CDCl$_3$): 8.21 (4H, m), 7.65 (1H, d), 7.50 (2H, d), 7.37-7.32 (10H, m), 6.93-6.90 (3H, m), 1.32 (27H, s), m/z: 690

1-8. Synthesis of Compound BD8

Compound BD8 according to an example may be synthesized by, for example, Reaction Scheme BD8 below:

[Reaction Scheme 8]

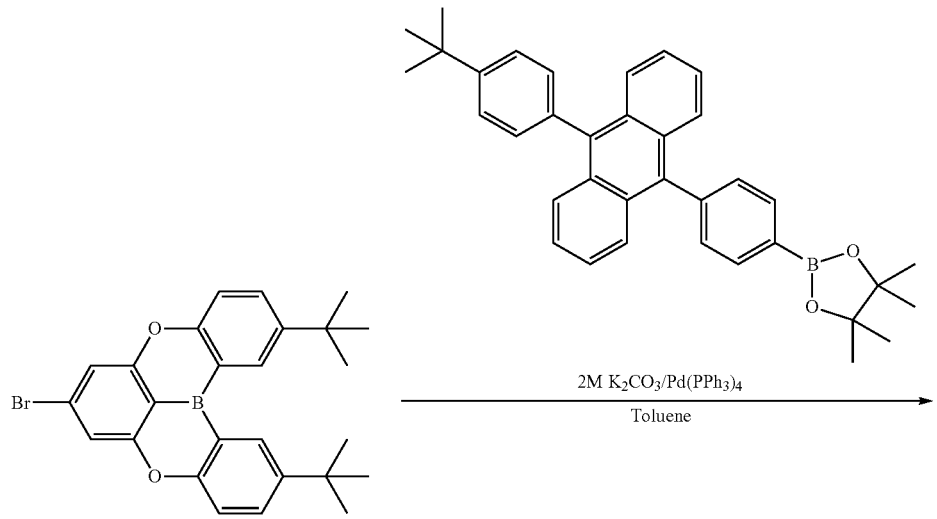

2M K$_2$CO$_3$/Pd(PPh$_3$)$_4$
Toluene

-continued

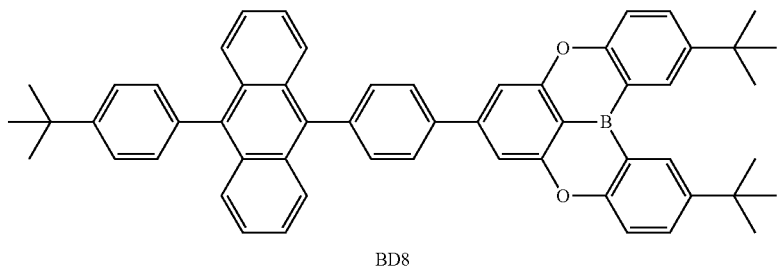

BD8

In a nitrogen atmosphere, in a 500 mL round bottom flask, 7-bromo-2,12-di-tert-butyl-5,9-dioxa-13b-boranaphtho[3,2,1-de]anthracene (5 g, 0.0108 mol), and 2-(4-(10-(4-(tert-butyl)phenyl)anthracen-9-yl)phenyl)-4,4,5,5-tetramethyl-1,3,2-dioxaborane (6.09 g, 0.01188 mol) were completely dissolved in 200 mL of toluene, a 2M potassium carbonate aqueous solution (100 mL) was added, tetrakis(triphenylphosphine)palladium (0.47 g, 0.0004 mmol) was added thereto, and the mixture was refluxed for about 8 hours. The reaction was quenched with water, the reaction solution was extracted with methyl chloride and was dried over anhydrous magnesium sulfate, and the resultant product was subjected to column chromatography using a solvent at a ratio of 1:10 of methylene chloride:hexane to prepare Compound BD8 (6.63 g, yield: 80%).

The H-NMR result and the mass spectrometry measurement result are as follows.

H-NMR (CDCl$_3$): 8.21 (4H, m), 7.50 (2H, d), 7.37-7.35 (12H, m), 7.30 (2H, s), 7.05 (2H, s), 6.90 (2H, d), 1.32 (27H, s), m/z: 766

1-9. Synthesis of Compound BD9

Compound BD9 according to an example may be synthesized by, for example, Reaction Scheme 9 below:

[Reaction Scheme 9]

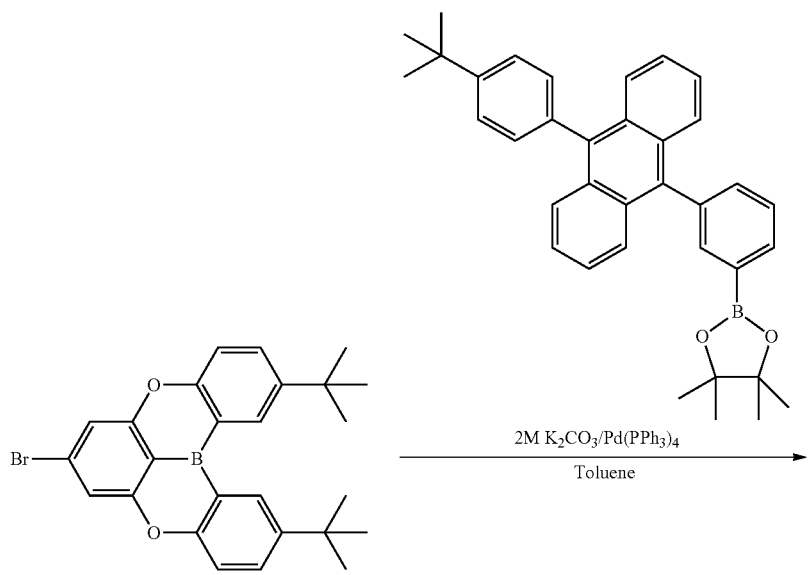

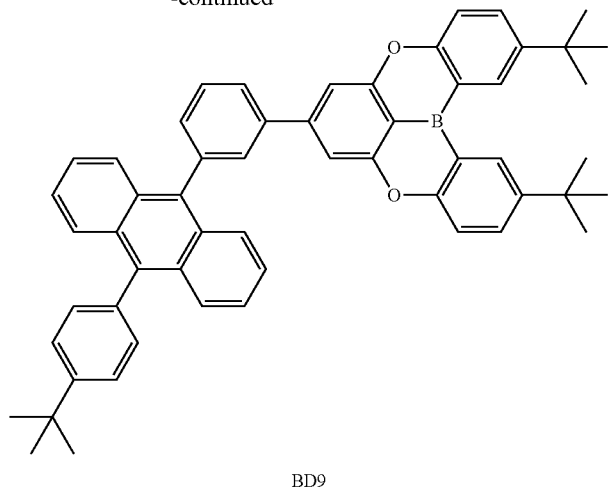

BD9

In a nitrogen atmosphere, in a 500 mL round bottom flask, 7-bromo-2,12-di-tert-butyl-5,9-dioxa-13b-boranaphtho[3,2,1-de]anthracene (5 g, 0.0108 mol), and 2-(3-(10-(4-(tert-butyl)phenyl)anthracen-9-yl)phenyl)-4,4,5,5-tetramethyl-1,3,2-dioxaborane (6.09 g, 0.01188 mol) were completely dissolved in 200 mL of toluene, a 2M potassium carbonate aqueous solution (100 mL) was added, tetrakis(triphenylphosphine)palladium (0.47 g, 0.0004 mmol) was added thereto, and the mixture was refluxed for about 8 hours. The reaction was quenched with water, the reaction solution was extracted with methyl chloride and was dried over anhydrous magnesium sulfate, and the resultant product was subjected to column chromatography using a solvent at a ratio of 1:10 of methylene chloride:hexane to prepare Compound BD9 (5.80 g, yield: 70%).

The H-NMR result and the mass spectrometry measurement result are as follows.

H-NMR (CDCl$_3$): 8.21 (4H, m), 7.93 (1H, s), 7.73 (11H, t), 7.60 (2H, d), 7.50 (2H, d), 7.37-7.35 (10H, m), 7.05 (2H, s), 6.91 (2H, d), 1.33 (27H, s), m/z: 766

1-10. Synthesis of Compound GD1

Compound GD1 according to an example may be synthesized by, for example, Reaction Scheme 10 below:

[Reaction Scheme 10]

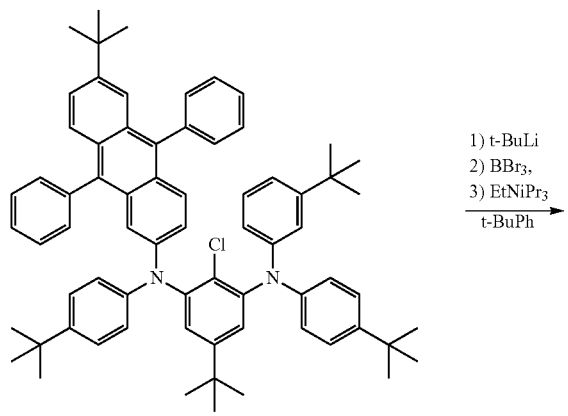

1) t-BuLi
2) BBr$_3$,
3) EtNiPr$_3$
t-BuPh

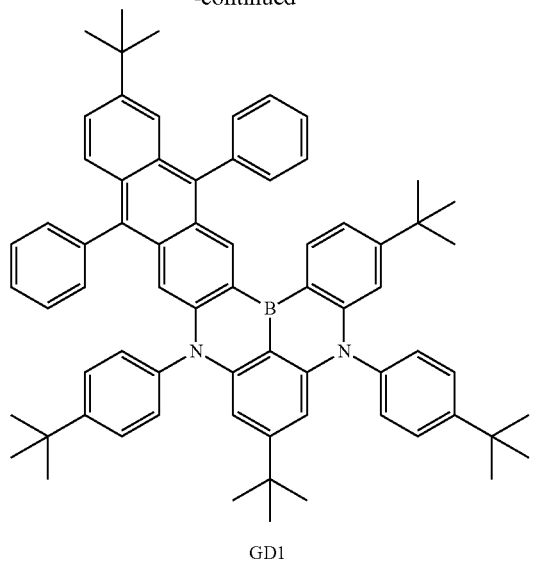

GD1

In a nitrogen atmosphere, in a 500 mL round bottom flask, 5-(tert-butyl)-N1-(6-(tert-butyl)-9,10-diphenylanthracen-2-yl)-N3-(3-(tert-butyl)phenyl)-N1,N3-bis(4-(tert-butyl)phenyl)-2-chlorobenzene-1,3-diamine (5 g, 0.0051 mol) was dissolved in a t-butyl benzene solvent, and cooled to about −30° C. using liquid nitrogen. Thereafter, a 1.6 M t-BuLi solution (3.5 mL, 0.0056 mol) was slowly injected thereto. The resulting mixture was heated to about 60° C. and stirred for about 1 hour, the residues of t-BuLi were sublimed and removed under reduced pressure, and cooled again to about −30° C. using liquid nitrogen. Boron tribromide (1.40 g, 0.0056 mol) was injected thereto, and the mixture was slowly heated to room temperature and stirred for about 30 minutes. Thereafter, the mixture was cooled again to about 0° C., N,N-diisopropylethylamine (0.73 g, 0.0056 mol) was added thereto, and the mixture was refluxed at about 120° C. for about 2 hours. The reaction was quenched with water, the reaction solution was extracted with methyl chloride and was dried over anhydrous magnesium sulfate, and the resultant product was subjected to column chromatography using a solvent at a ratio of 1:10 of methylene chloride:hexane to prepare Compound GD1 (2.67 g, yield: 50%).

The H-NMR result and the mass spectrometry measurement result are as follows.

H-NMR (CDCl$_3$): 7.99 (1H, d), 7.70 (11H, s), 7.65-7.58 (5H, m), 7.55-7.48 (5H, m), 7.40-7.37 (4H, m), 7.10-7.05 (11H, m), 6.97 (1H, d), 1.49 (9H, s), 1.32 (27H, s), 1.25 (9H, s), m/z: 953

2. Evaluation of Compound Physical Properties

With respect to Example Compounds BD1 to 9 and Compound GD1 as described above and Comparative Example Compound X1, levels of highest occupied molecular orbital (HOMO), lowest unoccupied molecular orbital (LUMO), lowest singlet excitation energy (S1), and lowest triplet excitation energy (T1) are shown in Table 1. The HOMO and LUMO energy levels are results of measuring in a solution (DMF) by means of a differential pulse voltammetry method, one mode of CV equipment, and S1 and T1 levels are calculated by a non-empirical molecular orbital method. The calculation was performed by using Gaussian09 from Gaussian, Inc., and using B3LYP as functional and 6-31G(d) as a basis function.

TABLE 1

| Dopant kinds | HOMO (eV) | LUMO (eV) | S1 (eV) | T1 (eV) |
| --- | --- | --- | --- | --- |
| X1 (ref.) | −5.2 | −2.3 | 2.8 | 2.4 |
| BD1 | −5.2 | −2.3 | 2.8 | 1.7 |
| BD2 | −5.2 | −2.3 | 2.8 | 1.7 |
| BD3 | −5.2 | −2.3 | 2.8 | 1.7 |
| BD4 | −5.2 | −2.3 | 2.8 | 1.7 |
| BD5 | −5.2 | −2.3 | 2.8 | 1.7 |
| BD6 | −5.3 | −2.2 | 3.0 | 1.7 |
| BD7 | −5.3 | −2.2 | 3.0 | 1.7 |
| BD8 | −5.3 | −2.2 | 3.0 | 1.7 |
| BD9 | −5.3 | −2.2 | 3.0 | 1.7 |
| GD1 | −5.2 | −2.3 | 2.4 | 1.5 |
| Y1 (ref.) | −5.6 | −3.1 | 2.1 | 2.1 |

[Compound X1]

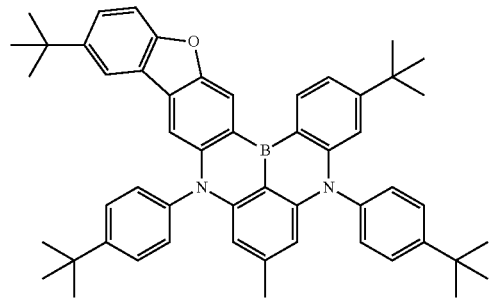 [SMILES: Cc1cc2c3c(c1)N(c1ccc(C(C)(C)C)cc1)c1cc4c(cc1B3c1ccc(C(C)(C)C)cc1N2c1ccc(C(C)(C)C)cc1)oc1ccc(C(C)(C)C)cc14]

[Compound Y1]

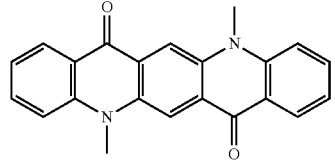 [SMILES: Cn1c2ccccc2c(=O)c2cc3c(cc21)c(=O)c1ccccc1n3C]

The compounds of Examples are different from Comparative Example Compounds X1 and Y1 in that with respect to a structure, the compounds of Examples include the anthracenyl group which is directly bonded to boron or bonded to boron with a linker therebetween, and with respect to physical properties, the compounds of Examples have a lowest triplet excitation energy (T$_1$) of less than about 2.0 eV.

3. Manufacture and Evaluation of Light Emitting Device
(Manufacture of Evaluation Structure 1)

ITO/Ag/ITO were stacked on a glass substrate in thicknesses of about 70 Å/1,500 Å/70 Å to form a first electrode, the resulting substrate was washed with ultrapure water, cleansed by ultrasonic waves, irradiated with ultraviolet rays for about 30 minutes, and treated with ozone. Thereafter, on the first electrode, HATCN was deposited to a thickness of about 100 Å, and NPB was deposited to a thickness of about 1,200 Å to form a hole transport region. mCBP was deposited on the hole transport region to form a 50 Å-thick electron blocking layer. 2-(10-phenylanthracen-9-yl)dibenzo[b,d]furan (PADF) as a fluorescence host material and the compound according to an embodiment or the compound of Comparative Examples as a dopant material were deposited on the electron blocking layer to form a 200 Å-thick emission layer. Thereafter, T2T was deposited on the emission layer to form a 50 Å-thick hole blocking layer. On the hole blocking layer, TPM-TAZ and 8-hydroxyl-Lithium quinolate (Liq) were mixed at a ratio of 5:5 and deposited to a thickness of about 300 Å, and Yb was deposited to a thickness of about 10 Å to form an electron transport region. A second electrode having a thickness of about 100 Å was formed on the electron transport region with AgMg. A capping layer CPL was formed on the second electrode in a thickness of 700 Å through deposition.

In the Examples, the hole transport region, the electron blocking layer, the emission layer, the hole blocking layer, the electron transport region, and the second electrode were formed using a vacuum deposition apparatus.

(Manufacture of Evaluation Structure 2)

Evaluation structure 2 was manufactured in the same manner as in Evaluation structure 1 except that BCTz as a phosphorescence host was included in the emission layer instead of 2-(10-phenylanthracen-9-yl)dibenzo[b,d]furan (PADF) in Evaluation structure 1.

(Manufacture of Evaluation Structure 3)

Evaluation structure 3 was manufactured in the same manner as in Evaluation structure 1 except that TDBA-Ac as a TADF dopant was further included in the emission layer in Evaluation structure 2.

(Manufacture of Evaluation Structure 4)

ITO/Ag/ITO were stacked on a glass substrate in thicknesses of about 70 Å/1,500 Å/70 Å to form a first electrode, the resulting substrate was washed with ultrapure water, cleansed by ultrasonic waves, irradiated with ultraviolet rays for about 30 minutes, and treated with ozone. HAT-CN was deposited on the first electrode to form a 100 Å-thick hole injection layer. NPB was deposited on the hole injection layer to form a 200 Å-thick hole transport layer. mCBP was deposited on the hole transport layer to form a 50 Å-thick electron blocking layer. 2-(10-phenylanthracen-9-yl)dibenzo[b,d]furan (PADF) and Compound X$_1$, BD5, or BD6 according to Examples and Comparative Examples as a dopant material were deposited on the electron blocking layer to form a 200 Å-thick emission layer. T2T was deposited on the emission layer to form a 50 Å-thick hole injection layer, TPM-TAZ and LiQ were deposited in vacuum on the hole injection layer at a volume ratio of about 1:1 to form a 250 Å-thick electron transport layer, thereby forming a third light emitting structure.

BCP and Li were deposited in vacuum on the third light emitting structure at a volume ratio of about 98.5:1.5 to form a 50 Å-thick n-type charge generation layer, and HATCN was deposited on the n-type charge generation layer to form a 100 Å-thick p-type charge generation layer, thereby forming a third charge generation layer.

NPB was deposited on the third charge generation layer to form a 250 Å-thick hole transport layer. mCBP was deposited on the hole transport layer to form a 50 Å-thick electron blocking layer. BCTz and tris(2-(pyridin-2-yl)phenyl) iridium were deposited in vacuum on the electron blocking layer at a volume ratio of about 90:10 to form a 300 Å-thick emission layer. T2T was deposited on the emission layer to form a 50 Å-thick hole blocking layer. TPM-TAZ and LiQ were deposited in vacuum on the hole injection layer at a volume ratio of about 1:1 to form a 250 Å-thick electron transport layer, thereby forming a second light emitting structure.

BCP and Li were deposited in vacuum on the second light emitting structure at a volume ratio of about 98.5:1.5 to form a 50 Å-thick n-type charge generation layer, and HATCN was deposited on the n-type charge generation layer to form a 100 Å-thick p-type charge generation layer, thereby forming a second charge generation layer.

NPB was deposited on the second charge generation layer to form a 100 Å-thick hole transport layer, mCBP was deposited on the hole transport layer to form a 50 Å-thick electron blocking layer, and 2-(10-phenylanthracen-9-yl)dibenzo[b,d]furan (PADF) and Compound X1, BD5, or BD6 according to Examples and Comparative Examples as a dopant material were deposited on the electron blocking layer to form a 200 Å-thick emission layer. T2T was deposited on the emission layer to form a 50 Å-thick hole injection layer, TPM-TAZ and LiQ were deposited in vacuum on the hole injection layer at a volume ratio of about 1:1 to form a 350 Å-thick electron transport layer, thereby forming a first light emitting structure.

Yb was deposited on the first light emitting structure to a thickness of about 10 Å, Ag and Mg was deposited in vacuum at a volume ratio of about 9:1 to form a 120 Å-thick second electrode, and CPL was deposited on the second electrode to form a 600 Å-thick capping layer, thereby manufacturing a tandem-type organic light emitting device.

(Manufacture of Evaluation Structure 5)

Evaluation Structure 5 was manufactured in the same manner as in Evaluation structure 4 except that the emission layer of the second light emitting structure was formed by depositing, on the electron blocking layer, 2-(10-phenylanthracen-9-yl)dibenzo[b,d]furan (PADF) and Compound X1, BD5, or BD6 according to Examples and Comparative Examples as a dopant material to a thickness of about 200 Å, and the emission layer of the third light emitting structure was formed by depositing in vacuum, on the electron blocking layer, BCTz and tris(2-(pyridin-2-yl)phenyl) iridium at a volume ratio of about 90:10.

(Manufacture of Evaluation Structure 6)

Evaluation Structure 6 was manufactured in the same manner as in Evaluation structure 4 except that a fourth light emitting structure, which had the same structure as the third light emitting structure, was formed between the third light emitting structure and the first electrode.

(Manufacture of Evaluation Structure 7)

Evaluation Structure 7 was manufactured in the same manner as in Evaluation structure 5 except that a third light emitting structure was formed on the fourth light emitting structure that is the same as the third light emitting structure.

The compounds used to manufacture Evaluation structures 1 to 7 are shown below.

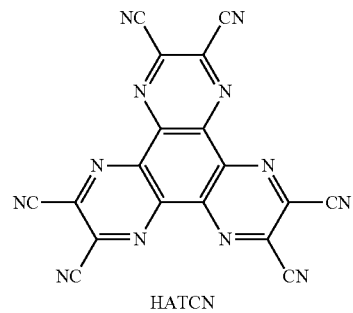
HATCN

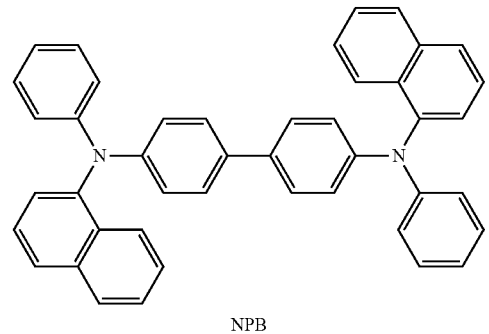
NPB

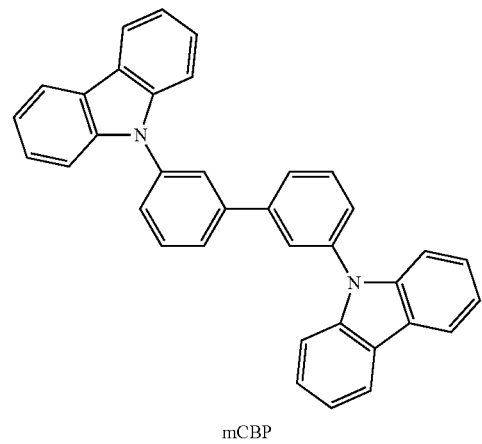
mCBP

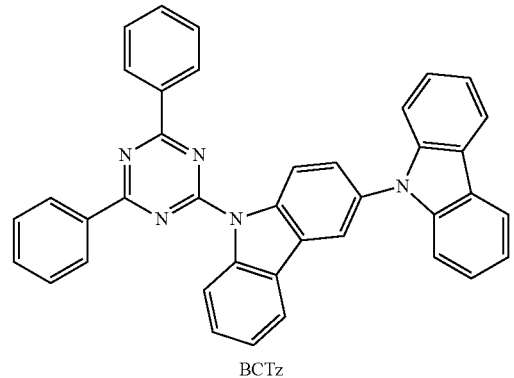
BCTz

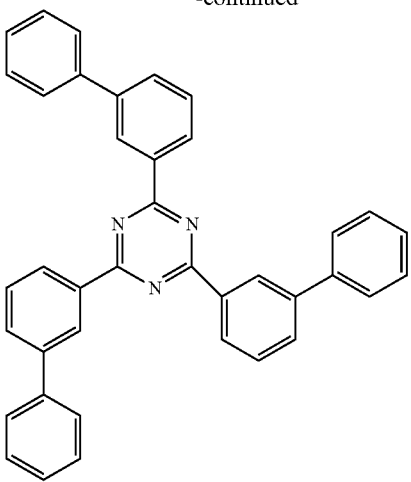

T2T

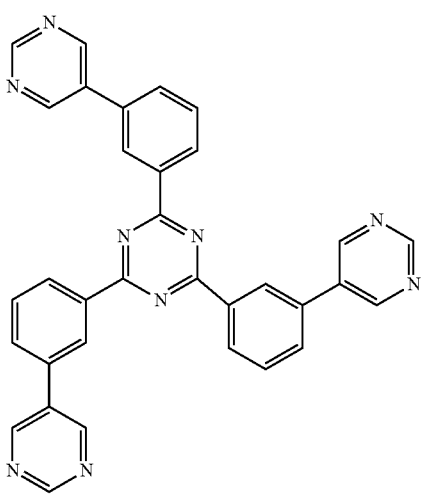

TPM—TAZ

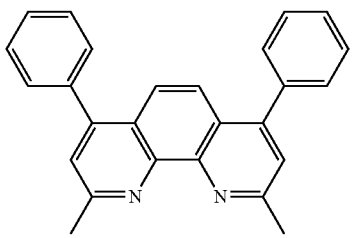

BCP

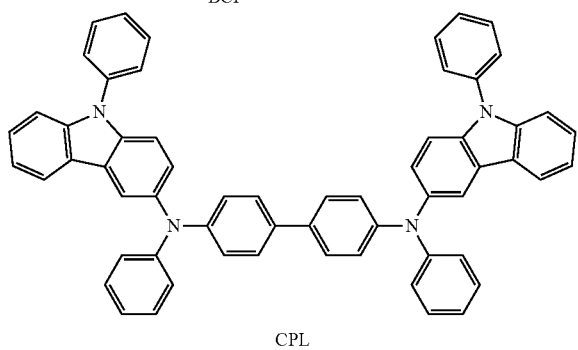

CPL

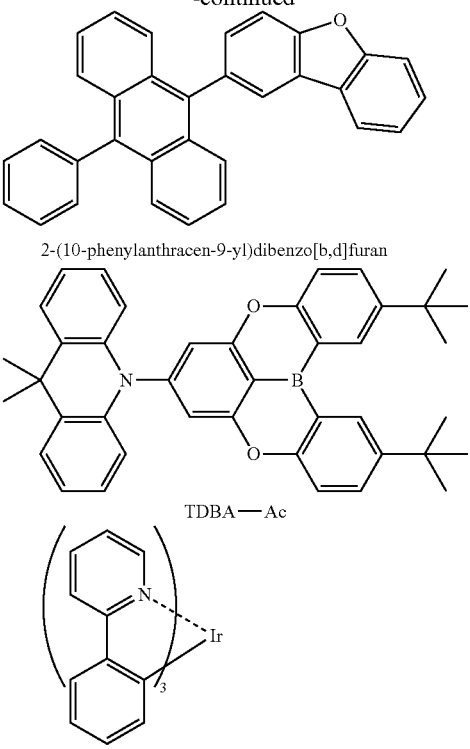

2-(10-phenylanthracen-9-yl)dibenzo[b,d]furan

TDBA—Ac

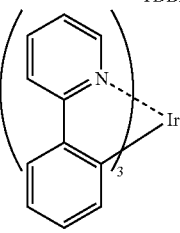

tris(2-(pyridin-2-yl)phenyl)iridium (Characteristic Evaluation of Evaluation Structures 1 to 7)

Experimental results of Evaluation structures 1 to 3 are shown in Table 2 to 4. In Evaluation structure 1, one among Comparative Example Compounds X1, Y1, Example Compounds BD1 to BD9 and GD1 was included as the dopant material of the emission layer, and characteristics of Evaluation Structure 1 were evaluated and shown in Table 2. In Evaluation structure 2, one among Comparative Example Compounds X1, Y1, Example Compounds BD1 to BD9 and GD1 was included as the dopant material of the emission layer, and characteristics of Evaluation Structure 2 were evaluated and shown in Table 3. In Evaluation structure 3, one among Comparative Example Compounds X1, Y1, Example Compounds BD1 to BD9 and GD1 was included as the dopant material of the emission layer, and characteristics of Evaluation Structure 3 were evaluated and shown in Table 4.

TABLE 2

| Division | Dopant type | Drive voltage (V) | Efficiency (Cd/A) | Service life (T97) | Brightness (nit) |
|---|---|---|---|---|---|
| Evaluation structure 1 | X1 (ref.) | 3.7 | 7.8 | 150 | 1000 |
| | BD1 | 3.8 | 8.1 | 230 | 1000 |
| | BD2 | 3.7 | 8.0 | 245 | 1000 |
| | BD3 | 3.7 | 7.8 | 220 | 1000 |
| | BD4 | 3.8 | 8.1 | 210 | 1000 |
| | BD5 | 3.7 | 8.0 | 240 | 1000 |
| | BD6 | 3.8 | 8.4 | 180 | 1000 |
| | BD7 | 3.6 | 8.5 | 195 | 1000 |
| | BD8 | 3.7 | 8.3 | 200 | 1000 |
| | BD9 | 3.8 | 8.4 | 220 | 1000 |
| | Y1 (ref.) | 3.7 | 30.5 | 280 | 5000 |
| | GD1 | 3.6 | 32.3 | 350 | 5000 |

TABLE 3

| Division | Dopant kinds | Drive voltage (V) | Efficiency (Cd/A) | Service life (T97) | Brightness (nit) |
|---|---|---|---|---|---|
| Evaluation structure 2 | X1 (ref.) | 4.0 | 4.4 | 10 | 1000 |
| | BD1 | 3.9 | 4.8 | 120 | 1000 |
| | BD2 | 3.8 | 5 | 133 | 1000 |
| | BD3 | 3.9 | 5.1 | 140 | 1000 |
| | BD4 | 3.8 | 4.9 | 155 | 1000 |
| | BD5 | 3.8 | 5.2 | 150 | 1000 |
| | BD6 | 3.7 | 5.0 | 160 | 1000 |
| | BD7 | 3.8 | 4.9 | 155 | 1000 |
| | BD8 | 3.8 | 5.5 | 180 | 1000 |
| | BD9 | 3.9 | 5.4 | 145 | 1000 |
| | Y1 (ref.) | 4.2 | 16.5 | 220 | 5000 |
| | GD1 | 4.1 | 18.5 | 280 | 5000 |

TABLE 4

| Division | Dopant kinds | Drive voltage (V) | Efficiency (Cd/A) | Service life (T97) | Brightness (nit) |
|---|---|---|---|---|---|
| Evaluation structure 3 | X1 (ref.) | 3.8 | 15.2 | 10 | 1000 |
| | BD1 | 3.7 | 16.8 | 89 | 1000 |
| | BD2 | 3.8 | 17 | 90 | 1000 |
| | BD3 | 3.8 | 16.5 | 88 | 1000 |
| | BD4 | 3.7 | 15.8 | 95 | 1000 |
| | BD5 | 3.9 | 16 | 90 | 1000 |
| | BD6 | 3.8 | 16.2 | 105 | 1000 |
| | BD7 | 3.7 | 17.3 | 110 | 1000 |
| | BD8 | 3.7 | 18.5 | 115 | 1000 |
| | BD9 | 3.8 | 17.8 | 120 | 1000 |
| | Y1 (ref.) | 4.0 | 60.2 | 200 | 5000 |
| | GD1 | 3.9 | 70.8 | 250 | 5000 |

In Evaluation structures 1 to 3, the case where the emission layer includes one among Example Compounds BD1 to 9 as a dopant material exhibits a service life longer than the case where the emission layer includes Comparative Example Compound X1 as a dopant material. The case where the emission layer includes Example Compound GD1 as a dopant material exhibits a service life longer than the case where the emission layer includes Comparative Example Compound Y1 as a dopant material. The reason for this is considered that Example Compounds BD1 to 9 and GD1 have a lowest triplet excitation energy ($T_1$) of less than about 2.0 eV. Since the lowest triplet excitation energy is low, deterioration due to TTF and the attack of the electron to heteroatoms make a bond dissociation energy decrease, and thus the case where the emission layer includes Example Compound as a dopant material may have long service life characteristics. The fluorescence emitting structure of Evaluation structure 1, the phosphorescence emitting structure of Evaluation structure 2, and the delayed fluorescence emitting structure of Evaluation structure 3 all achieve long service lives, and thus it may be confirmed that the case where the emission layer includes Example Compound as a dopant material may have long service life characteristics regardless of light emitting mechanisms.

TABLE 5

| Division | Blue dopant type | Drive voltage (V) | Efficiency (Cd/A) | Service life (T97) | Brightness (nit) |
|---|---|---|---|---|---|
| Evaluation structure 4 | X1 (ref.) | 9.8 | 90.5 | 10 | 1000 |
| | BD5 | 9.8 | 92.4 | 380 | 1000 |
| | BD6 | 9.7 | 93.8 | 420 | 1000 |

TABLE 6

| Division | Blue dopant type | Drive voltage (V) | Efficiency (Cd/A) | Service life (T97) | Brightness (nit) |
|---|---|---|---|---|---|
| Evaluation structure 5 | X1 (ref.) | 9.8 | 100.1 | 10 | 1000 |
| | BD5 | 9.5 | 100.8 | 420 | 1000 |
| | BD6 | 9.8 | 105.3 | 440 | 1000 |

TABLE 7

| Division | Blue dopant type | Drive voltage (V) | Efficiency (Cd/A) | Service life (T97) | Brightness (nit) |
|---|---|---|---|---|---|
| Evaluation structure 6 | X1 (ref.) | 11.5 | 105.3 | 13 | 1000 |
| | BD5 | 11.4 | 108.3 | 430 | 1000 |
| | BD6 | 11.5 | 109.4 | 480 | 1000 |

TABLE 8

| Division | Blue dopant type | Drive voltage (V) | Efficiency (Cd/A) | Service life (T97) | Brightness (nit) |
|---|---|---|---|---|---|
| Evaluation structure 7 | X1 (ref.) | 11.3 | 120.5 | 14 | 1000 |
| | BD5 | 11.2 | 130.4 | 450 | 1000 |
| | BD6 | 11.3 | 135.3 | 520 | 1000 |

In Evaluation structures 4 to 7, the case where the emission layer includes one among Example Compounds BD5 and BD6 as a dopant material exhibits a service life longer than the case where the emission layer includes Compound X1 as a dopant material. Through this, it may be confirmed that even in the tandem structure, the case where the emission layer includes Example Compound as a dopant material has long service life characteristics.

In short, it may be seen that unlike Comparative Example Compounds, Example Compounds include at least one anthracenyl group and thus have a lowest triplet excitation energy of less than about 2.0 eV, and when such Example Compounds are used as a dopant material of the emission layer, the light emitting device has long service life characteristics.

An embodiment includes a polycyclic compound having a low lowest triplet excitation energy, and thus may provide a light emitting device having long service life characteristics.

An embodiment includes at least one anthracenyl group, and thus may provide a polycyclic compound having a low lowest triplet excitation energy.

The light emitting device according to an embodiment may achieve high efficiency and a long service life.

The polycyclic compound according to an embodiment may have improved service life of the light emitting device.

Embodiments have been disclosed herein, and although terms are employed, they are used and are to be interpreted in a generic and descriptive sense only and not for purpose of limitation. In some instances, as would be apparent by one of ordinary skill in the art, features, characteristics, and/or elements described in connection with an embodiment may be used singly or in combination with features, characteristics, and/or elements described in connection with other embodiments unless otherwise specifically indicated. Accordingly, it will be understood by those of ordinary skill in the art that various changes in form and details may be made without departing from the spirit and scope of the disclosure as set forth in the following claims.

What is claimed is:

1. A light emitting device comprising:
a first electrode;
a second electrode facing the first electrode; and
at least one emission layer disposed between the first electrode and the second electrode, wherein
the at least one emission layer comprises a polycyclic compound represented by Formula 1:

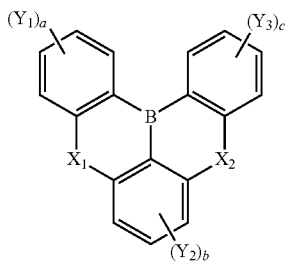

[Formula 1]

wherein in Formula 1,
a to c are each independently 1 or 2,
$X_1$ and $X_2$ are each independently O or $N(R_a)$,
$R_a$ is a hydrogen atom, a deuterium atom, a halogen atom, a cyano group, a substituted or unsubstituted amine group, a substituted or unsubstituted boryl group, a substituted or unsubstituted oxy group, a substituted or unsubstituted thio group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms,
$Y_1$ to $Y_3$ are each independently a hydrogen atom, a deuterium atom, a halogen atom, a cyano group, a substituted or unsubstituted amine group, a substituted or unsubstituted boryl group, a substituted or unsubstituted oxy group, a substituted or unsubstituted thio group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, and
at least one of $Y_1$ to $Y_3$ is a group represented by Formula $Z_1$ or Formula $Z_2$,
provided that when $X_1$ and $X_2$ are each O:
at least one of $Y_2$ is a group represented by Formula $Z_1$; and
at least one of $Y_1$ is a tert-butyl group; and
at least one of $Y_3$ is a tert-butyl group:

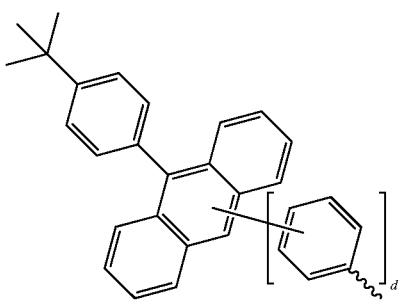

[Formula $Z_1$]

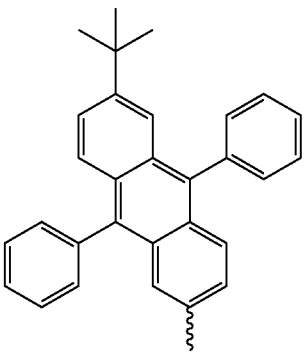

[Formula $Z_2$]

wherein in Formula $Z_1$ and Formula $Z_2$,
d is 0 or 1, and
∿∿∿ represents a binding site to a neighboring atom.

2. The light emitting device of claim 1, wherein Formula 1 is represented by Formula 2 or Formula 3;

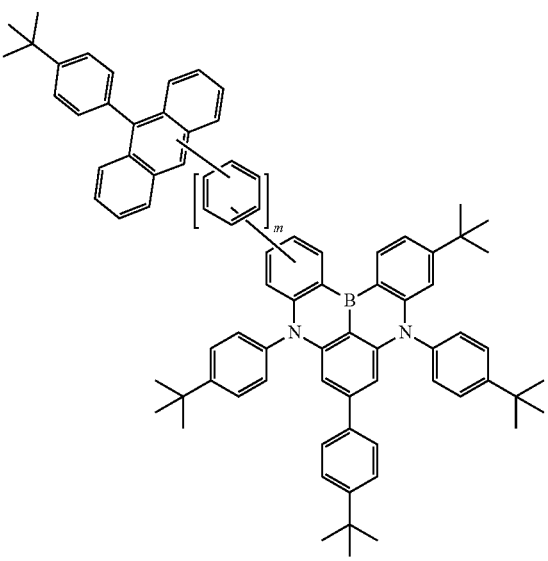

[Formula 2]

[Formula 3]
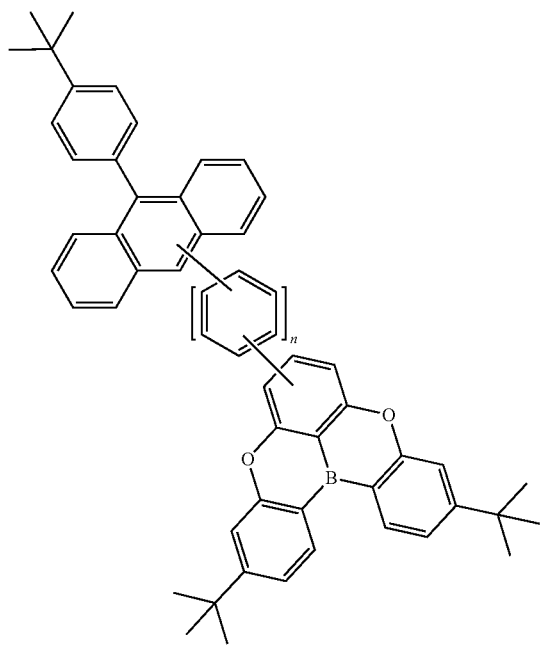
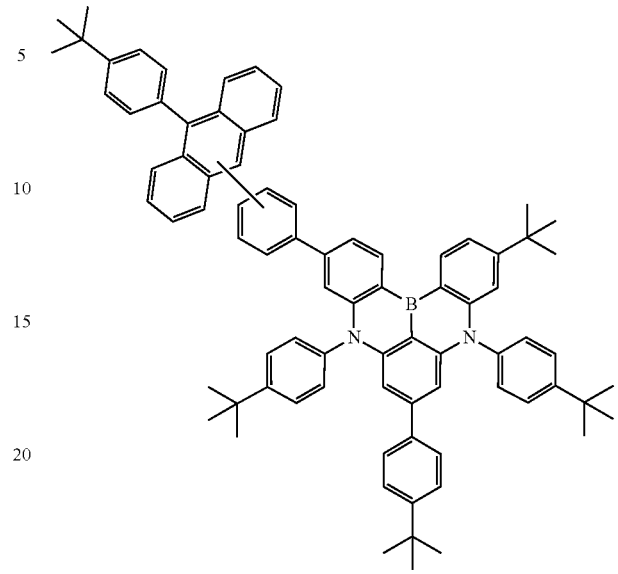
[Formula 2-2]
wherein in Formula 2,
m is 0 or 1, and
wherein in Formula 3,
n is 0 or 1.
3. The light emitting device of claim 2, wherein the polycyclic compound represented by Formula 2 or Formula 3 emits blue light.
4. The light emitting device of claim 1, wherein Formula 1 is represented by one of Formula 2-1 to Formula 2-3:
[Formula 2-1]
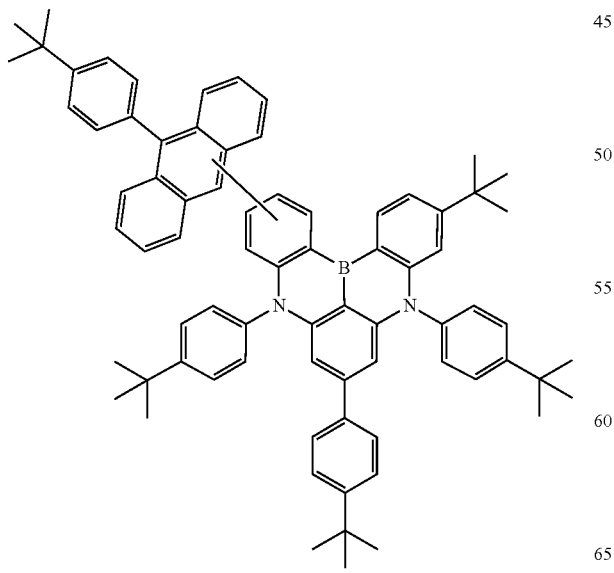
[Formula 2-3]
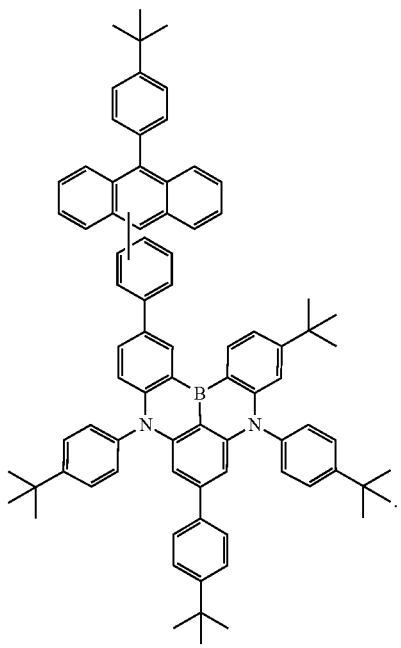

5. The light emitting device of claim 1, wherein Formula 1 is represented by Formula 3-1 or Formula 3-2:

[Formula 3-1]

[Formula 3-2]

6. The light emitting device of claim 1, wherein the polycyclic compound has a lowest triplet excitation energy of less than about 2.0 eV.

7. The light emitting device of claim 1, wherein the at least one emission layer comprises a host and a dopant, and the dopant comprises the polycyclic compound.

8. The light emitting device of claim 1, wherein the polycyclic compound is one selected from Compound Group 1:

[Compound Group 1]

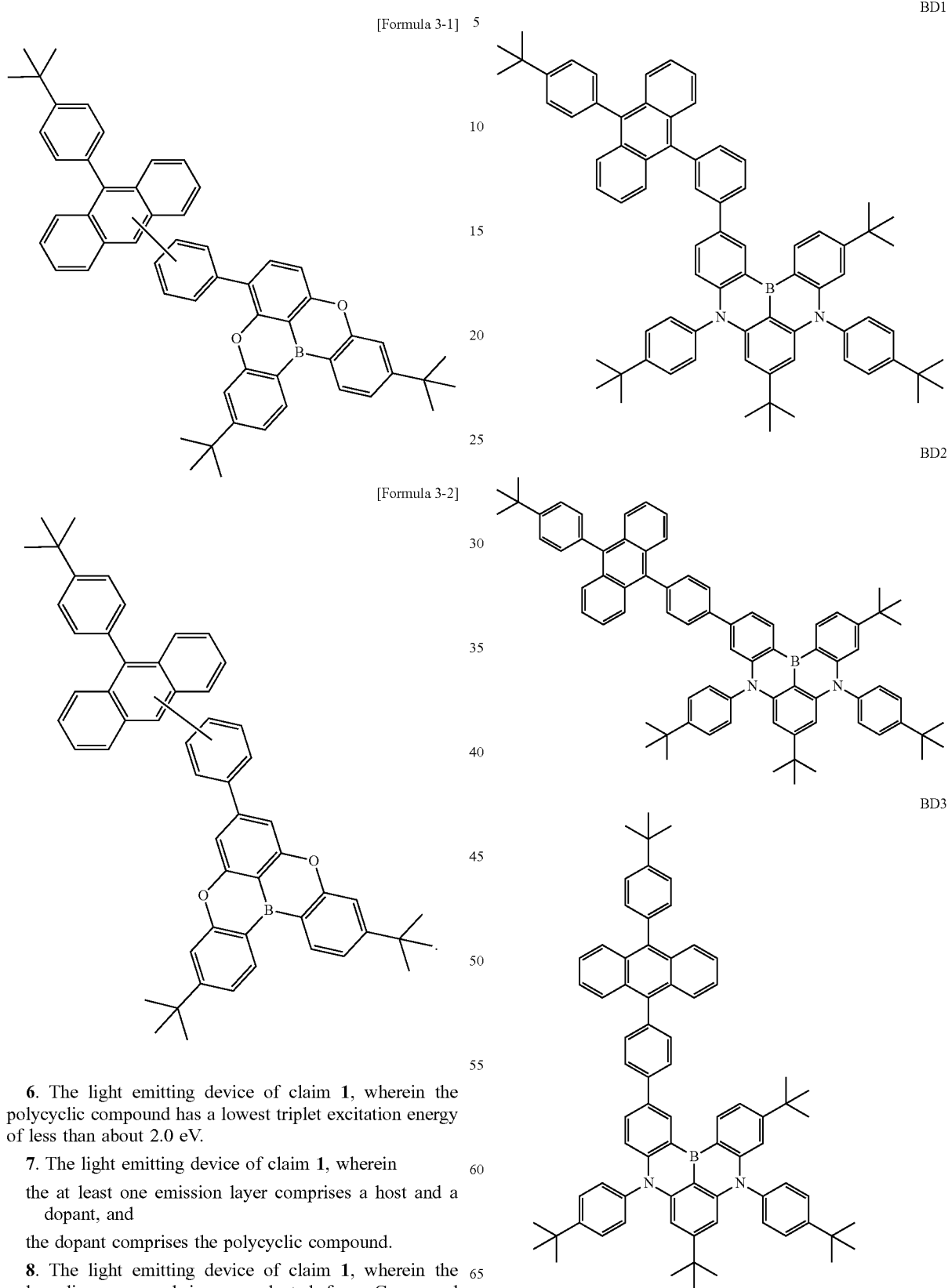

BD4
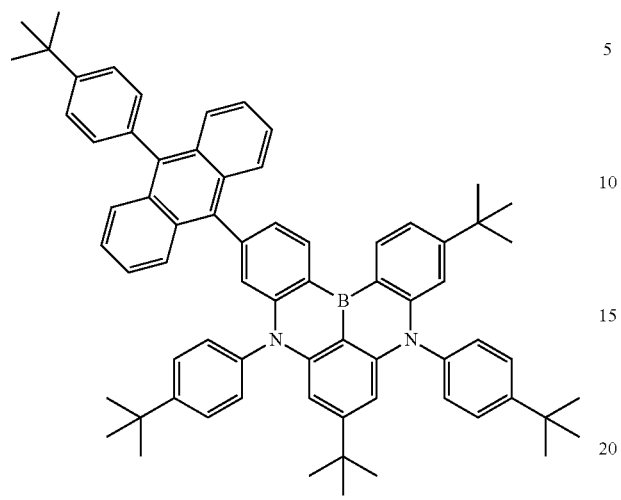
BD7
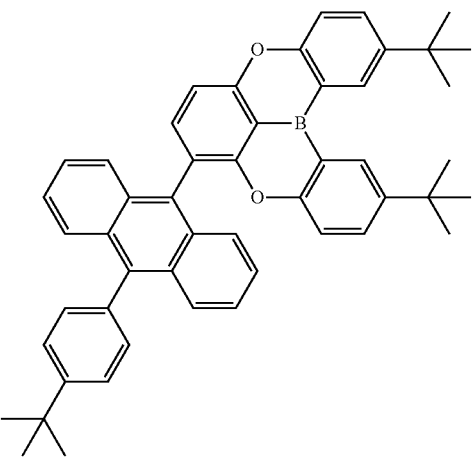
BD5
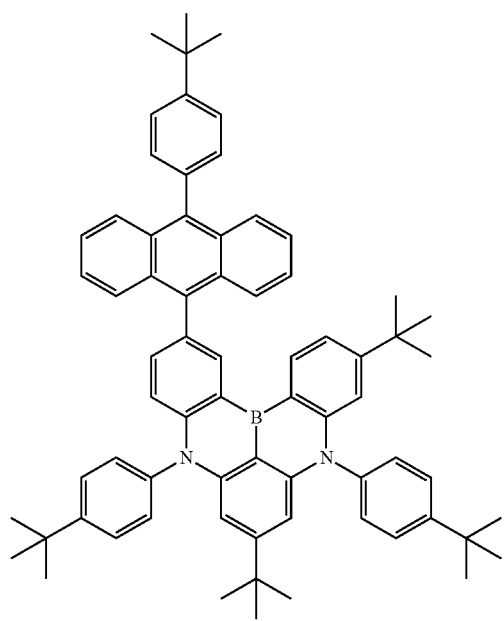
BD8
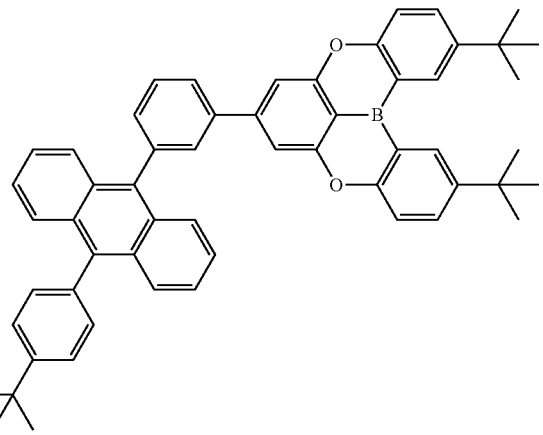
BD6
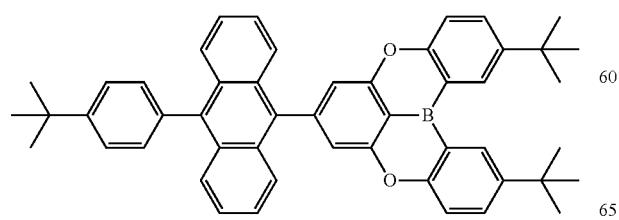
BD9
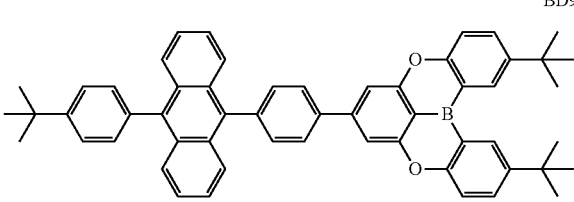

-continued

CD1

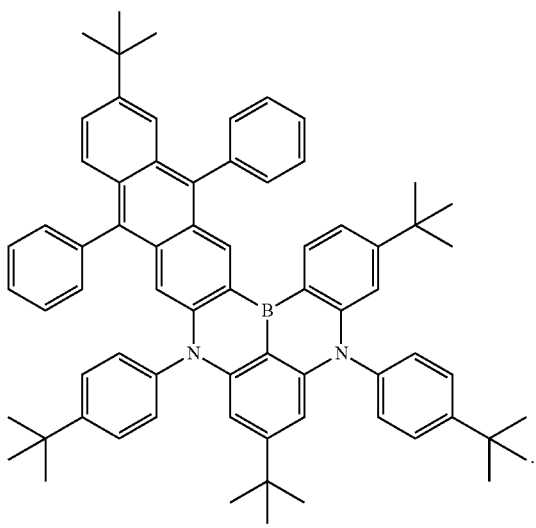

9. A light emitting device comprising:
a first electrode;
a second electrode facing the first electrode;
a plurality of light emitting structures stacked between the first electrode and the second electrode; and
a charge generation layer disposed between adjacent ones of the plurality of light emitting structures, wherein
at least one of the plurality of light emitting structures comprises a polycyclic compound represented by Formula 1:

[Formula 1]

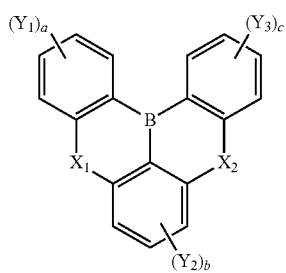

wherein in Formula 1,
a to c are each independently 1 or 2,
$X_1$ and $X_2$ are each independently O or $N(R_a)$,
$R_a$ is a hydrogen atom, a deuterium atom, a halogen atom, a cyano group, a substituted or unsubstituted amine group, a substituted or unsubstituted boryl group, a substituted or unsubstituted oxy group, a substituted or unsubstituted thio group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms,
$Y_1$ to $Y_3$ are each independently a hydrogen atom, a deuterium atom, a halogen atom, a cyano group, a substituted or unsubstituted amine group, a substituted or unsubstituted boryl group, a substituted or unsubstituted oxy group, a substituted or unsubstituted thio group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, and
at least one of $Y_1$ to $Y_3$ is a group represented by Formula $Z_1$ or Formula $Z_2$:

[Formula $Z_1$]

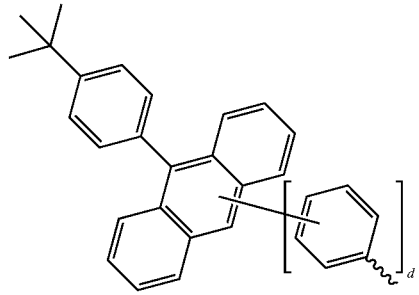

[Formula $Z_2$]

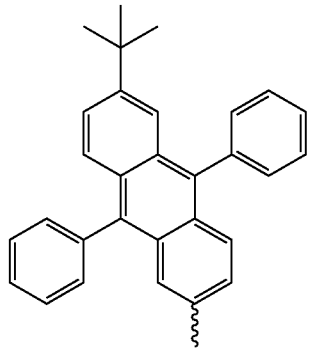

wherein in Formula $Z_1$ and Formula $Z_2$,
d is 0 or 1, and
∿∿∿ represents a binding site to a neighboring atom.

10. The light emitting device of claim 9, wherein the polycyclic compound is represented by Formula 2 or Formula 3:

[Formula 2]

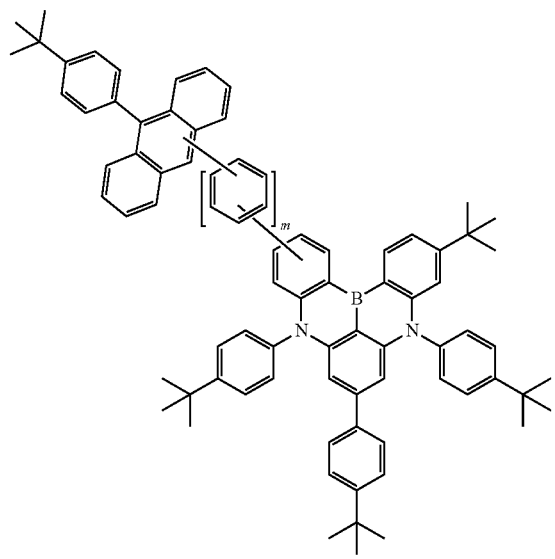

[Formula 3]

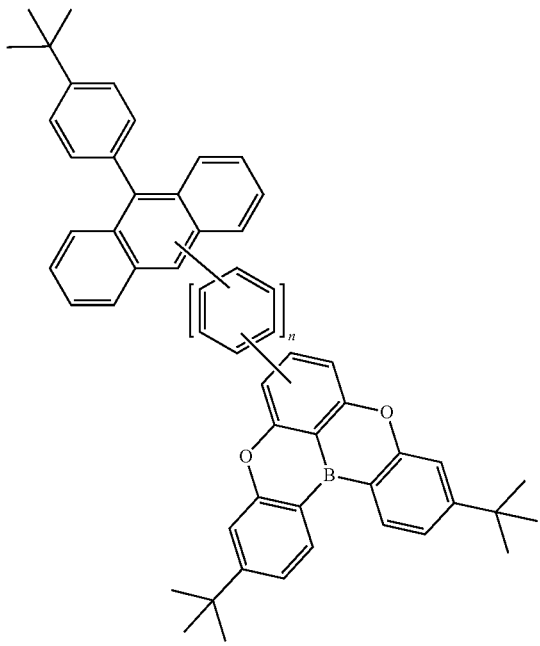

[Formula 4]

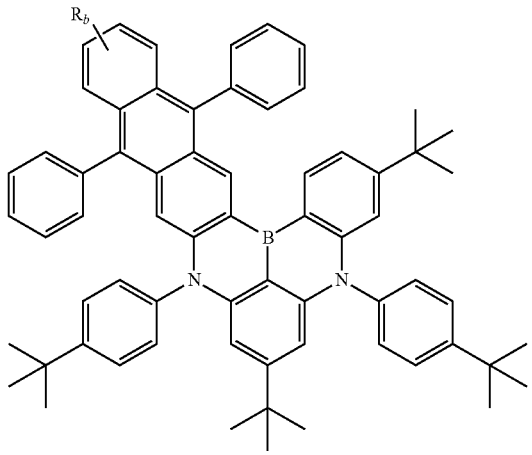

wherein in Formula 4,

R_b is a hydrogen atom, a deuterium atom, a halogen atom, a cyano group, a substituted or unsubstituted amine group, a substituted or unsubstituted boryl group, a substituted or unsubstituted oxy group, a substituted or unsubstituted thio group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms.

13. The light emitting device of claim 12, wherein
the first polycyclic compound emits blue light, and
the second polycyclic compound emits green light.

14. The light emitting device of claim 11, wherein
the first light emitting structure comprises a second polycyclic compound represented by Formula 4,
the second light emitting structure comprises a first polycyclic compound represented by Formula 2 or Formula 3, and
the third light emitting structure comprises the first polycyclic compound:

[Formula 4]

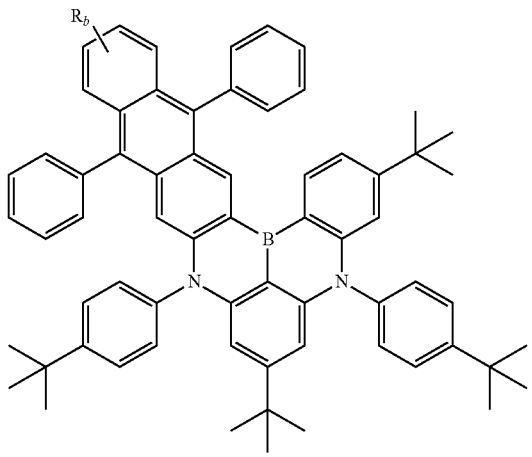

wherein in Formula 4,
R_b is a hydrogen atom, a deuterium atom, a halogen atom, a cyano group, a substituted or unsubstituted amine wherein in Formula 2, m is 0 or 1, and wherein in Formula 3, n is 0 or 1.

11. The light emitting device of claim 10, wherein
the plurality of light emitting structures comprises:
 a first light emitting structure;
 a second light emitting structure disposed below the first emitting structure; and
 a third light emitting structure disposed below the second emitting structure,
wherein
at least one of the first light emitting structure, the second light emitting structure, and the third light emitting structure emits blue light, and
at least one of the remainder of the first light emitting structure, the second light emitting structure, and the third light emitting structure emits green light.

12. The light emitting device of claim 11, wherein
the first light emitting structure comprises a first polycyclic compound represented by Formula 2 or Formula 3,
the second light emitting structure comprises a second polycyclic compound represented by Formula 4, and
the third light emitting structure comprises the first polycyclic compound:

group, a substituted or unsubstituted boryl group, a substituted or unsubstituted oxy group, a substituted or unsubstituted thio group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms.

15. The light emitting device of claim 11, further comprising a fourth light emitting structure which is disposed below the third light emitting structure, wherein
the fourth light emitting structure comprises a first polycyclic compound represented by Formula 2 or Formula 3.

16. A polycyclic compound represented by Formula 1:

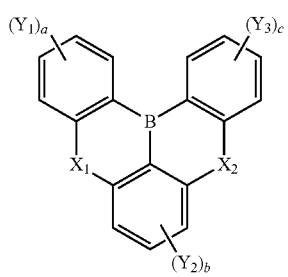

[Formula 1]

wherein in Formula 1,
a to c are each independently 1 or 2,
$X_1$ and $X_2$ are each independently O or $N(R_a)$,
$R_a$ is a hydrogen atom, a deuterium atom, a halogen atom, a cyano group, a substituted or unsubstituted amine group, a substituted or unsubstituted boryl group, a substituted or unsubstituted oxy group, a substituted or unsubstituted thio group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms,
$Y_1$ to $Y_3$ are each independently a hydrogen atom, a deuterium atom, a halogen atom, a cyano group, a substituted or unsubstituted amine group, a substituted or unsubstituted boryl group, a substituted or unsubstituted oxy group, a substituted or unsubstituted thio group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, and
at least one of $Y_1$ to $Y_3$ is a group represented by Formula $Z_1$ or Formula $Z_2$,
provided that when $X_1$ and $X_2$ are each O:
  at least one of $Y_2$ is a group represented by Formula $Z_1$; and
  at least one of $Y_1$ is a tert-butyl group, and
at least one of $Y_3$ is a tert-butyl group:

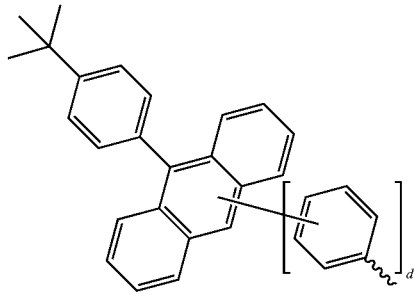

[Formula $Z_1$]

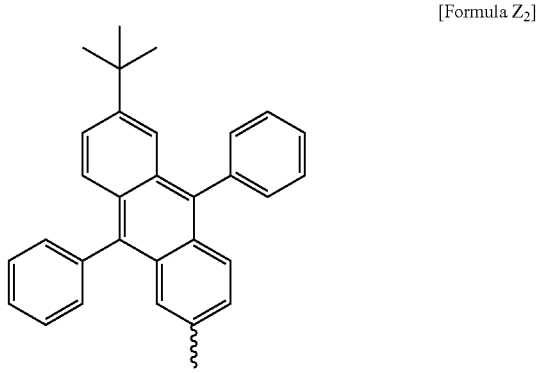

[Formula $Z_2$]

wherein in Formula $Z_1$ and Formula $Z_2$,
d is 0 or 1, and
∿∿ represents a binding site to a neighboring atom.

17. The polycyclic compound of claim 16, wherein Formula 1 is represented by Formula 2 or Formula 3:

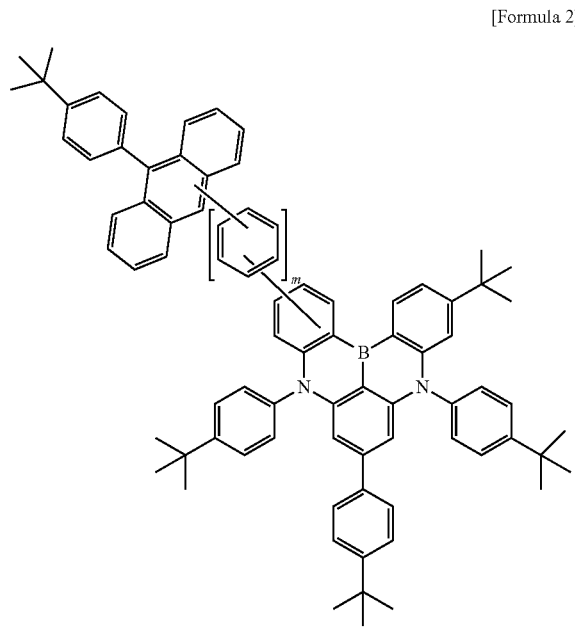

[Formula 2]

[Formula 3]
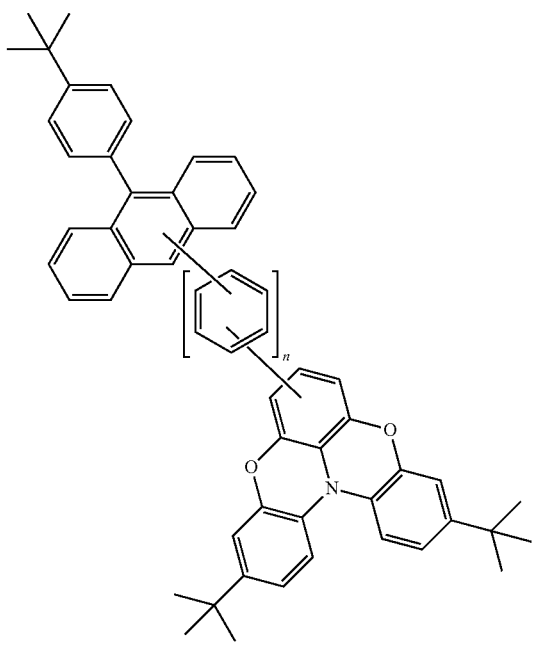
[Formula 2-2]
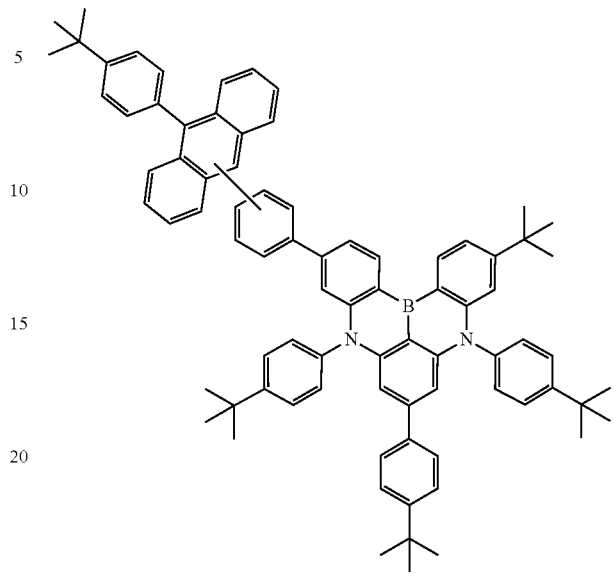
wherein in Formula 2,
m is 0 or 1, and
wherein in Formula 3,
n is 0 or 1.
18. The polycyclic compound of claim 17, wherein the polycyclic compound represented by Formula 2 or Formula 3 emits blue light.
19. The polycyclic compound of claim 16, wherein Formula 1 is represented by one of Formula 2-1 to Formula 2-3:
[Formula 2-1]
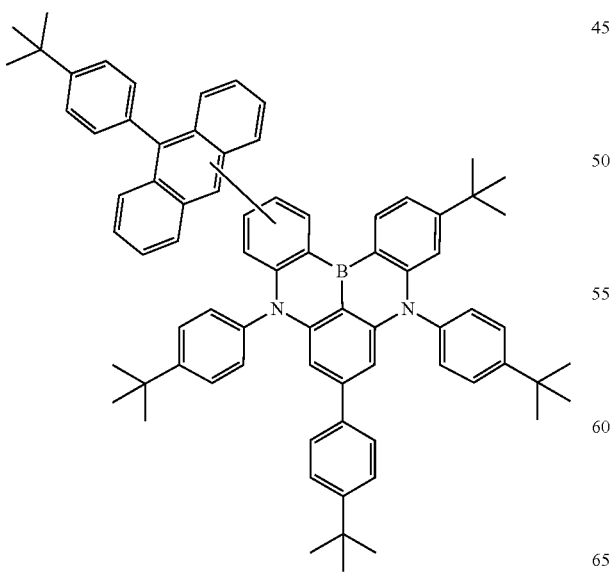
[Formula 2-3]
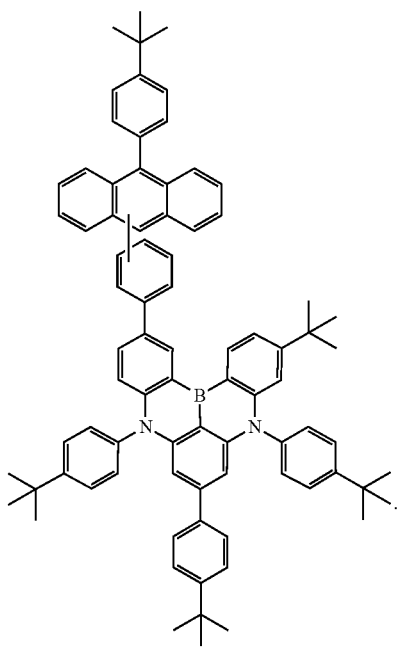

20. The polycyclic compound of claim 16, wherein Formula 1 is represented by Formula 3-1 or Formula 3-2:
[Formula 3-1]
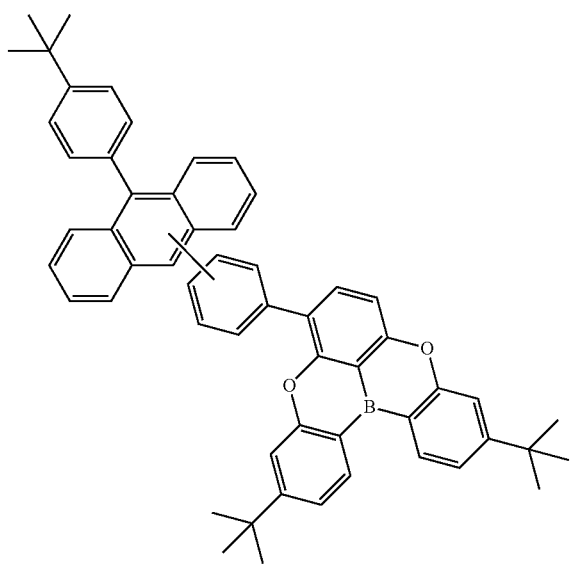
[Formula 3-2]
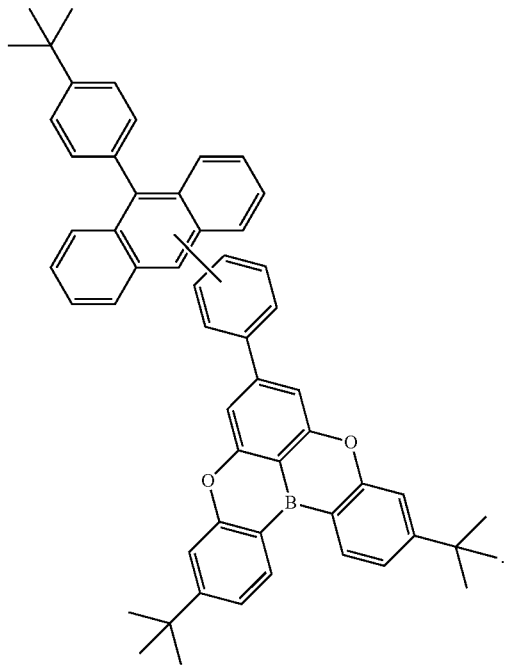
21. The polycyclic compound of claim 16, wherein the polycyclic compound has a lowest triplet excitation energy of less than about 2.0 eV.
22. The polycyclic compound of claim 16, wherein the polycyclic compound is one selected from Compound Group 1:
[Compound Group 1]
BD1
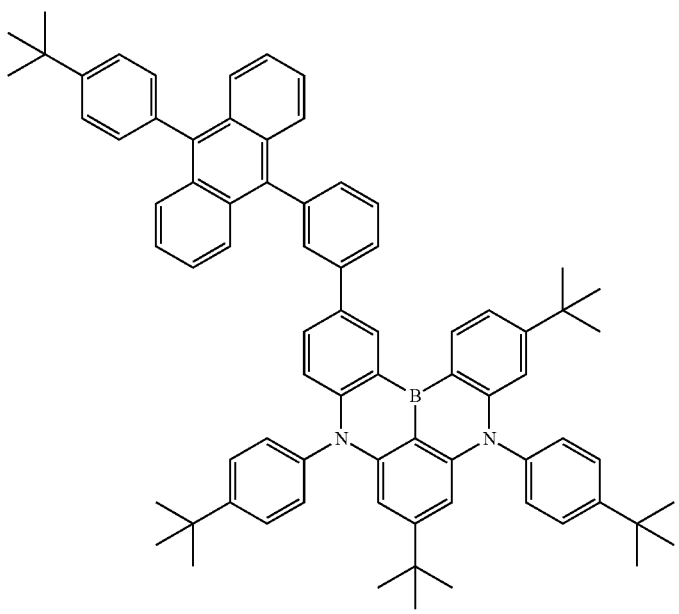

BD2
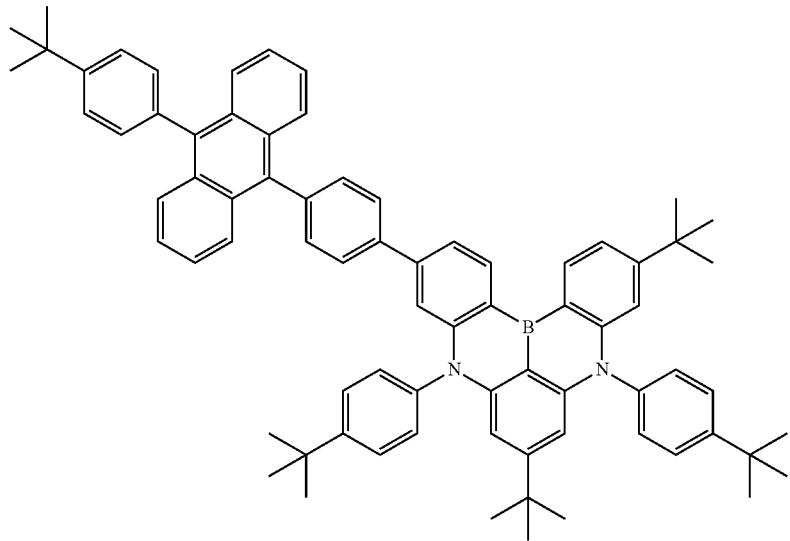
BD3
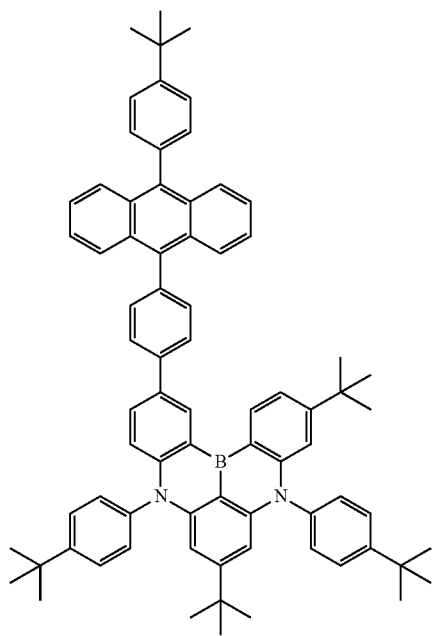
BD4
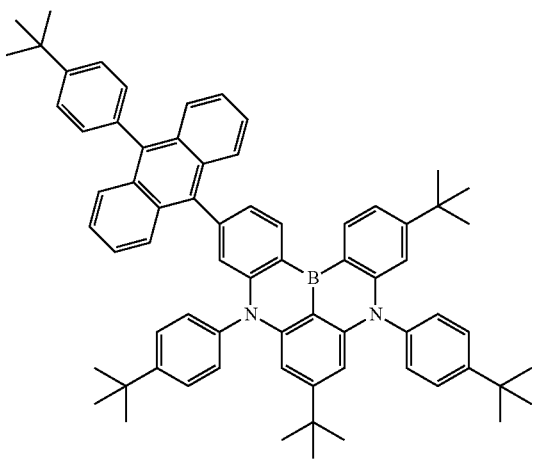

-continued
BD5
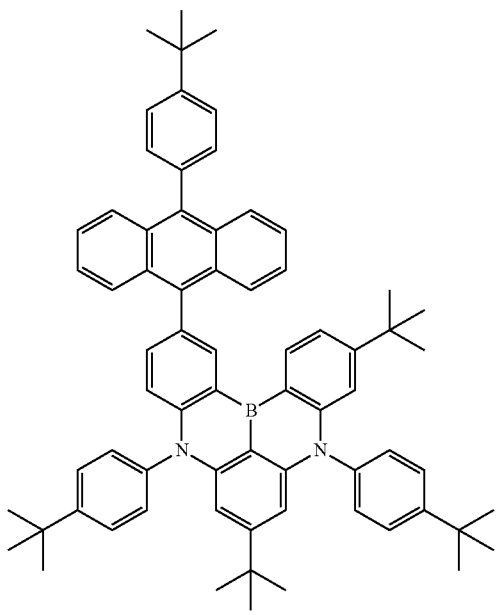
BD6
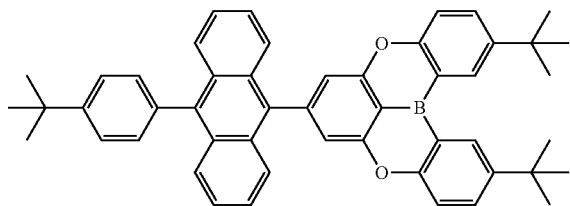
BD7
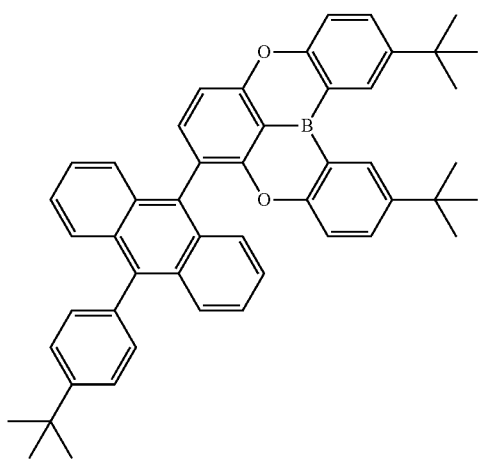
BD9
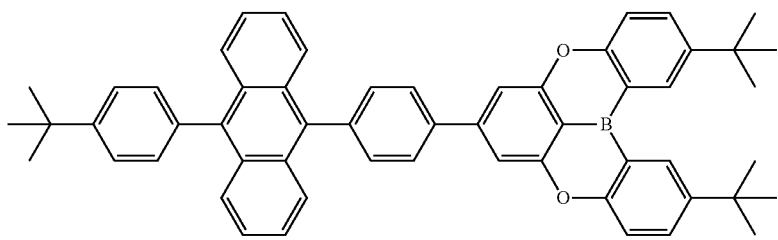
BD8
* * * * *